(12) United States Patent
Ohki et al.

(10) Patent No.: US 7,072,372 B2
(45) Date of Patent: Jul. 4, 2006

(54) SEMICONDUCTOR LASER DEVICE, SEMICONDUCTOR LASER MODULE, AND OPTICAL FIBER AMPLIFIER

(75) Inventors: Yutaka Ohki, Tokyo (JP); Naoki Tsukiji, Tokyo (JP); Junji Yoshida, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 296 days.

(21) Appl. No.: 10/366,447

(22) Filed: Feb. 14, 2003

(65) Prior Publication Data

US 2004/0080814 A1   Apr. 29, 2004

(30) Foreign Application Priority Data

Feb. 14, 2002   (JP)   ............................. 2002-037337
Feb. 25, 2002   (JP)   ............................. 2002-048679
Apr. 26, 2002   (JP)   ............................. 2002-127276

(51) Int. Cl.
*H01S 5/00*   (2006.01)

(52) U.S. Cl. ............................. 372/45.01; 372/43.01; 372/44.01

(58) Field of Classification Search ................. 372/43, 372/44, 45, 45.01
See application file for complete search history.

(56) References Cited

U.S. PATENT DOCUMENTS 6,384,963 B1    5/2002   Ackerman et al. .......... 331/179
6,560,266 B1 *  5/2003   Shoji et al. .................... 372/96
6,870,871 B1 *  3/2005   Yoshida et al. ............... 372/49

FOREIGN PATENT DOCUMENTS

| JP | 2001-217505 | 8/2001 |
| JP | 2001-235713 | 8/2001 |
| JP | 2002-028398 | 2/2002 |

OTHER PUBLICATIONS

T. Okuda, et al., Thursday Morning, pp. 420-421, "Low-Threshold 1.3-μm AlGaInAs Burled Heterostructure Laser Diodes for 85° C., 10-Gb/s Operation", Mar. 21, 2002.

* cited by examiner

*Primary Examiner*—Armando Rodriguez
(74) *Attorney, Agent, or Firm*—Oblon, Spivak, McClelland, Maier & Neustadt, P.C.

(57) ABSTRACT

The present invention has a lower cladding layer, a lower SCH layer, a quantum well layer, an upper SCH layer, and a first upper cladding layer sequentially laminated on a substrate. A striped-pattern second upper cladding layer that has a longitudinal direction in a laser beam emission direction, and a current blocking layer are laminated on the first upper cladding layer. A third upper cladding layer and a contact layer are laminated sequentially on the second upper cladding layer and the current blocking layer respectively. The current blocking layer has a conduction type different from that of the second upper cladding layer. An effective index of an area that includes the current blocking layer is lower than the same of an area that includes the upper cladding layer.

11 Claims, 59 Drawing Sheets

SECOND AREA | FIRST AREA | SECOND AREA

SECOND AREA | FIRST AREA | SECOND AREA

FIG.37
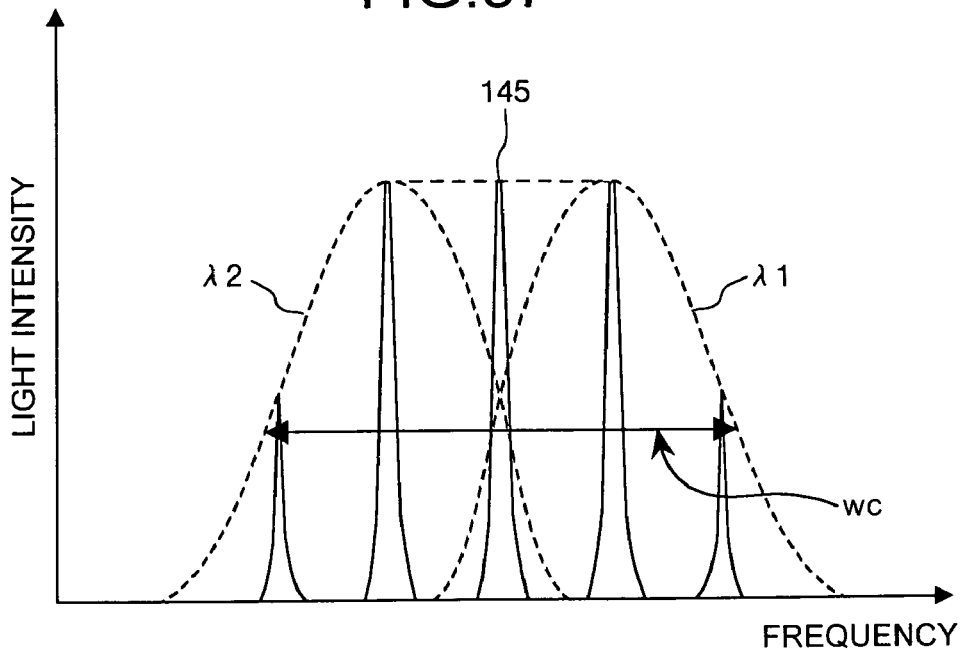
FIG.38
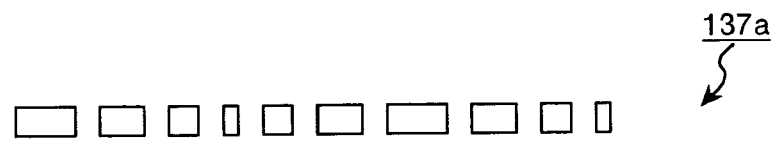
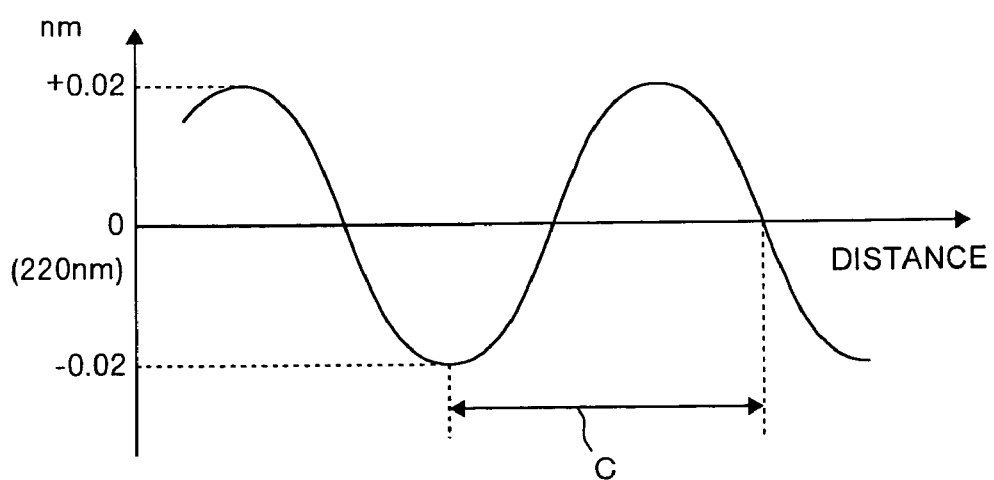

SEMICONDUCTOR LASER DEVICE, SEMICONDUCTOR LASER MODULE, AND OPTICAL FIBER AMPLIFIER

BACKGROUND OF THE INVENTION

1) Field of the Invention

The present invention relates to a semiconductor laser device, a semiconductor laser module, and an optical fiber amplifier that realize a high output.

2) Description of the Related Art

In recent years, along the development of optical communications including the Internet or the like, optical fiber amplifiers are widely used in the middle of the transmission optical fiber, to transmit optical signals over a long distance. An optical fiber amplifier amplifies signal lights, whose intensity gets reduced during transmission, thereby to recover the intensity of the signal lights, in the course of the transmission of the signal lights through the optical fiber. Specifically, an optical fiber amplifier that uses an erbium-doped fiber (hereinafter referred to as an "EDF") to amplify signal lights, and an optical fiber amplifier that utilizes a Raman amplification are proposed, and put into practical use. Both of these optical fiber amplifiers use a semiconductor laser device for a pumping source, and this semiconductor laser device excites signal lights. The amplification gain of each optical fiber amplifier increases together with the optical output from the pumping source. Therefore, the semiconductor laser device used for the pumping source needs to have high luminous efficiency and a high output. From this viewpoint, a buried-heterostructure laser (hereinafter referred to as a "BH laser") as shown in FIG. 76 or the like is practically applied to the semiconductor laser device used for the pumping source.

The BH laser has a separate confinement heterostructure (SCH). As shown in FIG. 76, in the BH laser, a lower cladding layer 302, a lower SCH layer 303, a quantum well layer 304, and an upper SCH layer 305 are sequentially laminated on an n-type substrate 301. An upper portion of the lower cladding layer 302, and an active layer consisting of the lower SCH layer 303, the quantum well layer 304, and the upper SCH layer 305 sequentially laminated on the lower cladding layer 302, are processed into a mesa pattern. A p-type current blocking layer 307 and an n-type current blocking layer 308 are laminated adjacent to this mesa pattern on the lower cladding layer 302, thereby to form a current blocking layer. This current blocking layer has a function of shielding an injection current. Therefore, based on the existence of the current blocking layer, the BH laser contracts the injected current, thereby to improve the density of the carrier injected in the active layer, lower a threshold current value, and increase the luminous efficiency.

In recent years, there is an increasing requirement for obtaining a high output from the pumping source for the optical fiber amplifier, particularly, the pumping source for the Raman amplifier. Therefore, various investigations are carried out to obtain a high output laser beam emission from the semiconductor laser device.

To improve the optical output, it is necessary to increase the light guiding volume or capacity. To increase the light guiding capacity, it is considered necessary to increase the areas in the layer direction, the beam emission direction, and the horizontal direction respectively of the semiconductor laser device. The area in the layer direction is determined mainly based on the current confinement structure such as the SCH layer. Therefore, it is difficult to increase only the light confinement area in the layer direction separately from the current confinement. Next, the area in the beam emission direction is considered. A technique of increasing the waveguide area by increasing the length of the resonator is essential, and this method is employed in many cases. However, the increase in the length of the resonator is in the tradeoff relationship with the increase in the internal loss. Therefore, there is a limit to the improving of the optical output from the long resonator in a certain driving condition. Because of the reasons, to more improve the optical output, it is important to increase the waveguide area in the horizontal direction. When the waveguide area in the horizontal direction is increased, it is possible to decrease element resistance and thermal resistance. It is also possible to restrict saturation of the optical output due to heat. An upper limit of the area in the horizontal direction is determined based on a width Wc by which the waveguide mode in a high-order horizontal direction is cut off. A semiconductor laser device that has a width of at least Wc has a high-order horizontal direction waveguide mode, and loses a single peak in the emitted far-field pattern (FFP). Not only a kink occurs in the current and optical output characteristics, but also the coupling efficiency of the optical fiber is degraded extremely.

Referring to FIG. 3, a difference between an effective index of a first area 18 and an effective index of a second area 19 or a second area 20 is expressed as Δn. The width Wc is determined based on the lasing wavelength Δn. When the lasing wavelength Δn is smaller, it is possible to make the width Wc larger. Therefore, to control the width Wc, the control of the lasing wavelength Δn becomes necessary.

However, it is difficult in the BH laser to control the effective indexes. As a result, it is difficult to increase the area in the horizontal direction.

Reasons why it is difficult in the BH laser or other lasers to increase the light intensity distribution area in the horizontal direction are explained below.

The BH laser has the current blocking layer disposed adjacent to the active layer, as shown in FIG. 76. Usually, the active layer and the current blocking layer are constructed of mutually different semiconductor materials. The effective index of the first area that includes the active layer is determined based on the current confinement in the layer direction. A difference between the effective index of the first layer and the effective index of the second layer is determined based on the semiconductor material of the second layer that includes the current blocking layer. It is possible to control the refractive indexes based on only the selection of the materials as a parameter. Therefore, it is not suitable to carry out a fine control of the effective indexes based on the selection of the materials. The semiconductor material of the current blocking layer is determined based on the easiness of burring growth and the thermal resistance, and there is no degree of freedom in the selection of a material.

Taking a BH laser that uses an InP substrate, most of the BH lasers use InP for the current blocking layer. Among the semiconductor materials to be aligned in a lattice on the InP substrate, InP has a smallest refractive index. Therefore, there is a limit to a reduction in the difference between the effective indexes. Consequently, there is a limit to the increasing of the width Wc. As a result, the use of InP is not optimum to obtain a high output.

On the other hand, to minimize the difference between the effective indexes, the effective index of the first area that includes the active layer can be made smaller. However, in this case, the light confinement and the current confinement in the layer direction become weak. A carrier overflow becomes extreme at the time of injecting a high current, which hinders the obtaining of a high output.

SUMMARY OF THE INVENTION

It is an object of the present invention to provide a semiconductor laser device, a semiconductor laser module, and an optical fiber amplifier that uses the semiconductor laser device or the semiconductor laser module that are suitable for a pumping source capable of stably obtaining a high gain.

According to one aspect of the present invention, there is provided a semiconductor laser device, comprising a lower cladding layer and an upper cladding layer laminated on an InP semiconductor substrate, and an active layer laminated between the lower and upper cladding layers, wherein the semiconductor laser device emits a laser beam having a wavelength of not smaller than 1200 nm and not larger than 1600 nm, with an output of not smaller than 80 mW, from the active layer, and in at least one of the internal areas of the lower cladding layer and the upper cladding layer, the semiconductor laser device has a current blocking layer that includes $Ga_xIn_{1-x}As_yP_{1-y}$ ($0<x\leq1$, $0<y\leq1$) and shields a current, and a current passing layer that is disposed adjacent to the current blocking layer, has a striped pattern in an emission direction of the laser beam, and passes a current, and the current blocking layer controls a light distribution in a horizontal direction.

According to another aspect of the present invention, there is provided a semiconductor laser device, comprising a lower cladding layer and an upper cladding layer laminated on an InP substrate, and an active layer laminated between the lower and upper cladding layers, wherein in at least one of the internal areas of the lower cladding layer and the upper cladding layer, the semiconductor laser device has a current blocking layer that includes InP and shields a current, and a current passing layer that is disposed adjacent to the current blocking layer, has a striped pattern in an emission direction of the laser beam, and passes a current, and the current blocking layer controls a light distribution in a horizontal direction.

According to still another aspect of the present invention, there is provided a semiconductor laser module comprising: the semiconductor laser device; an optical fiber that guides the laser beam emitted from the semiconductor laser device, to the outside; an optical coupling lens system that optically couples the semiconductor laser device and the optical fiber; and a package that accommodates at least the semiconductor laser device and the optical coupling lens system.

According to still another aspect of the present invention, there is provided an optical fiber amplifier comprising: a pumping source having the semiconductor laser device or the semiconductor laser module; an optical fiber that transmits a signal light; an amplification optical fiber connected to the optical fiber; and a coupler that makes an pumping light emitted from the pumping source incident to the amplification optical fiber.

According to still another aspect of the present invention, there is provided a semiconductor laser device, comprising a lower cladding layer and an upper cladding layer laminated on a semiconductor substrate, and an active layer laminated between the lower and upper cladding layers, the semiconductor laser device comprising: a diffraction grating that selects an oscillation longitudinal mode; a current blocking layer that is disposed in at least one of the internal areas of the lower cladding layer and the upper cladding layer, and shields a current; and a current passing layer that is disposed adjacent to the current blocking layer, has a striped pattern in an emission direction of the laser beam, and passes a current, wherein the current blocking layer controls a light distribution in a horizontal direction.

According to still another aspect of the present invention, there is provided a semiconductor laser module comprising: the semiconductor laser device; an optical fiber that guides the laser beam emitted from the semiconductor laser device, to the outside; an optical coupling lens system that optically couples the semiconductor laser device and the optical fiber; and a package that accommodates at least the semiconductor laser device and the optical coupling lens system.

According to still another aspect of the present invention, there is provided an optical fiber amplifier comprising: a pumping source having the semiconductor laser device or the semiconductor laser module; an optical fiber that transmits a signal light; an amplification optical fiber connected to the optical fiber; and a coupler that makes an pumping light emitted from the pumping source incident to the amplification optical fiber.

According to still another aspect of the present invention, there is provided a semiconductor laser device comprising: a first cladding layer; an active layer formed on the first cladding layer, between a first reflection film provided on an emission end surface of a laser beam and a second reflection film provided on a reflection end surface of the laser beam; a diffraction grating that is provided partially near the active layer or on the whole surface thereof, and selects a plurality of oscillation longitudinal modes; and a second cladding layer formed on the active layer, wherein the active layer includes an Al mixed crystal system.

According to still another aspect of the present invention, there is provided a semiconductor laser device comprising: a first cladding layer; an active layer formed on the first cladding layer, between a first reflection film provided on an emission end surface of a laser beam and a second reflection film provided on a reflection end surface of the laser beam; a second cladding layer that is formed on the active layer, and has a ridge section on a part of the second cladding layer; and a diffraction grating that selects a plurality of oscillation longitudinal modes.

According to still another aspect of the present invention, there is provided a semiconductor laser module comprising: the semiconductor laser device; an optical fiber that guides the laser beam emitted from the semiconductor laser device, to the outside; and an optical coupling lens system that optically couples the semiconductor laser device and the optical fiber According to still another aspect of the present invention, there is provided a semiconductor laser module comprising: semiconductor laser device that includes: an active layer formed on the first cladding layer, between a first reflection film provided on an emission end surface of a laser beam and a second reflection film provided on a reflection end surface of the laser beam, and a diffraction grating that is provided partially near the active layer or on the whole surface thereof, and selects a plurality of oscillation longitudinal modes; an optical fiber that guides the laser beam emitted from the semiconductor laser device, to the outside; and an optical coupling lens system that optically couples the semiconductor laser device and the optical fiber.

According to still another aspect of the present invention, there is provided an optical fiber amplifier comprising: a pumping source having the semiconductor laser device or the semiconductor laser module; an optical fiber that transmits a signal light; an amplification optical fiber connected to the optical fiber; and a coupler that makes an pumping light emitted from the pumping source incident to the amplification optical fiber.

According to still another aspect of the present invention, there is provided an optical fiber amplifier comprising: a pumping source having the semiconductor laser device or the semiconductor laser module; an optical fiber that transmits a signal light; and a coupler that makes an pumping light emitted from the pumping source incident to the optical fiber, wherein the optical fiber amplifier carries out an optical amplification based on the Raman amplification.

The other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 37 is a pattern graph that shows a waveform of a laser beam emitted from the semiconductor laser device according to the seventh embodiment;

FIG. 38 is a pattern graph of a structure of a diffraction grating according to the seventh embodiment;

DETAILED DESCRIPTION

Figure 1:
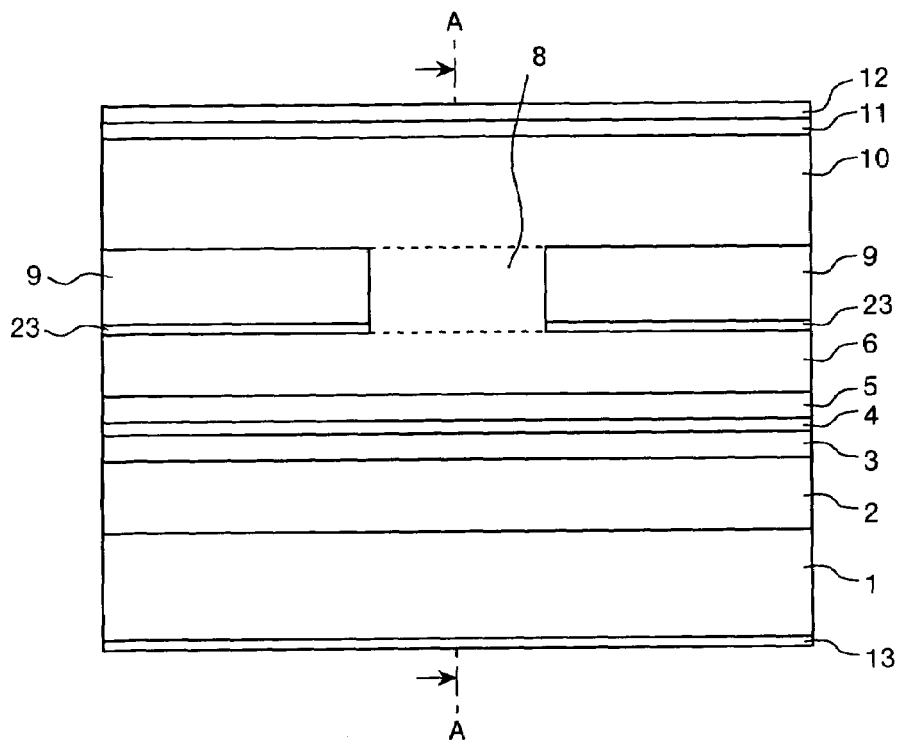
FIG. 1 is a front view of a structure of a semiconductor laser device according to a first embodiment of the present invention.

The present invention relates to a semiconductor laser device that has a lower cladding layer, an active layer, and a first upper cladding layer that are sequentially laminated on a substrate, and emits a laser beam of a predetermined wavelength. The invention particularly relates to a semiconductor laser device, a semiconductor laser module, and an optical fiber amplifier that realize a high output based on a weak confinement of light in a horizontal direction.

Exemplary embodiments of the semiconductor laser device, the semiconductor laser module, and the optical fiber amplifier according to the present invention are explained below with reference to the accompanying drawings. In the drawings, identical parts or similar parts are attached with the identical or like reference symbols. The drawings show patterns, and they do not show real layer thicknesses, widths, and ratios of the layer thicknesses. It is needless to mention that the drawings include portions that have different size relations or ratios between the drawings.

Figure 2:
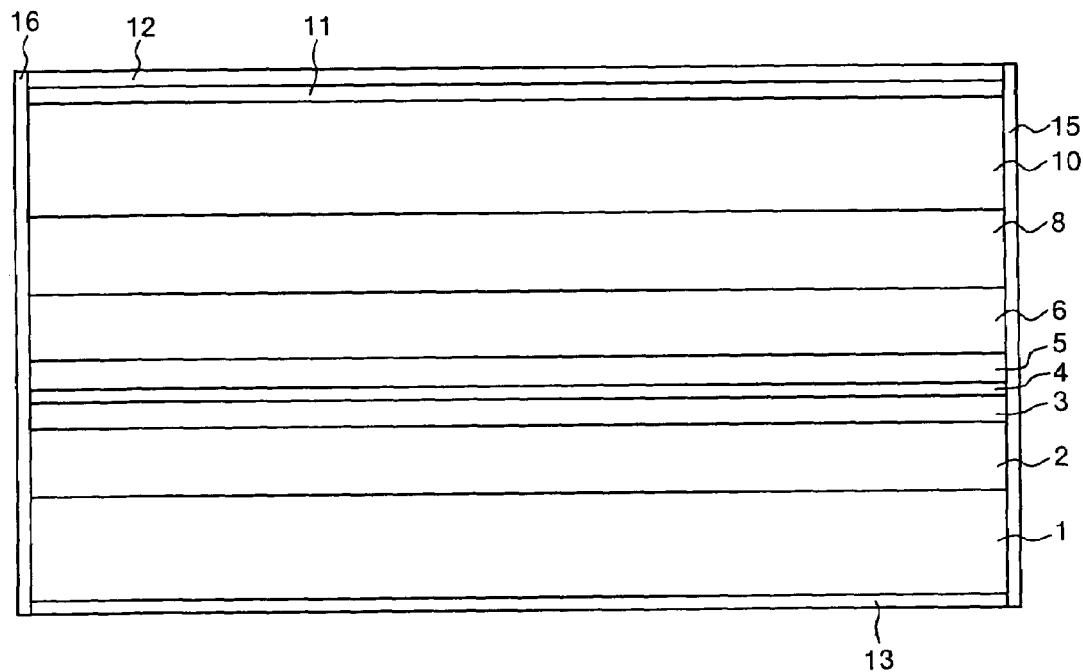
FIG. 2 is a cross-sectional view of the structure of the semiconductor laser device cut along a line A—A in FIG. 1.

A semiconductor laser device according to a first embodiment is explained below. The semiconductor laser device according to the first embodiment is a so-called self-aligned structure (SAS) type laser. In this laser, a current blocking layer has not only the current contracting function but also the function of confining the light in a horizontal direction. FIG. 1 is a front view of the semiconductor laser device according to the first embodiment of the present invention. FIG. 2 is a cross-sectional view of the semiconductor laser device cut along a line A—A in FIG. 1. The structure of the semiconductor laser device according to the first embodiment is explained below with reference to FIG. 1 and FIG. 2.

The semiconductor laser device according to the first embodiment has a lower cladding layer 2, a lower SCH layer 3, a quantum well layer 4, an upper SCH layer 5, and a first upper cladding layer 6 sequentially laminated on a substrate 1. A striped-pattern second upper cladding layer 8 that has a longitudinal direction in a laser beam emission direction and that functions as a current passing layer is laminated on a part of the area of the first upper cladding layer 6. A current blocking layer 9 is laminated in an area where the second upper cladding layer 8 is not laminated, on the first upper cladding layer 6. A third upper cladding layer 10 and a contact layer 11 are laminated sequentially on the second upper cladding layer 8 and the current blocking layer 9 respectively. A p-side electrode 12 is disposed on the contact layer 11. An n-side electrode 13 is disposed on the rear surface of the substrate 1. As shown in FIG. 2, a low reflection film 15 is disposed on an end surface at the light emission side (that is, an end surface at the right side in FIG. 2). A high reflection film 16 is disposed on an end surface at the side opposite to the end surface at the light emission side (that is, on an end surface at the left side in FIG. 2).

Each of the substrate 1 and the lower cladding layer 2 consists of InP doped with the n-type impurity. The quantum well layer 4 has at least one quantum well structure. The lower SCH layer 3, the quantum well layer 4, and the upper SCH layer 5 constitute a graded-index separate confinement heterostructure single quantum well (GRIN-SCH-SQW) active layer, when the quantum well layer 4 has one quantum well layer. The lower SCH layer 3, the quantum well layer 4, and the upper SCH layer 5 constitute a graded-index separate confinement heterostructure multi quantum well (GRIN-SCH-MQW) active layer, when the quantum well layer 4 has at least two quantum well layers. The GRIN-SCH structure is preferably a linear GRIN-SCH, and the lower SCH layer 3 and the upper SCH layer 5 have a film thickness of 30 to 40 nm respectively. Based on the GRIN-SCH structure, carriers are more efficiently confined in a layer direction, and it becomes possible to inject the carriers into the active layer more efficiently. The quantum well layer of the multi quantum well structure has five layers, and has compressive strain of one percent to the substrate. When a compensation structure employing a tensile strain structure is used for a barrier layer, it is possible to realize a semiconductor laser device that does not lose crystallinity against a larger strain in the quantum well layer. The wavelength of a laser beam emitted from the quantum well layer 4 is 1200 nm to 1600 nm. The intensity of the laser beam is not smaller than 80 mW, preferably 150 mW or above, and more preferably 250 mW or above. This makes it possible to use the semiconductor laser device according to the first embodiment as the pumping source of the optical fiber amplifier to be described later.

The first upper cladding layer 6, the second upper cladding layer 8, and the third upper cladding layer 10 function as upper cladding layers respectively. In the semiconductor laser device according to the first embodiment, each of the first upper cladding layer 6, the second upper cladding layer 8, and the third upper cladding layer 10 has InP of the p-type conduction type. The second upper cladding layer 8 also functions as a current passing layer as described above. The current passing layer is an area that passes an externally injected current to a layer direction. The injected current flows into the current passing layer of the active layer, that is, a lower area of the second upper cladding layer 8.

The contact layer 11 realizes an ohmic contact between the third upper cladding layer 10 and the p-side electrode 12. The contact layer 11 is doped with a high density p-type impurity, and realizes this ohmic contact.

The high reflection film 16 shown in FIG. 2 constitutes a resonator. Therefore, the high reflection film 16 has light reflectivity of not smaller than 80 percent, preferably 90 percent or above, and more preferably 98 percent or above. On the other hand, the low reflection film 15 prevents the laser beam from being reflected from the end surface at the emission side. Therefore, the low reflection film 15 has a film structure of low reflectivity of five percent or below, and preferably about one percent. The light reflectivity of the low reflection film 15 is optimized according to the resonator, and therefore, the reflectivity may have other value than these. It is preferable that a distance between the high reflection film 16 and the low reflection film 15, i.e., a length in the laser beam emission direction of the semiconductor laser device according to the first embodiment, is 800 μm to 3200 μm.

The current blocking layer 9 contracts the current injected from the p-side electrode 12, thereby to improve the carrier density in a horizontal direction in the quantum well layer 4. To prevent the current injected from the p-side electrode 12 from passing through the inside of the current blocking layer 9, the current blocking layer 9 has the n-type conduction type. As the current blocking layer 9 has the n-type conduction type, the lamination structure of the first upper cladding layer 6, the current blocking layer 9, and the third upper cladding layer 10 forms a pnp junction. Therefore, no current flows into the current blocking layer 9. In the first embodiment, the current blocking layer 9 has a film thickness of about 0.5 μm.

The current blocking layer 9 is made of InP having a higher doped n-type conduction type. In the first embodiment, the current blocking layer 9 uses InP as its material, like the second upper cladding layer 8. However, the density of the doped impurity of the current blocking layer 9 is higher than the density of the doped impurity of the second upper cladding layer 8. Therefore, there is a difference between the effective index of the current blocking layer 9 and the effective index of the upper cladding layer 8, for the emitted laser beam. It is preferable to control the impurity of the current blocking layer 9 such that a difference between the effective index of the area in which the current blocking layer 9 exists and the effective index of the area in which the second upper cladding layer 8 exists is not larger than 0.01, preferably not larger than $8 \times 10^{-3}$. It is preferable that the density of the impurity doped in the current blocking layer 9 is not smaller than $1.5 \times 10^{18}$ cm$^{-3}$ and not larger than $9 \times 10^{18}$ cm$^{-3}$, more preferably not smaller than $1.5 \times 10^{18}$ cm$^{-3}$ and not larger than $5 \times 10^{18}$ cm$^{-3}$.

The light confinement in a horizontal direction of the semiconductor laser device according to the first embodiment is explained. In the semiconductor laser device according to the first embodiment, the light confinement is carried out based on the difference between the effective indexes. The laser beam emitted from the quantum well layer 4 has a certain spread in a layer direction. Therefore, in considering the confinement in a horizontal direction, it is necessary to consider refractive index distributions in a horizontal direction in the upper and lower areas of the lower SCH layer 3, the quantum well layer 4, and the upper SCH layer 5, as well as distributions in these layers. Particularly, as the first upper cladding layer 6 has a film thickness of about 0.1 μm, the current blocking layer 9 is located near the quantum well layer 4. Therefore, when the refractive index of the current blocking layer 9 is different from the refractive index of the second upper cladding layer 8 located at the same distance from the quantum well layer 4 as the distance between the current blocking layer 9 and the quantum well layer 4, this gives an influence to the light confinement in a horizontal direction.

It is known that the refractive index of a semiconductor layer changes depending on the size of the density of the doped impurity as well as the composition of the materials of the semiconductor layer. Therefore, even when the second upper cladding layer 8 and the current blocking layer 9 are made of the same structure, it is possible to confine the light in a horizontal direction by changing the impurity density. Specifically, when the impurity density increases, the refractive index is lowered due to the plasma effect of the carriers. Therefore, the refractive index of the current blocking layer 9 becomes lower than the refractive index of the second upper cladding layer 8. Consequently, the semiconductor laser device according to the first embodiment confines the light in a horizontal direction.

Figure 3:
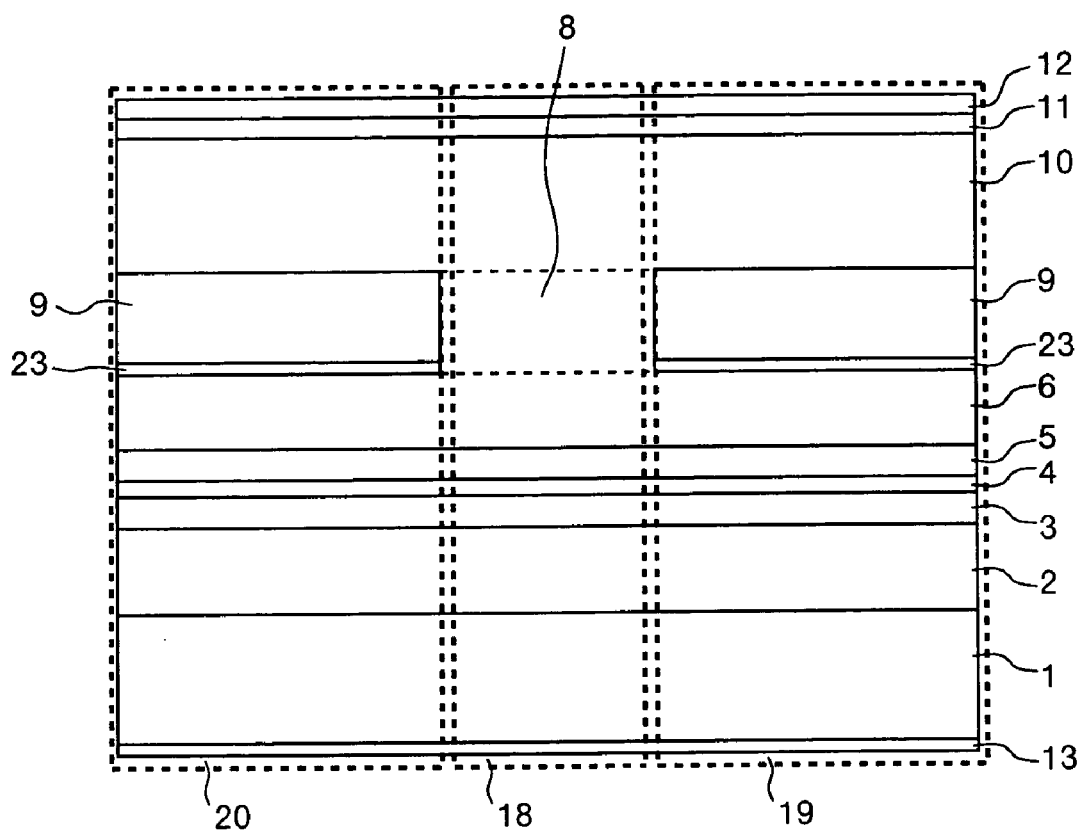
FIG. 3 explains about a light confinement in a horizontal direction of the semiconductor laser device according to the first embodiment.

As shown in FIG. 3, by dividing the cross section of the semiconductor laser device into three areas, it is possible to analyze light confinement in a horizontal direction in each area, through a comparison between the refractive indexes in these areas. The method of analyzing a waveguide mode based on the division of the cross section of the semiconductor laser device into three areas as shown in FIG. 3 is called the equivalent refractive index method. This is a method of evaluating the waveguide mode by equivalently substituting the light confinement in a horizontal direction into a planar waveguide having effective indexes of a first area 18 and second areas 19 and 20. It is known that based on this method, it is possible to analyze the waveguide mode in high precision, although as an approximation, when the waveguide has a larger spread in a horizontal direction than a thickness in a layer direction and also when the waveguide has a relatively mild change in the horizontal direction. The second area 19 and the second area 20 have the same structures, and therefore, these areas have the same effective indexes. In comparing the second area 19 and the second area 20 with the first area 18, these second areas 19 and 20 have the current blocking layer 9 on the same layer as the layer where the first area 18 has the second upper cladding layer 8, and the current blocking layer 9 has a lower refractive index than that of the second upper cladding layer 8. Consequently, the refractive indexes of the second areas 19 and 20 become lower than that of the first area 18.

Figure 4A:
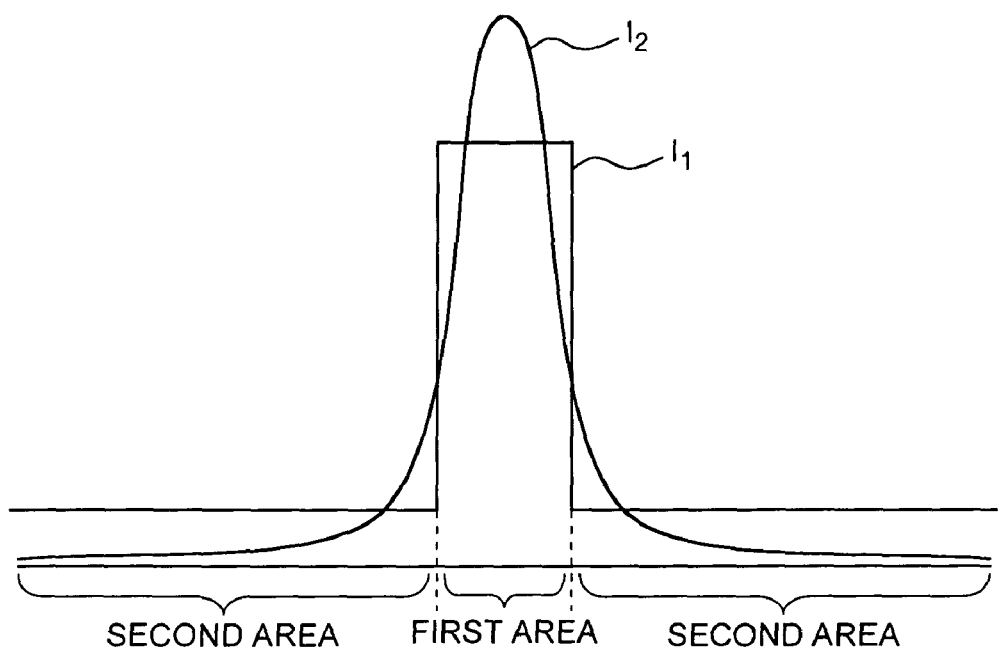
FIG. 4A is a graph that shows a light intensity distribution in a horizontal direction of a conventional semiconductor laser device.
Figure 4B:
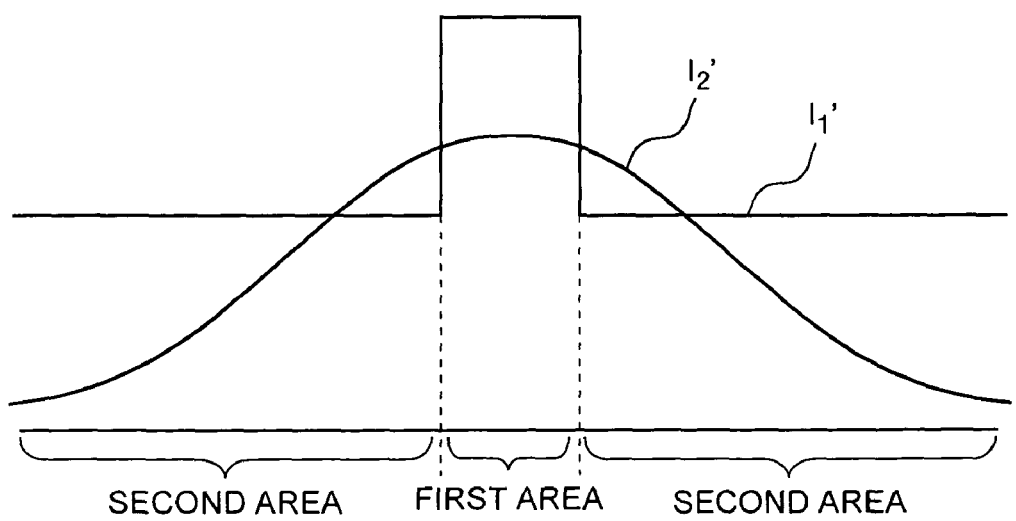
FIG. 4B is a graph that shows a light intensity distribution in a horizontal direction of the semiconductor laser device according to the first embodiment.

The light intensity distribution in a horizontal direction of the semiconductor laser device according to the first embodiment is explained below with reference to FIG. 4A and FIG. 4B. FIG. 4A shows a pattern of a light intensity distribution in a horizontal direction of the conventional BH laser. FIG. 4B shows a pattern of a light intensity distribution in a horizontal direction of the semiconductor laser device according to the first embodiment. A curve $1_1$ and a curve $1_1'$ show effective index distributions in a horizontal direction respectively. A curve $1_2$ and a curve $1_2'$ show light intensity distributions in a horizontal direction respectively.

As explained above, the light confinement in a horizontal direction occurs based on a difference between the effective indexes in a horizontal direction. The size of the light confinement is determined based on a difference between the effective index of the first area 18 and the effective indexes of the second areas 19 and 20. The only difference between the structure of the first area 18 and the structures of the second areas 19 and 20 is that the second upper cladding layer 8 is substituted by the current blocking layer 9 in the second areas 19 and 20. Therefore, the difference between the effective indexes is determined based on a position where the current blocking layer 9 is disposed, and a film thickness and a refractive index of the current blocking layer 9. In general, when the difference between the effective indexes is large, the light confinement in a horizontal direction becomes strong, and the width Wc by which the waveguide mode in a high-order horizontal direction is cut off becomes small. As a result, it becomes difficult to obtain a high output. On the other hand, when the difference between the effective indexes is small, the light confinement in a horizontal direction becomes weak, and the width Wc becomes large. As a result, it becomes possible to obtain a high output.

In the semiconductor laser device according to the first embodiment, the current blocking layer 9 is formed using InP as its material, like the surrounding cladding layers. Advantages obtained based on this is explained below.

In general, a forbidden bandwidth is determined based on the composition of the semiconductor, irrespective of the conduction type. Therefore, the forbidden bandwidth of the current blocking layer 9 and the forbidden bandwidth of the second upper cladding layer 8 become equal. In the semiconductor laser device according to the first embodiment, the quantum well layer 4 is composed of GaInAsP. The wavelength of an emitted laser beam is determined based on a quantum level of the quantum well layer 4. When the forbidden bandwidth of the current blocking layer 9 is smaller than the width of the energy of the emitted laser beam, the beam leaked out to the current blocking layer 9 is absorbed. In the first embodiment, as the current blocking layer 9 is made of InP, the quantum level is larger than the energy, and the beam is emitted to the outside without being absorbed. Therefore, it is possible to realize a semiconductor laser device that can obtain a high output. Further, it is not necessary to consider about the effect of the light confinement in a horizontal direction due to the light absorption. Consequently, in designing the structure of the semiconductor laser device, it is possible to realize weak confinement of the light, by changing only parameters of the density of the impurity of the current blocking layer 9, and the position and the film thickness of the current blocking layer 9.

Both the current blocking layer 9 and the second upper cladding layer 8 are made of InP that has a smaller thermal resistance than GaInAsP. Therefore, it is possible to efficiently diffuse heat generated due to the current injection. In general, the semiconductor laser device is fixed such that a laser mount and the p-side electrode 12 are in contact with each other, based on a junction down method. The generated heat is radiated mainly through the p-side electrode 12. As both the current blocking layer 9 and the second upper cladding layer 8 that become the heat-passing routes are made of materials having a small thermal resistance, it is possible to efficiently radiate the heat to the outside. When it is possible to efficiently radiate the heat, it is possible to restrict a rise in the temperature of the quantum well layer 4. Consequently, it is possible to restrict heat saturation that the optical output does not increase even when a large current is injected. Therefore, it is possible to provide a semiconductor laser device that can obtain a high output based on the provision of the function of efficiently radiating the heat.

It is not desirable to sacrifice other characteristics of the semiconductor laser device to weaken the light confinement in a horizontal direction, like the conventional BH laser. It is explained below that even when the semiconductor laser device according to the first embodiment takes a measure of weakening the light confinement in a horizontal direction, this does not lower the current contracting function of the current blocking layer 9 and does not affect the light confinement in a layer direction.

In the semiconductor laser device according to the first embodiment, the current blocking layer 9 is provided to achieve the current contracting function. As explained above, the current blocking layer 9 is doped with the n-type impurity, and the third upper cladding layer 10 and the first upper cladding layer 6 are doped with the p-type impurity, and these three layers form the pnp junction. To change the refractive index of the current blocking layer 9, the density of the impurity is changed. However, so long as the dopant of the same conduction type is used, the conduction type of the current blocking layer 9 is not changed. Based on the existence of the pnp junction, the current injected from the p-side electrode 12 does not flow into the current blocking layer 9, but passes through only the second upper cladding layer 8, and reaches the quantum well layer 4.

To control the current contracting function, the film thickness and the impurity density of the current blocking layer 9 and the first and third upper cladding layers 6 and 10 respectively are controlled. On the other hand, to control the light confinement in a horizontal direction, according to the first embodiment, the three parameters are mainly controlled, i.e., the film thickness and the impurity density of the current blocking layer 9, and the film thickness of the first upper cladding layer 6. There are many controllable parameters. Therefore, the parameters for the current contracting function are determined first, and the parameters for the light confinement control are determined next. Based on this, it is possible to control the parameters relatively easily and without losing the current contracting function. As a result, so long as the pnp junction exists, the current blocking layer 9 can narrow the injection current. The current does not flow into the current blocking layer 9 when the position and the film thickness of the current blocking layer 9 are changed.

When the first upper cladding layer 6 is omitted, and when the current blocking layer 9 and the second upper cladding layer 8 are brought into contact with the upper SCH layer 5, the pnp junction in a layer direction is not established in the area where the current blocking layer 9 is disposed. Consequently, the current blocking layer 9 cannot narrow the current. However, when the third upper cladding layer 10 is omitted, an np junction is established in a layer direction between the current blocking layer 9 and the first upper cladding layer 6. In the semiconductor laser device according to the first embodiment, the p-side electrode 12 is an anode. Therefore, a reverse bias is applied to the np junction, and no current flows into the current blocking layer 9. Consequently, although it is not possible to omit the first upper cladding layer 6, it is possible to omit the third upper cladding layer 10.

The influences given to the light confinement in a layer direction when the position, the film thickness, and the refractive index of the current blocking layer 9 are changed is explained. The current blocking layer 9 is disposed above the quantum well layer 4 that generates a beam. Therefore, when the structure of the current blocking layer 9 is changed, this gives an influence to the light confinement in a layer direction. However, it is known that according to the equivalent refractive index method, it is possible to carry out a high-precision analysis when the waveguide has a larger size in a horizontal direction than the size in a layer direction and also when the waveguide has a relatively mild change in the horizontal direction. Therefore, so long as the waveguide mode is considered following the equivalent refractive index method, it is possible to approximate that the current blocking layer 9 gives little influence to the refractive index of the first layer, and there is little change in the light confinement in a layer direction.

From the above explanation, it is clear that when the position, the film thickness, and the refractive index of the current blocking layer 9 are optimized to reduce the light confinement in a horizontal direction, these changes do not affect other characteristics of the semiconductor laser device. Therefore, the semiconductor laser device according to the present invention has a feature that it is possible to design the light confinement in a horizontal direction independent of the light confinement in a layer direction. Consequently, it is possible to achieve the performance of the device to a maximum extent based on the use of a layer structure suitable for high output operation.

A method of manufacturing the semiconductor laser device according to the first embodiment is explained with reference to FIGS. 5A to 5C and FIGS. 6A and 6B. FIG. 5A to FIG. 5C and FIG. 6A and FIG. 6B show a process of manufacturing the semiconductor laser device according to the first embodiment.

Figure 5A:
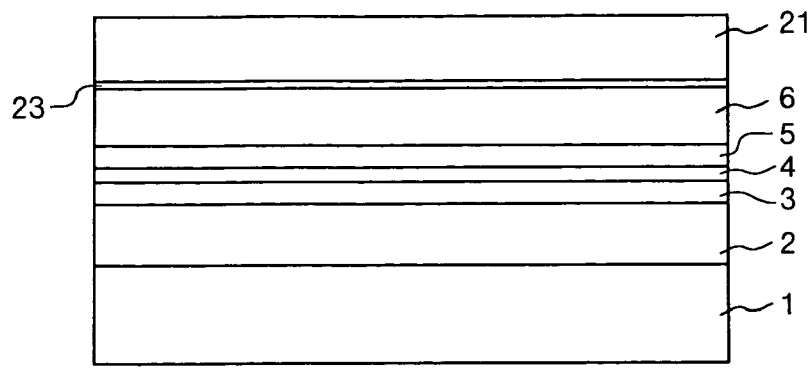
FIG. 5A to FIG. 5C show a process of manufacturing the semiconductor laser device according to the first embodiment.

As shown in FIG. 5A, the lower cladding layer 2, the lower SCH layer 3, the quantum well layer 4, the upper SCH layer 5, the first upper cladding layer 6, an etching stop layer 23, and an n-type InP layer 21 are laminated sequentially on the substrate 1. These layers are laminated according to the metal organic chemical vapor deposition (MOCVD) method. It is also possible to laminate these layers according to the chemical vapor deposition (CVD) method, the molecular beam epitaxy (MBE) method, or other method.

Figure 5B:
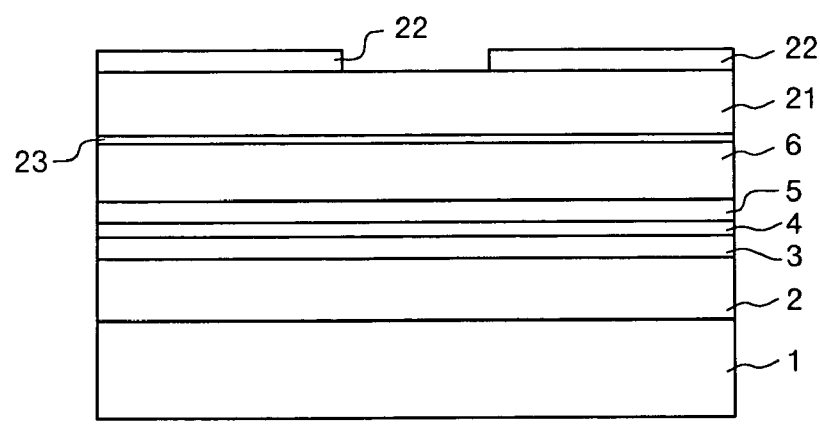

As shown in FIG. 5B, an SiNx mask pattern 22 having an opening is formed in the area where the second upper cladding layer 8 is scheduled to be formed. Specifically, first, an SiNx film having a thickness of about 100 to 200 nm is formed on the whole surface of the InP layer 21 according to the plasma CVD method or the like. A resist is coated on the whole surface of the SiNx film according to the spin coating. After coating the resist, a resist pattern having a desired opening is formed according to the photolithography. After forming the resist pattern, the SiNx exposed to the opening is etched with a reactive ion etching (RIE) device. After etching the SiNx film, an organic solvent cleaning, and an oxygen plasma ashing are carried out, thereby to remove the resist. As a result, the SiNx mask pattern 22 having the opening is obtained.

Figure 5C:
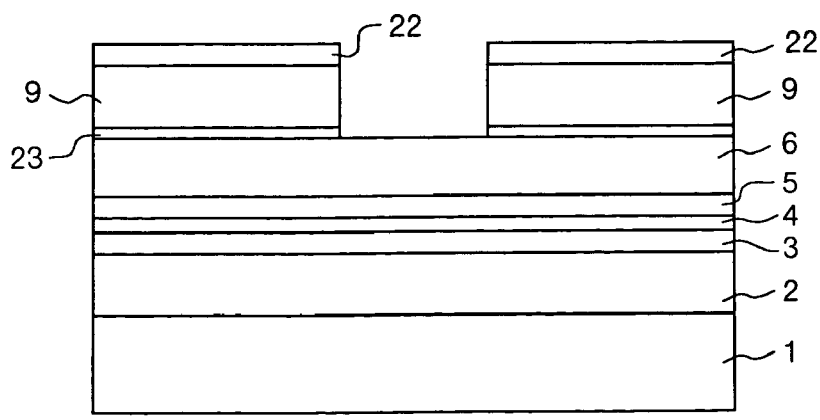
Figure 6A:
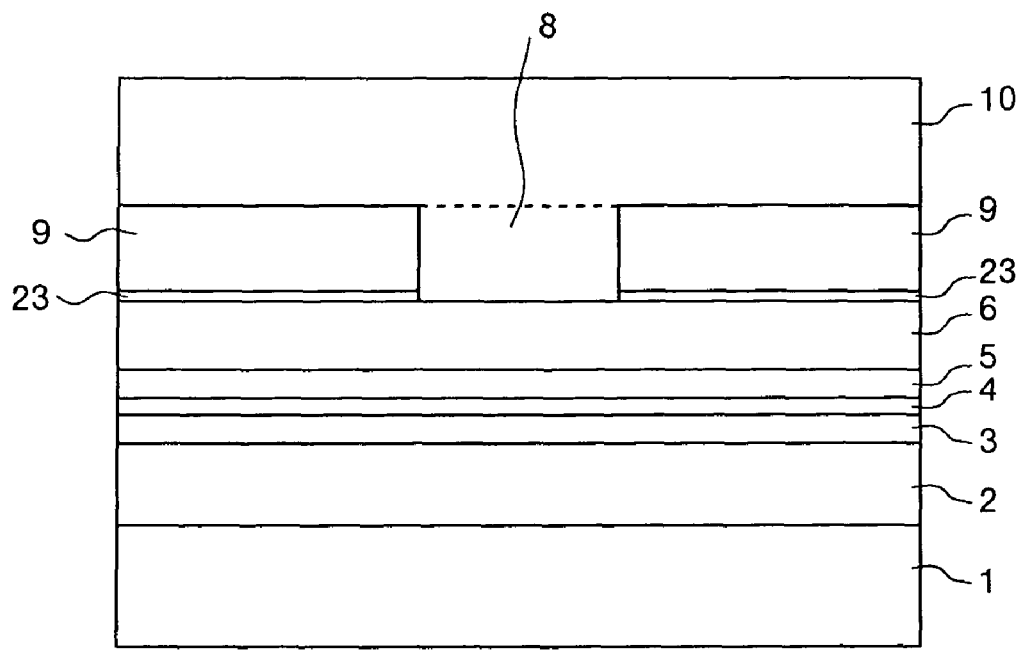
FIG. 6A and FIG. 6B show a process of manufacturing the semiconductor laser device according to the first embodiment.

Thereafter, the n-type InP layer 21 is etched, by using the SiNx mask pattern 22 as a mask, according to a chemical etching method. It is also possible to dry etch the InP layer 21 with the RIE device or according to other method. In the present embodiment, the chemical etching is carried out by using an etchant having a selectivity for InP. The etching stop layer 23 is made of GaInAsP having a thickness of about 5 nm, and a band gap composition component of about 1.1 μm. Therefore, in the present process, the etching stop layer 23 is not etched, and thus, the first upper cladding layer 6 located beneath this layer is not etched. Thereafter, it is preferable that an etchant having a selectivity for GaInAsP or an etchant having no selectivity for GaInAsP is used based on time control, thereby to remove the etching stop layer 23 that remains in the area where the second upper cladding layer 8 is scheduled to be formed. As a result, the current blocking layer 9 is formed, and a void in which the second upper cladding layer 8 is to be laminated are formed, as shown in FIG. 5C. In the subsequent step, the SiNx mask pattern 22 is removed to laminate semiconductor layers on the first upper cladding layer 6 and the current blocking layer 9. At the same time, the surfaces of the first upper cladding layer 6 and the current blocking layer 9 are cleaned. While the SiNx is used for the mask pattern in the process, it is also possible to use the resist for the mask.

p-type InP layers are laminated on the first upper cladding layer 6 and the current blocking layer 9. As shown in FIG. 6A, at this step, the second upper cladding layer 8 is formed in the area sandwiched between the current blocking layers 9, and the third upper cladding layer 10 is formed on the second upper cladding layer 8 and the current blocking layer 9.

Figure 6B:
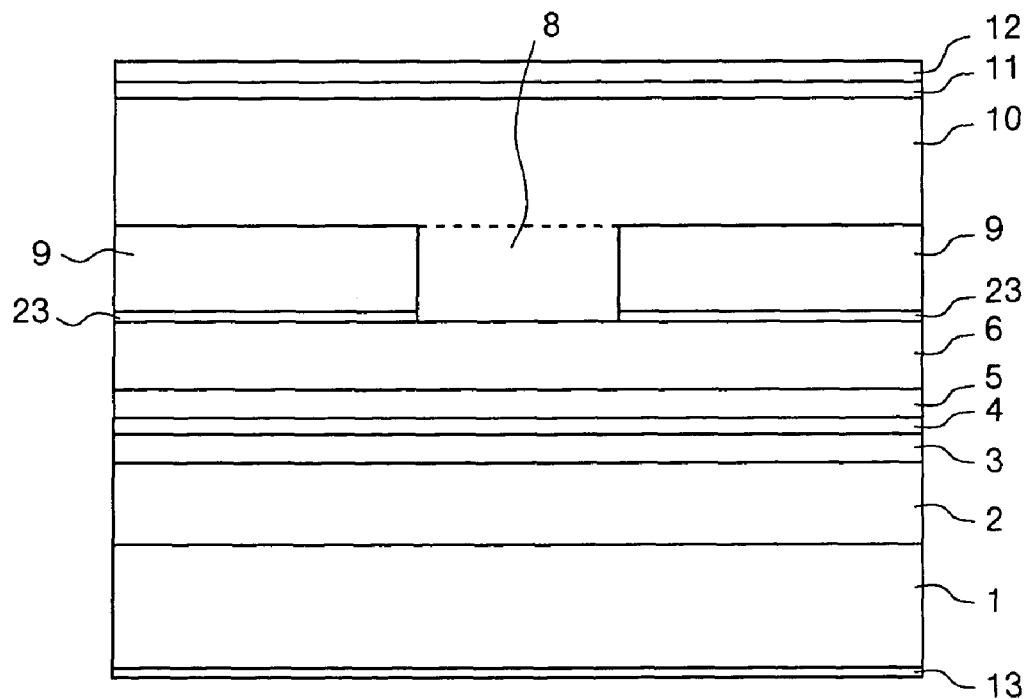

Thereafter, the contact layer 11 is laminated on the third upper cladding layer 10. The p-side electrode 12 and the n-side electrode 13 are formed respectively, by depositing a metal layer based on the vacuum evaporation, the sputtering method, or the CDV (Chemical Vapor Deposition). Before forming the n-side electrode 13, the rear surface of the substrate is ground to adjust the thickness of the device. Based on the process, it is possible to manufacture the semiconductor laser device according to the first embodiment as shown in FIG. 6B.

Figure 7A:
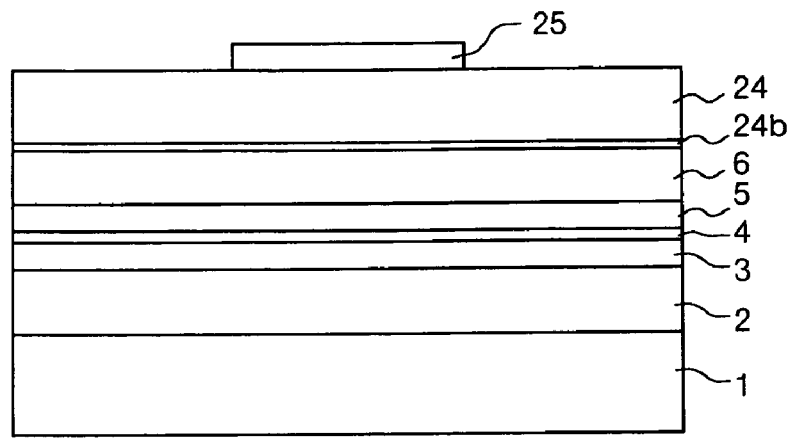
FIG. 7A to FIG. 7C show a part of the process of another method of manufacturing the semiconductor laser device according to the first embodiment.
Figure 7B:
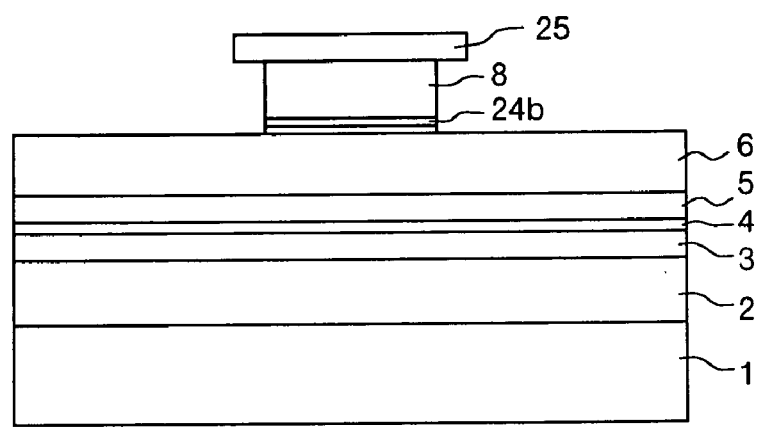
Figure 7C:
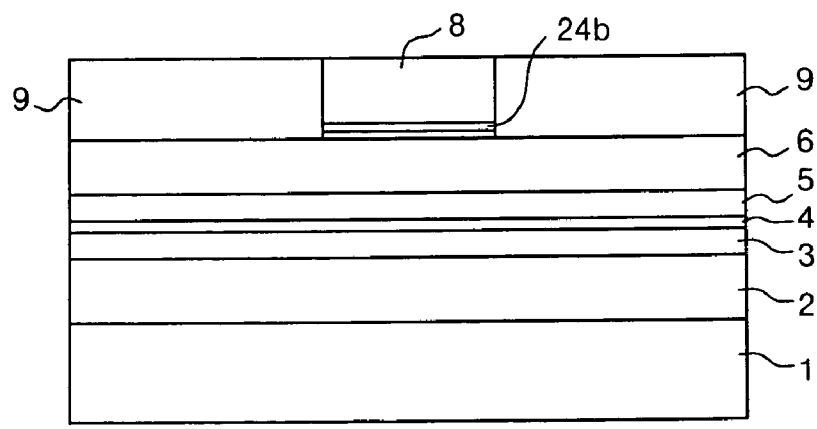

It is also possible to form the current blocking layer 9 and the second upper cladding layer 8 as follows. FIG. 7A to FIG. 7C show a part of the process of another method of manufacturing the semiconductor laser device according to the first embodiment. The layers up to the first upper cladding layer 6 are laminated in a similar manner to that of the manufacturing process. Then, an etching stop layer 24b, and a p-type InP layer 24 are laminated. Thereafter, as shown in FIG. 7A, an SiNx mask pattern 25 having an opening is formed in the area where the current blocking layer 9 is scheduled to be formed, on the p-type InP layer 24, and the p-type InP layer 24 is etched. Based on this, as shown in FIG. 7B, the p-type InP layer 24 is formed in a mesa pattern, and the second upper cladding layer 8 is formed. Because of the existence of the etching stop layer 24b, the first upper cladding layer 6 located below the p-type InP layer 24 is not etched. Following the removal of the etching stop layer 24b carried out after processing the p-type InP layer 24, a part of the upper end area of the first upper cladding layer 6 is removed.

Thereafter, the current blocking layer is laminated on the first upper cladding layer 6, and the remaining SiNx mask pattern 25 is removed, thereby to obtain a structure as shown in FIG. 7C. Thereafter, the third upper cladding layer 10, the contact layer 11, the p-side electrode 12, and the n-side electrode 13 are formed sequentially, and the semiconductor laser device according to the first embodiment is obtained.

In addition to this, there is a method of forming the upper cladding layer 9 based on an ion injection. In this case, when the impurity density of the current blocking layer 9 is changed in a horizontal direction, it is possible to give a refractive index distribution in a horizontal direction that is suitable to confine the light in a horizontal direction. When the impurity is doped based on the ion injection, it is possible to easily change the impurity density in a horizontal direction, by changing the masking pattern and injecting the ion by a few times. Based on this, the portion of the current blocking layer 9 near the boundary with the second upper cladding layer 8 may have the same impurity as that of the second upper cladding layer 8. This makes it possible to provide a low refractive index area, by doping the impurity of high density into the vicinity of the side surface of the current blocking layer 9 in the light emission direction. It is also possible to continuously increase the impurity density toward the end portion.

When the ion injection method is used, it is possible to omit the etching process, and it is also possible to continuously make growth in the vacuum atmosphere. Therefore, it is possible to simplify the manufacturing process. At the same time, it is also possible to extremely restrict the crystal surface from being exposed to the atmosphere in the process of laminating the layers. As a result, it is possible to prevent the adhesion of impurities, and it is possible to obtain a crystal of good quality.

The inventors of the present applicant actually manufacture the semiconductor laser device according to the first embodiment, and check the characteristics of this semiconductor laser device. Specifically, based on the manufacturing method shown in FIG. 7A to FIG. 7C, the inventors change the width in a shorthand direction (hereinafter referred to as a "stripe width") of the second upper cladding layer 8. The inventors check changes in the characteristics such as power consumption, and compare the characteristics with those of the BH laser according to the conventional technique. In the following measurements, when the cross-sectional shape of the second upper cladding layer 8 forms a trapezoid, the stripe width is defined as a length of the lower base of the trapezoid.

The measured characteristics of the semiconductor laser device include power consumption and reactive power when a constant current is flown to the device, brightness of a laser beam emitted when a constant current is injected to the device, and a current that a kink generates. Results of the measurements is explained below with reference to FIG. 8 to FIG. 12. In FIG. 8 to FIG. 12, the BH laser according to the conventional technique to be used for comparison has a stripe width of 2.5 μm. In the semiconductor laser device according to the first embodiment and the BH laser according to the conventional technique, the resonators have a length of 1300 μm. The semiconductor laser device carries out the measurements based on a chip unit, not based on a structure of the semiconductor laser module to be described later. The oscillated laser beam is not a continuous beam, but a pulse beam. At the measuring time, the temperature of the semiconductor laser device is controlled to be maintained at 20° C.

Figure 8:
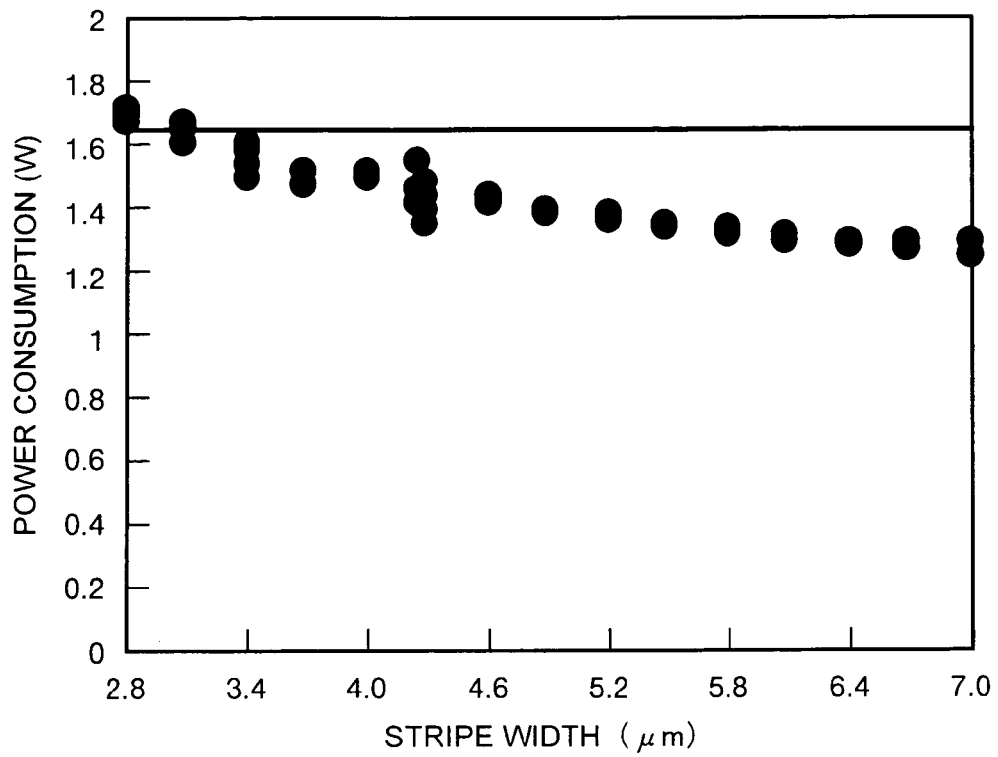
FIG. 8 is a graph that shows a result of measuring a change in power consumption relative to a fluctuation in a stripe width.

FIG. 8 is a graph that shows a dependency of power consumption on the stripe width of the semiconductor laser device according to the present embodiment. A straight line in the graph shows values of the BH laser according to the conventional technique.

As shown in FIG. 8, when a current of 900 mA is injected, the power consumption of the semiconductor laser device according to the first embodiment gradually decreases as the stripe width increases. When the stripe width is about 2.8 μm, the power consumption is approximately the same as that of the conventional BH laser. However, when the stripe width increases, the power consumption is lowered. When the stripe width increases to 7.0 μm, the power consumption is lowered by about 30 percent of the power consumption when the stripe width is 3 μm.

Figure 9:
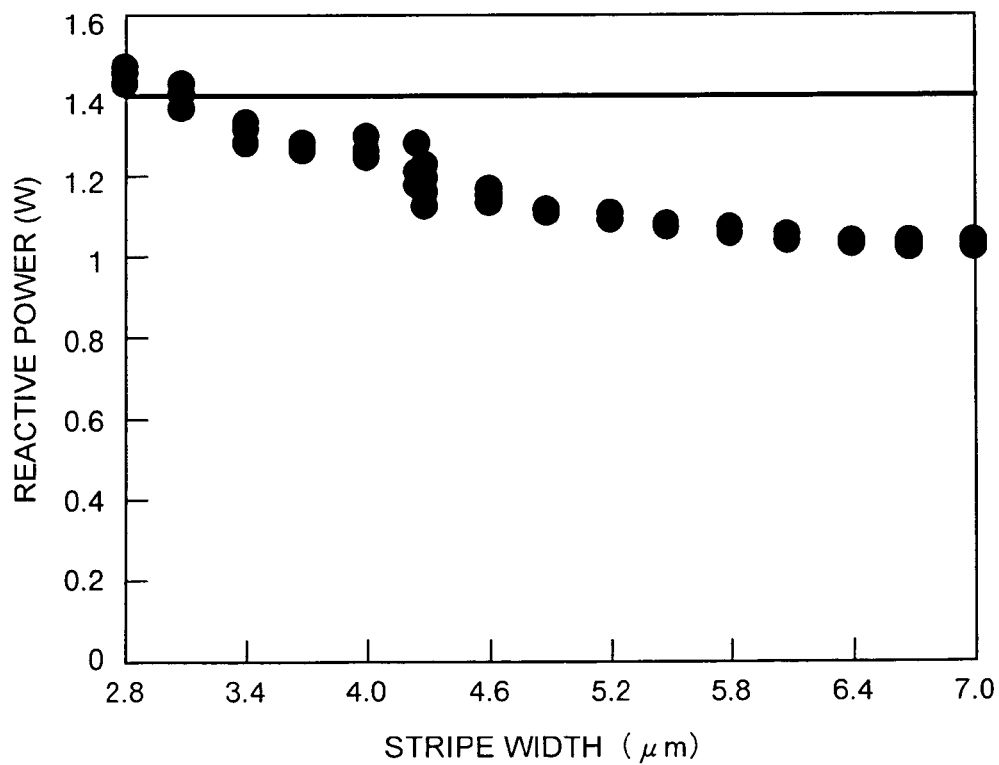
FIG. 9 is a graph that shows a result of measuring a change in reactive power relative to a fluctuation in a stripe width.

FIG. 9 is a graph that shows a result of measuring a change in reactive power not contributing to the laser oscillation, when a current of 900 mA is injected. In FIG. 9, plotted points show reactive power of the semiconductor laser device according to the present embodiment, and a straight line shows values of the BH laser according to the conventional technique.

As shown in FIG. 9, when the stripe width is about 2.8 μm, the reactive power of the semiconductor laser device according to the first embodiment is approximately the same as that of the conventional BH laser. However, when the stripe width increases, the reactive power is lowered. When the stripe width increases to 7.0 μm, the reactive power is lowered by about 29 percent of the reactive power when the stripe width is 2.8 μm.

Figure 10:
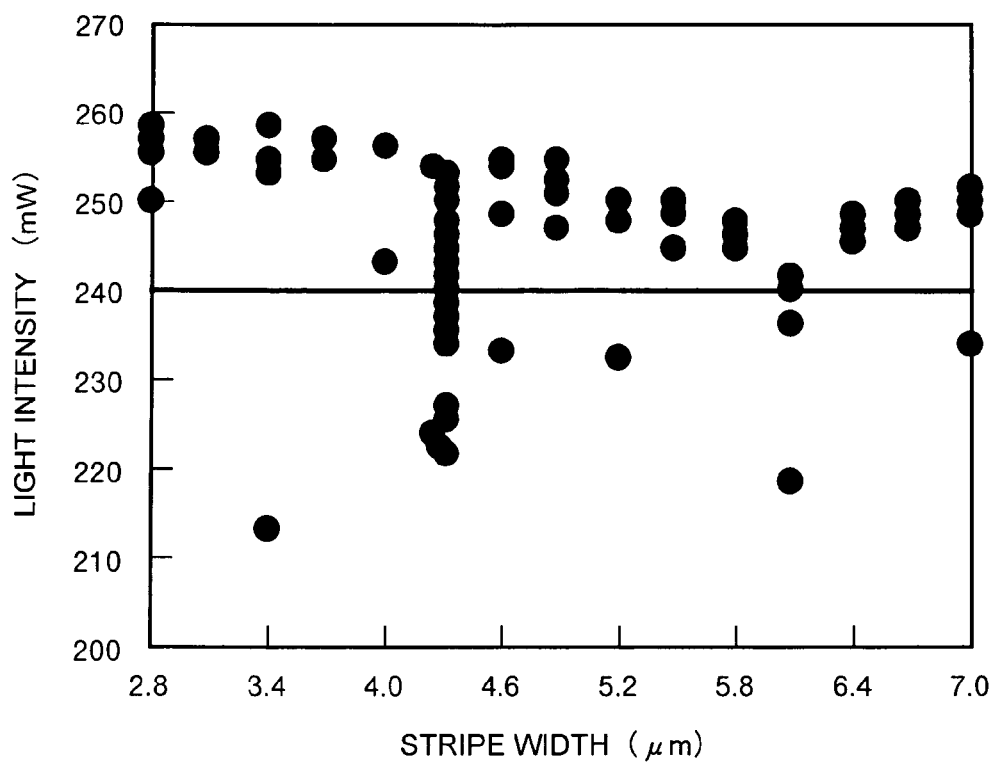
FIG. 10 is a graph that shows a result of measuring a change in the intensity of an emitted laser beam relative to a fluctuation in a stripe width.

FIG. 10 is a graph that shows a dependency of the intensity of an emitted laser beam on the stripe width of the semiconductor laser device according to the present embodiment, when a current of 900 mA is injected. In FIG. 10, plotted points show a distribution of the intensity of the laser beam emitted from the semiconductor laser device according to the present embodiment, and a straight line shows a distribution of the intensity the laser beam emitted from the BH laser according to the conventional technique.

As shown in FIG. 10, as a whole, the intensity of the laser beam emitted from the semiconductor laser device according to the first embodiment exceeds the intensity of the laser beam emitted from the conventional BH laser, with a few exceptions. Further, the intensity of the laser beam emitted from the semiconductor laser device according to the first embodiment exceeds the intensity of the laser beam emitted from the conventional BH laser, over the whole range of the stripe width. It is clear that the semiconductor laser device according to the first embodiment has excellent luminous efficiency.

Figure 11:
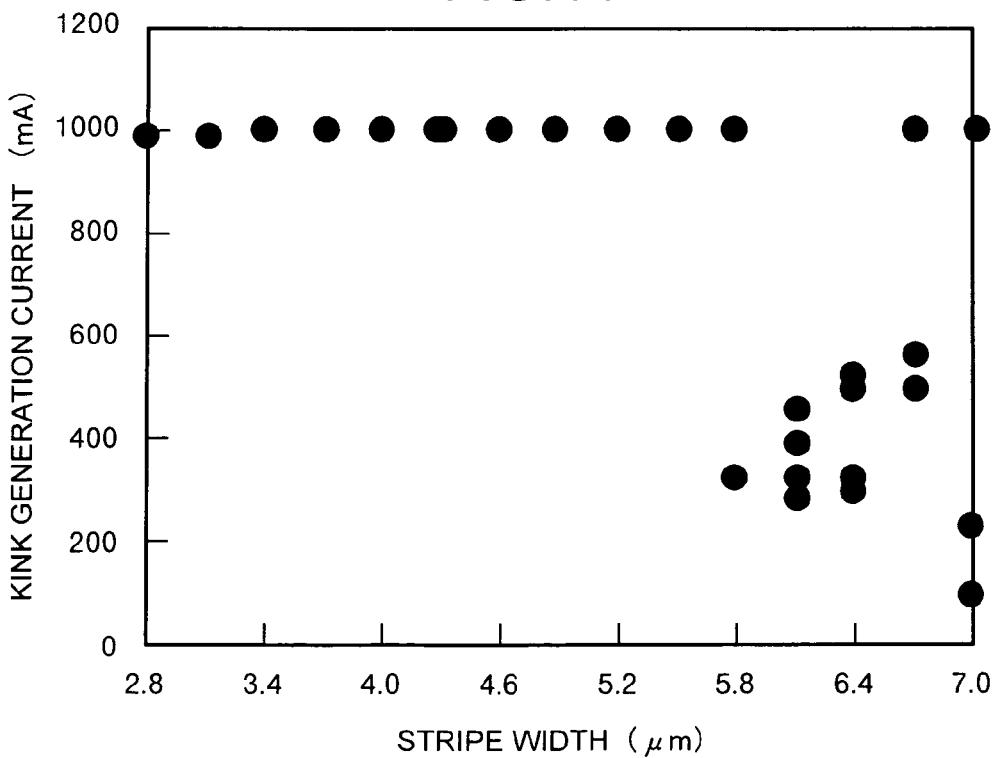
FIG. 11 is a graph that shows a result of measuring a change in a kink generation current value relative to a fluctuation in a stripe width.

FIG. 11 is a graph that shows a dependency of a current value when a kink occurs on the stripe width of the semiconductor laser device according to the present embodiment. In FIG. 11, plotted points show current values when a current-light intensity curve becomes discontinuous when the semiconductor laser device oscillates a laser beam. FIG. 11 omits a graph of the data relating to the BH laser according to the conventional technique. In the BH laser according to the conventional technique, a kink occurs at a current value of not higher than 1000 mA, when the stripe width is 2.5 μm. In the present measurement, a current measurement range is set as 0 mA to 1000 mA corresponding to a general range of current injection to the semiconductor laser device. When kinks occur at a current value beyond this current range, these currents are all plotted to the point of 1000 mA.

As shown in FIG. 11, in the semiconductor laser device according to the first embodiment, when the stripe width is not larger than 5.8 μm, the current at which a kink occurs is larger than 1000 mA. Therefore, the semiconductor laser device according to the first embodiment can prevent the occurrence of a kink within a normal current range, even when the stripe width is increased. Consequently, it is possible to realize a semiconductor laser device that can obtain a high output. Based on the results of the measurements shown in FIG. 8 to FIG. 11, preferably the stripe width is not smaller than 2.5 μm and not larger than 7.0 μm. More preferably, the stripe width is not smaller than 2.8 μm and not larger than 7.0 μm. Most preferably, the stripe width is not smaller than 2.8 μm and not larger than 5.8 μm.

While the semiconductor laser device according to the first embodiment is explained above, the structure of the semiconductor laser device according to the present invention is not limited to those described above. It is also possible to form the current blocking layer 9 with other materials, thereby to obtain the effects. For example, it is possible to form the current blocking layer 9 with $Ga_x In_{1-x} As_y P_{1-y}$ ($0<x\leq1$, $0<y\leq1$).

It is also possible to form the current blocking layer 9 with a semiconductor insulation layer. In this case, it is possible to form the current blocking layer 9 by doping iron as an impurity into InP. It is also possible to form the current blocking layer 9 with AlOx formed by selectively oxidizing a material that includes aluminum such as AlInAs.

The conduction type of each layer that constitutes the semiconductor laser device according to the first embodiment may be opposite to that explained above. In other words, the substrate 1, the lower cladding layer 2, and the current blocking layer 9 may be p-type semiconductor materials, and the first upper cladding layer 6, the second upper cladding layer 8, the third upper cladding layer 10, and the contact layer 11 may be n-type semiconductor materials.

It is not always necessary to dispose the second upper cladding layer 8 at the center. It is also possible to realize a semiconductor laser device that achieves a weak confinement of light in a horizontal direction, even when the second upper cladding layer 8 is disposed in an area moved from the center. However, from the viewpoint of symmetry of the emitted laser beam, it is preferable that the second upper cladding layer 8 is disposed at the center, and the current blocking layer 9 is disposed at positions symmetrical with the center.

Further, the first upper cladding layer 6, the second upper cladding layer 8, and the third upper cladding layer 10 may be formed to have mutually different refractive indexes relative to the emission wavelength. For example, to control the light confinement in a layer direction, it is possible to select materials of the respective cladding layers such that the refractive indexes become gradually smaller in the order of the first upper cladding layer 6, the second upper cladding layer 8, and the third upper cladding layer 10. When the refractive indexes of the respective cladding layers are changed, it is possible to control the light confinement in a horizontal direction based on the current blocking layer 9.

In the semiconductor laser device according to the first embodiment, it is possible to obtain an optical output of 400 mW, when the resonator has a length of 1000 μm, the second upper cladding layer 8 has a width of 4 μm in a horizontal direction, the low reflection film 15 has reflectivity of 1.5 percent, and the high reflection film 16 has reflectivity of 98 percent. As explained above, the reflectivity of the low reflection film 15 is optimized according to the length of the resonator. When the resonator has a larger length, an optimum design is obtained to obtain a high output when the low reflection film 15 has lower reflectivity.

Figure 12:
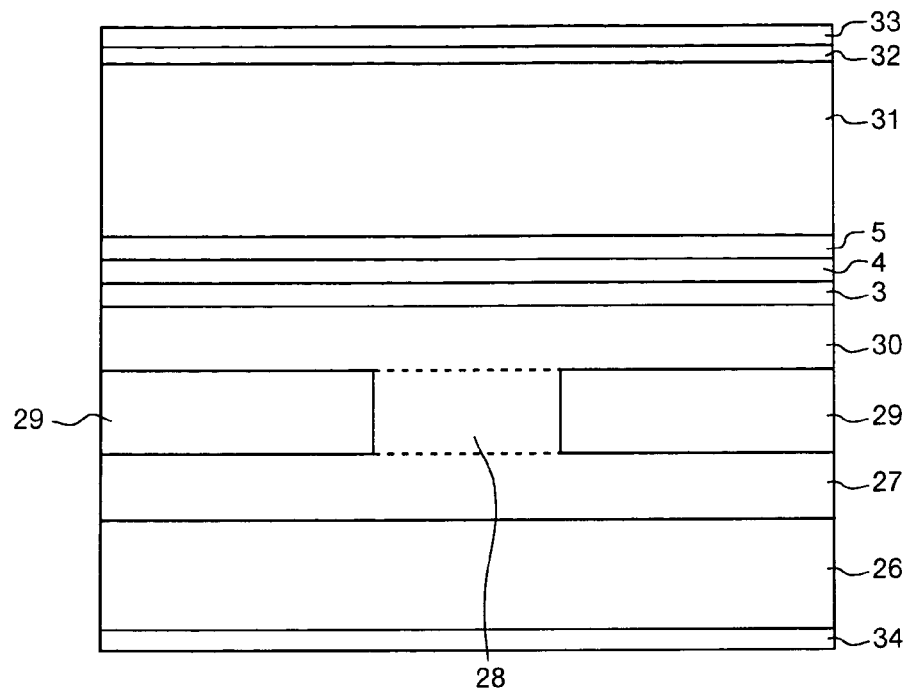
FIG. 12 is a front view of a structure of a semiconductor laser device according to a second embodiment of the present invention.

A semiconductor laser device according to a second embodiment of the present invention is explained. FIG. 12 is a front view of a structure of the semiconductor laser device according to the second embodiment. The semiconductor laser device according to the second embodiment has a current blocking layer disposed in a lower cladding layer. The structure of the semiconductor laser device according to the second embodiment is explained in detail below with reference to FIG. 12. In the semiconductor laser device according to the second embodiment, portions attached with identical or similar reference symbols to those of the semiconductor laser device according to the first embodiment have identical functions and carry out identical operations unless specified otherwise.

The semiconductor laser device according to the second embodiment has a third lower cladding layer 27 laminated on a substrate 26. A stripe-pattern second lower cladding layer 28 having a longitudinal direction in a light emission direction is laminated in the center area on the third lower cladding layer 27. A current blocking layer 29 is laminated in an area where the second lower cladding layer 28 is not laminated, on the third lower cladding layer 27. A first lower cladding layer 30, the lower SCH layer 3, the quantum well layer 4, the upper SCH layer 5, an current blocking layer 31, and a contact layer 32 are sequentially laminated on the second lower cladding layer 28 and the quantum well layer 29. An n-type electrode 33 is disposed on the contact layer 32, and a p-side electrode 34 is disposed on the rear surface of the substrate 26. A low reflection film is disposed on an end surface at the emission side, and a high reflection film is disposed on an end surface at the reflection side, in a similar manner to that of the first embodiment.

The substrate 26 consists of InP having the p-type conduction type. The third lower cladding layer 27, the second lower cladding layer 28, and the first lower cladding layer 30 also have the p-type conduction type. On the other hand, the current blocking layer 31, and the contact layer 32 have the n-type conduction type.

When the substrate having the p-type conduction type is used like in the semiconductor laser device according to the second embodiment, there is the following advantage by laminating the current blocking layer 29 between the substrate 26 and the quantum well layer 4. That is, by disposing the current blocking layer 29 on the p-type cladding layer lower than the quantum well layer 4, it is possible to restrict the spread of the injection current in a horizontal direction, as compared with when the current blocking layer 29 is disposed on the p-type cladding layer higher than the quantum well layer 4.

It is also possible to structure the current blocking layer 29 with a semiconductor material different from the semiconductor material used for the second lower cladding layer 28. It is also possible to structure the current blocking layer 29 with the same material as that used for the second lower cladding layer 28, using mutually different impurity densities. In other words, it is sufficient to set the refractive index of the current blocking layer 29 lower than the refractive index of the second lower cladding layer 28, relative to the wavelength of the emitted laser beam. It is also preferable to adjust the composition or the impurity density of the current blocking layer 29 so as to minimize the difference between the refractive index of the current blocking layer 29 and the second lower cladding layer 28 while maintaining the magnitude relationship, thereby to weaken the light confinement in a horizontal direction.

Based on a structure that the current blocking layer 29 is disposed between the quantum well layer 4 and the p-side electrode 34, it is possible to efficiently radiate the heat generated inside the semiconductor laser device to the outside, regardless of the semiconductor material that constitutes the current blocking layer 29. As the semiconductor laser device is fixed onto the laser mount based on the junction down method as described above, the heat generated inside the semiconductor laser device is radiated to the laser mount via the n-side electrode 33. Therefore, in the semiconductor laser device according to the second embodiment, the radiation is not aggravated due to the existence of the current blocking layer 29. Consequently, there is an advantage that it is possible to select a material that constitutes the current blocking layer 29 based on a large range of choice. For the above reasons, in the semiconductor laser device according to the second embodiment, it is possible to determine the structure of the current blocking layer 29, based on only the viewpoint of controlling the light confinement in a horizontal direction, without sacrificing other characteristics. As a result, it is possible to realize a semiconductor laser device that can obtain a high output.

Figure 13:
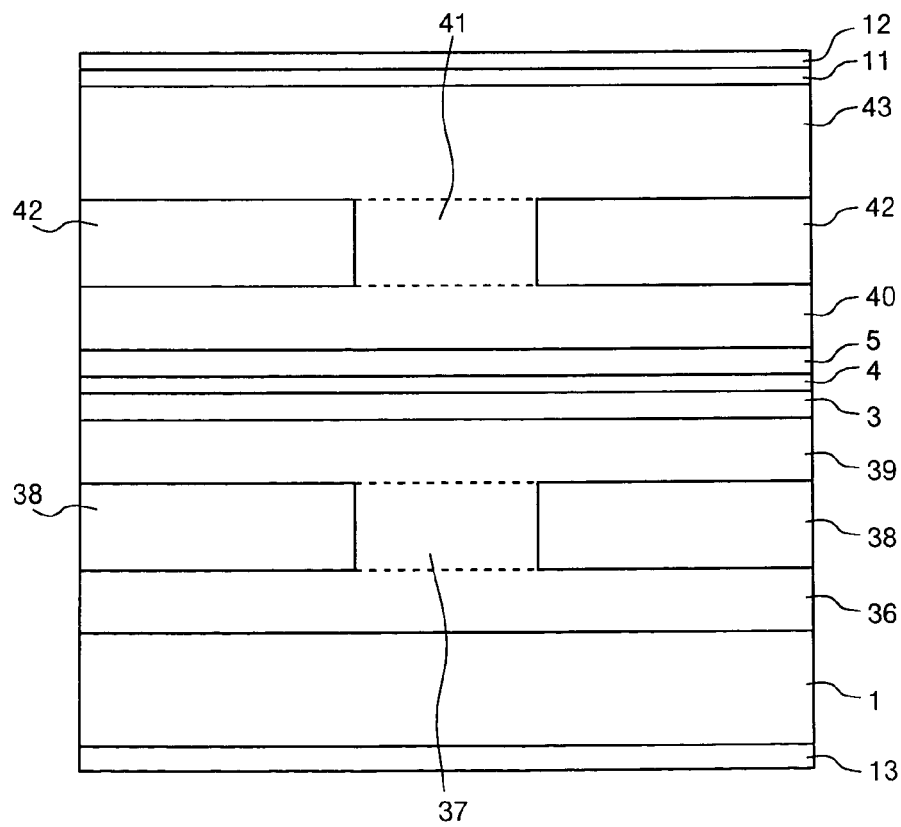
FIG. 13 is a front view of a structure of a semiconductor laser device according to a third embodiment of the present invention.

A semiconductor laser device according to a third embodiment of the present invention is explained. FIG. 13 is a front view of a structure of the semiconductor laser device according to the third embodiment. The semiconductor laser device according to the third embodiment has a current blocking layer disposed both inside an upper cladding layer and inside a lower cladding layer respectively. The structure of the semiconductor laser device according to the third embodiment is explained below by referring to FIG. 13 when necessary.

The semiconductor laser device according to the third embodiment has a third lower cladding layer 36 laminated on the substrate 1. A stripe-pattern second lower cladding layer 37 having a longitudinal direction in a light emission direction is laminated in a part of the area near the center on the third lower cladding layer 36. A lower current blocking layer 38 is laminated in an area where the second lower cladding layer 37 is not laminated, on the third lower cladding layer 36. A first lower cladding layer 39, the lower SCH layer 3, the quantum well layer 4, the upper SCH layer 5, and a first upper cladding layer 40 are sequentially laminated on the second lower cladding layer 37 and the lower current blocking layer 38. A stripe-pattern second upper cladding layer 41 having a longitudinal direction in a light emission direction is laminated in a part of the area near the center on the first upper cladding layer 40. An upper current blocking layer 42 is laminated in an area where the second upper cladding layer 41 is not laminated, on the first upper cladding layer 40. A third upper cladding layer 43, and a contact layer 11 are laminated sequentially on the second upper cladding layer 41 and the upper current blocking layer 42. The p-type electrode 12 is disposed on the contact layer 11, and the n-type electrode 13 is disposed on the rear surface of the substrate 1, in a similar manner to that of the first to third embodiments.

The lower current blocking layer 38 and the upper current blocking layer 42 both narrow a current, and confine a light in a horizontal direction. Therefore, the lower current blocking layer 38 is made of a semiconductor layer of the p-type conduction type, and has a refractive index lower than that of the second lower cladding layer 37, relative to the wavelength of the emitted laser beam. On the other hand, the upper current blocking layer 42 is made of a semiconductor layer of the n-type conduction type, and has a refractive index lower than that of the second upper cladding layer 41, relative to the wavelength of the emitted laser beam. The semiconductor materials that constitute the lower current blocking layer 38 and the upper current blocking layer 42 may be $Ga_xIn_{1-x}As_yP_{1-y}$, or may be InP doped with a high-density impurity.

As explained above, the semiconductor laser device according to the third embodiment has the upper current blocking layer 42 and the lower current blocking layer 38 that vertically sandwich the quantum well layer 4. Therefore, the semiconductor laser device according to the third embodiment has the two semiconductor layers that control the refractive indexes in a horizontal direction. As the semiconductor layers can control the light confinement in a horizontal direction, it is possible to easily adjust the light confinement.

A semiconductor laser module according to a fourth embodiment of the present invention is explained. In the fourth embodiment, the semiconductor laser module is structured by using the semiconductor laser device according to the first to third embodiments.

Figure 14:
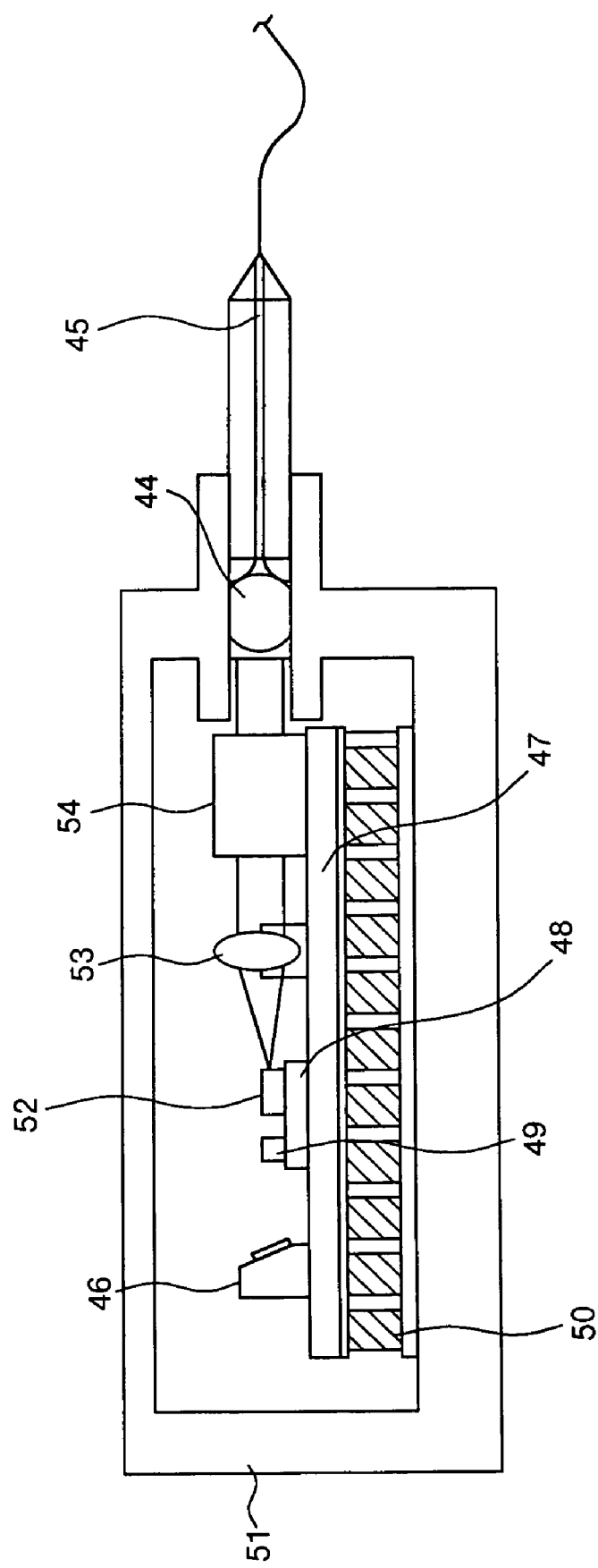
FIG. 14 is a side cross-sectional view of a structure of a semiconductor laser module according to a fourth embodiment of the present invention.

FIG. 14 is a side cross-sectional view of a structure of the semiconductor laser module according to the fourth embodiment of the present invention. The semiconductor laser module according to the fourth embodiment has a semiconductor laser device 52 according to the first to third embodiments. This semiconductor laser device 52 has a junction down structure of having the opposite side of the substrate joined to a laser mount 48. A package 51 made of a ceramic or the like is provided as a casing of the semiconductor laser module. A temperature control module 50 is disposed as a temperature control unit on the inside bottom surface of the package 51. A base 47 is disposed on the temperature control module 50, and the laser mount 48 is disposed on this base 47. A current not shown is supplied to the temperature control module 50. The temperature control module 50 carries out cooling and heating based on the polarity of the current, and this module mainly functions as a cooler. The temperature control module 50 controls the temperature based on a result of a detection carried out by a thermistor 49 disposed near the semiconductor laser device 52 on the laser mount 48. A controller not shown controls the temperature control module 50 so as to keep the temperature of the laser mount 48 always at a constant level.

It is also possible to control the temperature control module 50 to prevent the occurrence of a deviation of the lasing wavelength due to a rise in the temperature of the semiconductor laser device 52. In other words, when the wavelength of the laser beam is longer than a desired wavelength, it is possible to control the temperature control module 50 to keep a low temperature by cooling. When the wavelength of the laser beam is shorter than a desired wavelength, it is possible to control the temperature control module 50 to keep a high temperature by heating. In this case, the controller not shown controls the temperature control module 50 to lower the temperature of the laser module 48 along the increase in the driving current of the semiconductor laser device 52.

Based on this temperature control, it is possible to improve the output stability of the semiconductor laser device 52, which is effective to improve the yield. It is desirable that the laser mount 48 is made of a material having high thermal conductivity such as diamond. This is because the laser mount 48 made of diamond can restrict the heat generation when a high current is applied to this.

On the base 47, there are disposed the laser mount 48 on which the semiconductor laser device 52 and the thermistor 49 are disposed, a first lens 53, and a photodetector 46. The semiconductor laser device 52 emits a laser beam. The laser beam is guided to an optical fiber 45 via the first lens 53, an isolator 54, and a second lens 44. The second lens 44 is provided on an optical axis of the laser beam on the package 51, and is optically coupled with the optical fiber 45 externally connected. The photodetector 46 monitors a beam leaked out from the high reflection film of the semiconductor laser device 52. The optical coupling system may be the system that uses the two lenses as shown in FIG. 14, or a system that processes the lens at the front end of the fiber.

In the present semiconductor laser module, the isolator 54 is provided between the semiconductor laser device 52 and the optical fiber 45 to prevent beams reflected from other optical parts from returning to the resonator.

It is also possible to dispose a fiber grating inside the optical fiber, thereby to form a resonator with the end surface at the reflection side of the semiconductor laser device 52. In this case, from the viewpoint of optimizing the output at the end of the fiber, it is preferable that the reflectivity of the end surface at the emission side of the semiconductor laser device is as small as possible, i.e., about 0.1 percent, and that the reflectivity of the fiber grating is about 1.5 percent, and the half width is about 1.5 nm. Based on this condition, an output of about 340 mW is obtained from the end of the fiber of the semiconductor laser module. When the isolator 54 is disposed, it is necessary to dispose the isolator 54 not within the semiconductor laser module but at a side near to the fiber grating in the light emission direction based on the inline system.

An optical fiber amplifier according to a fifth embodiment is explained. In the fifth embodiment, the semiconductor laser module explained in the fourth embodiment is applied to a Raman amplifier.

Figure 15:
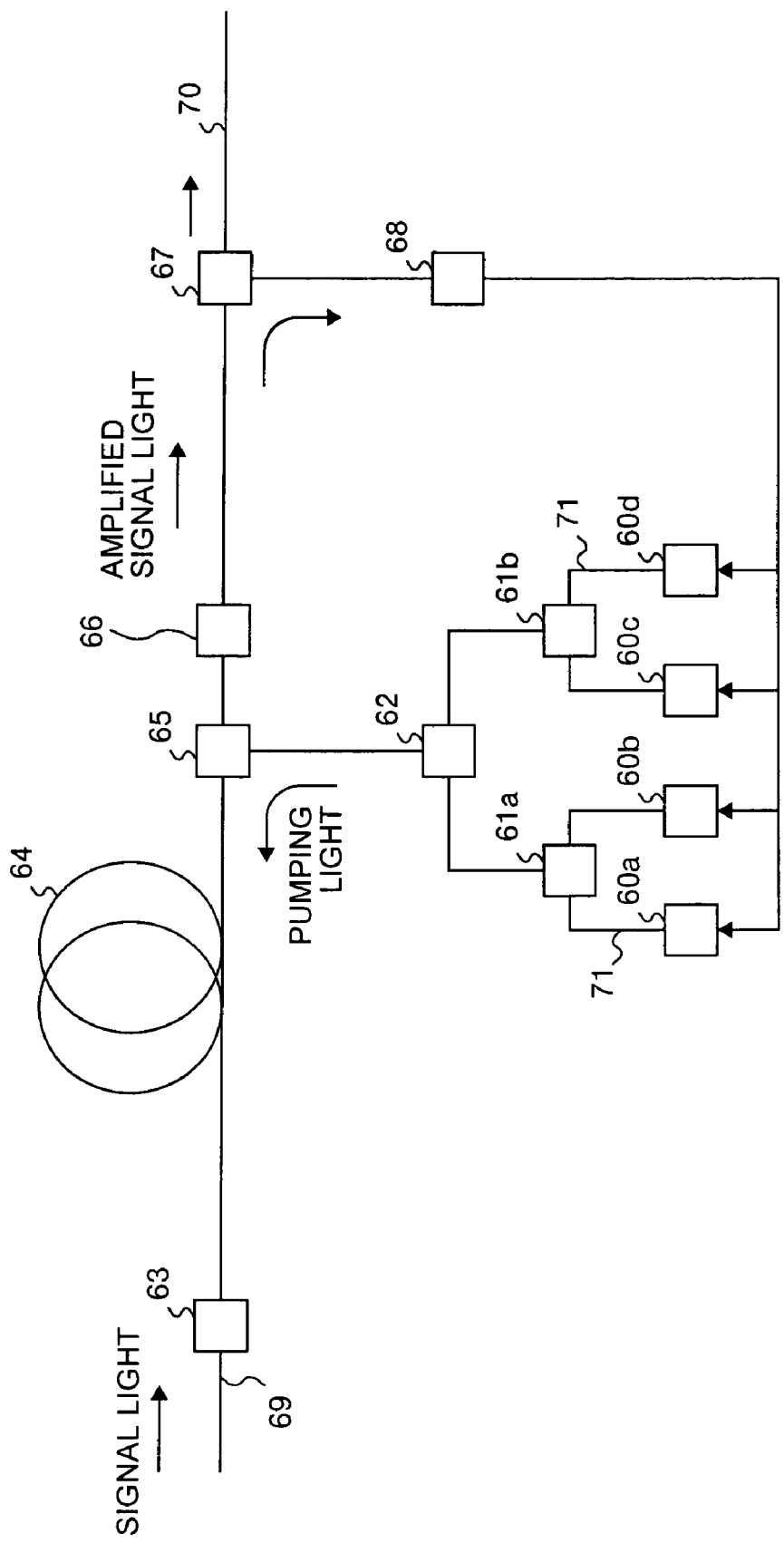
FIG. 15 is a block diagram that shows a structure of an optical fiber amplifier according to a fifth embodiment of the present invention.

FIG. 15 is a block diagram that shows a structure of the Raman amplifier according to the fifth embodiment of the present invention. This Raman amplifier is used for a WDM communication system. In FIG. 15, this Raman amplifier uses semiconductor laser modules 60a to 60d that have the same structures as that of the semiconductor laser module explained in the fourth embodiment.

Each of the semiconductor laser modules 60a and 60b outputs a laser beam having a plurality of oscillation longitudinal modes to a polarization coupler 61a via a polarization maintaining fiber 71. Each of the semiconductor laser modules 60c and 60d outputs a laser beam having a plurality of oscillation longitudinal modes to a polarization coupler 61b via the polarization maintaining fiber 71. The laser beams that the semiconductor laser modules 60a and 60b oscillate have the same wavelengths. The laser beams that the semiconductor laser modules 60c and 60d oscillate have the same wavelengths, which are different from the wavelength of the laser beams that the semiconductor laser modules 60a and 60b oscillate. This difference of the wavelengths is because the Raman amplification has polarization dependency. The polarization couplers 61a and 61b output laser beams after canceling the polarization dependency.

A WDM coupler 62 combines the laser beams having different wavelengths output from the polarization couplers 61a and 61b, and outputs the combined laser beam to an amplification fiber 64 as the pumping light for Raman amplification via a WDM coupler 65. This pumping light is input to the amplification fiber 64. The amplification fiber 64 receives an input signal light to be amplified, and Raman amplifies this signal.

The amplification fiber 64 outputs the Raman amplified signal light (i.e., an amplified signal light) to a monitor light distribution coupler 67 via the WDM coupler 65 and the isolator 66. The monitor light distribution coupler 67 outputs a part of the amplified signal light to a control circuit 68, and outputs the rest of the amplified signal light to a signal light output fiber 70 as an output laser beam.

The control circuit 68 controls the laser output states of the semiconductor laser modules 60a to 60d, such as the light intensities, based on a part of the input amplified signal light, and feedback controls these semiconductor laser modules so that the gain band after the Raman amplification becomes flat.

The Raman amplifier explained in the fifth embodiment uses the semiconductor laser module 60a that incorporates the semiconductor laser device explained in the first to third embodiments. Therefore, it is possible to increase the intensity of the laser beam emitted from the semiconductor laser module.

Figure 16:
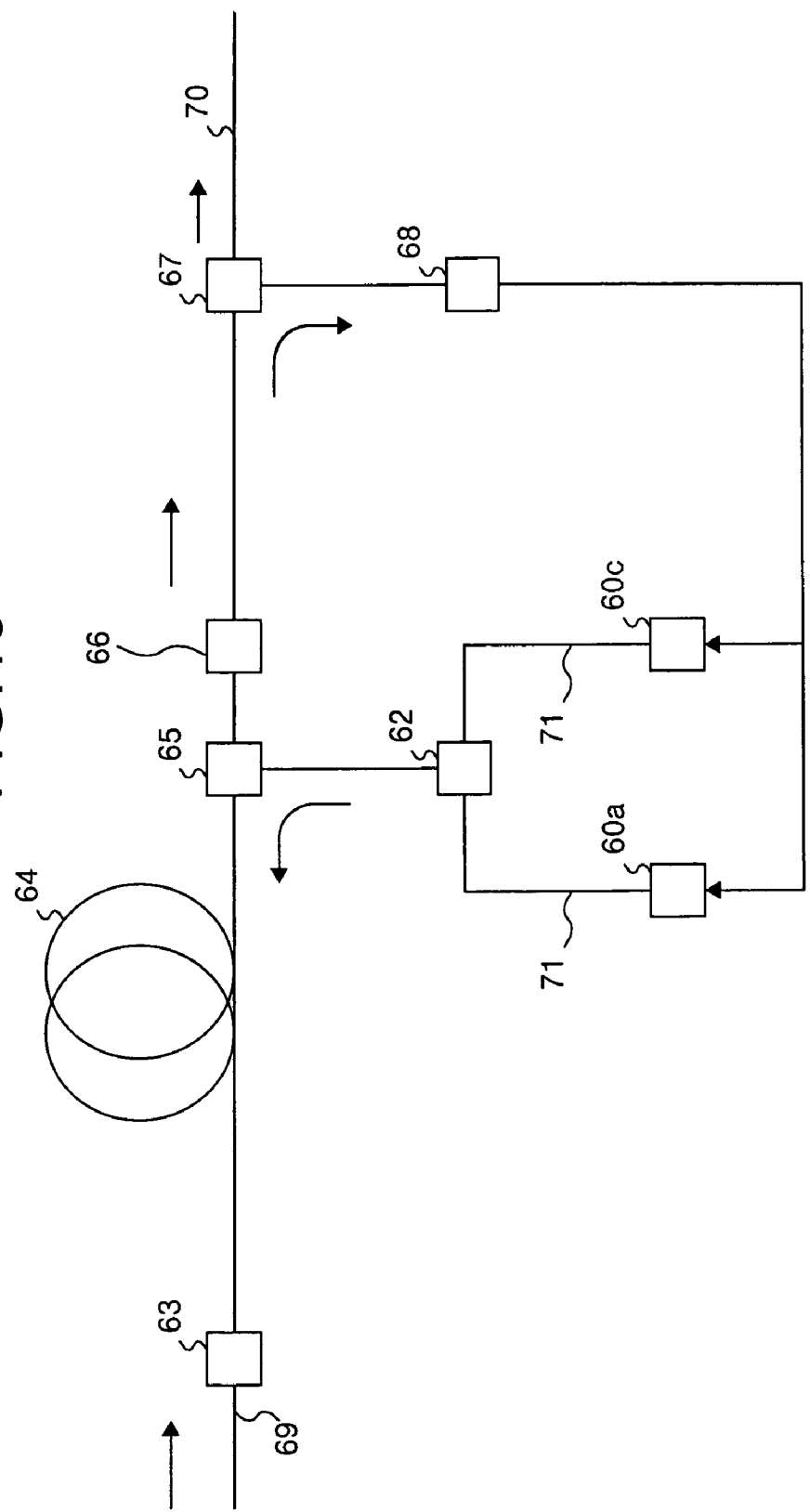
FIG. 16 is a block diagram that shows an example of application of the optical fiber amplifier according to the fifth embodiment.

While the Raman amplifier shown in FIG. 15 uses the polarization couplers 61a and 61b, it is possible to arrange such that the semiconductor laser modules 60a and 60c directly output lights to the WDM coupler 62 via the polarization maintaining fibers 71 respectively, as shown in FIG. 16. In this case, the planes of polarization of the semiconductor laser modules 60a and 60c form an angle of 45 degrees relative to the polarization maintaining fibers 71 respectively.

While the Raman amplifiers shown in FIG. 15 and FIG. 16 are based on a backward pumping system, it is also possible to carry out a stable Raman amplification based on a copropagating pumping system or a bidirectional system.

Figure 17:
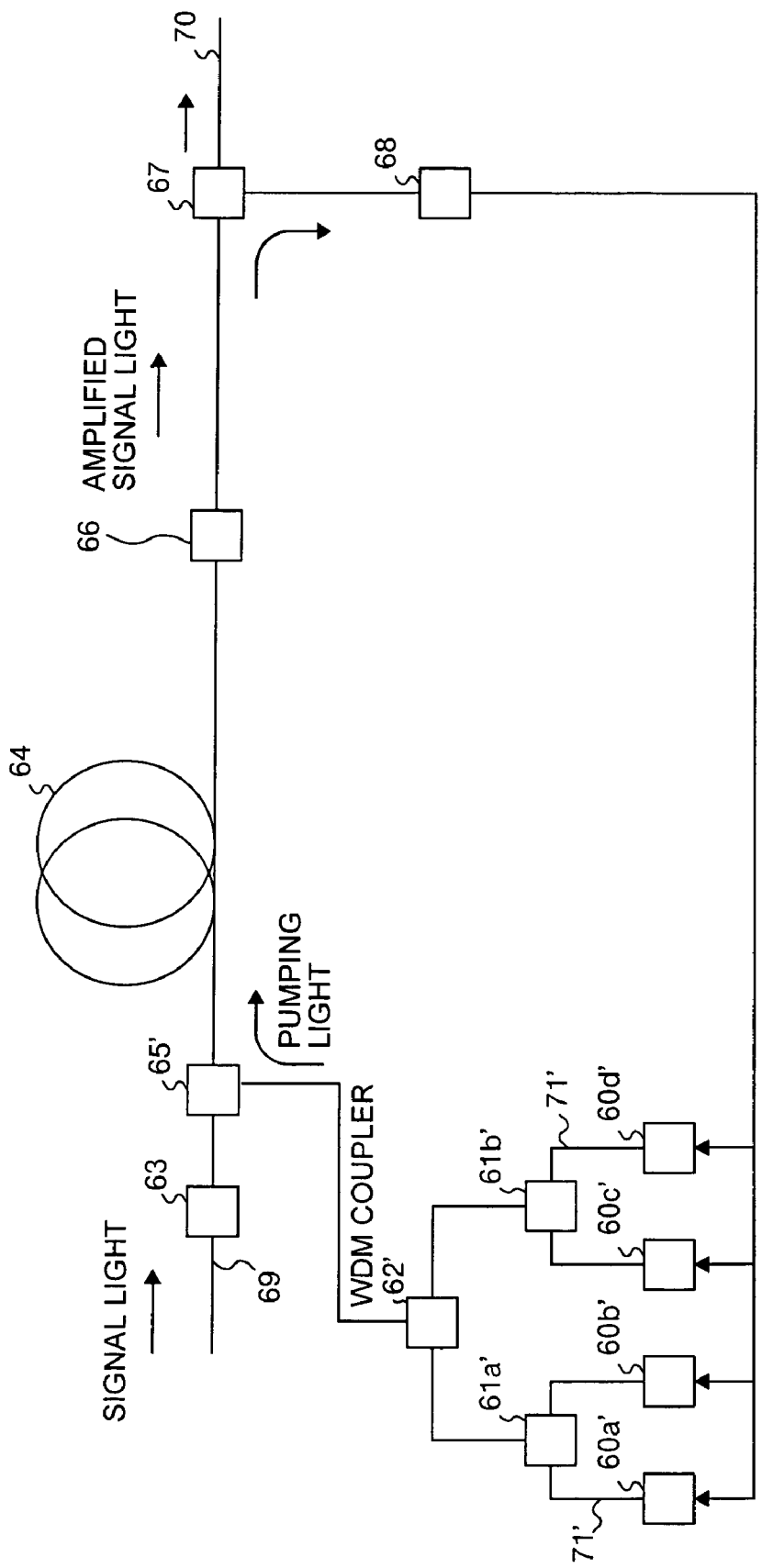
FIG. 17 is a block diagram that shows a modified structure of the optical fiber amplifier according to the fifth embodiment, where the semiconductor laser device employs a copropagating pumping system.

For example, FIG. 17 is a block diagram that shows a Raman amplifier employing the copropagating pumping system. While the WDM coupler 65 is disposed near the isolator 66 in the Raman amplifier shown in FIG. 15, the Raman amplifier shown in FIG. 17 has a WDM coupler 65' disposed near an isolator 63. A circuit that has semiconductor laser modules 60a' to 60d', polarization couplers 61a' and 61b', and a WDM coupler 62' corresponding to the semiconductor laser modules 60a to 60d, the polarization couplers 61a and 61b, and the WDM coupler 62 respectively, is connected to the WDM coupler 65'. This Raman amplifier carries out the copropagating pumping of outputting the pumping light from the WDM coupler 62' to the same direction as the direction to which the signal light is output.

Figure 18:
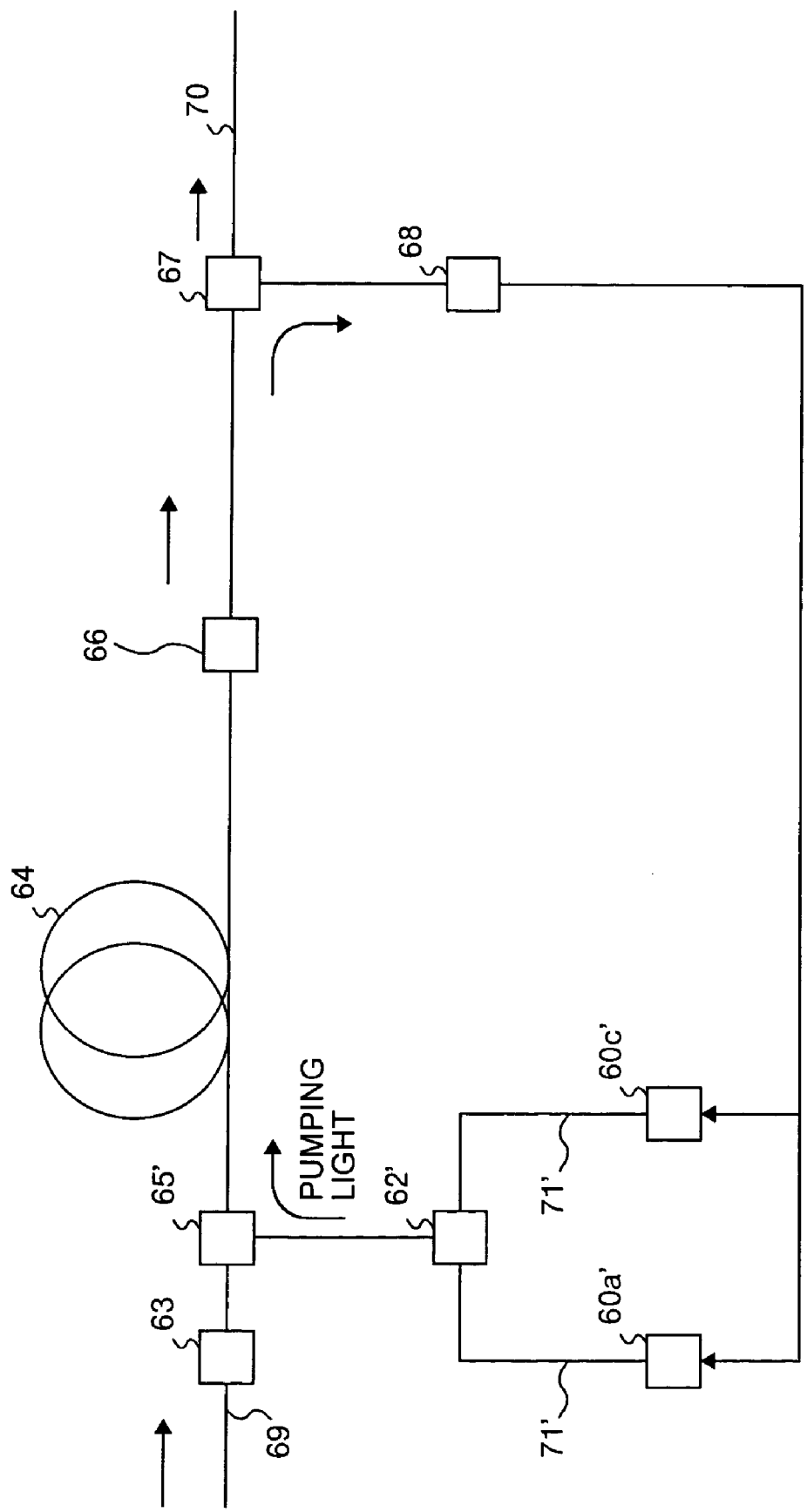
FIG. 18 is a block diagram that shows an example of application of the optical fiber amplifier shown in FIG. 17.

Similarly, FIG. 18 is a block diagram that shows a Raman amplifier employing the copropagating pumping system. While the Raman amplifier shown in FIG. 16 has the WDM coupler 65 disposed near the isolator 66, the Raman amplifier shown in FIG. 18 has the WDM coupler 65' disposed near the isolator 63. A circuit that has the semiconductor laser modules 60a' and 60c', and the WDM coupler 62' corresponding to the semiconductor laser modules 60a and 60c, and the WDM coupler 62 respectively, is connected to the WDM coupler 65'. This Raman amplifier carries out the copropagating pumping of outputting the pumping light from the WDM coupler 62' to the same direction as the direction to which the signal light is output.

Figure 19:
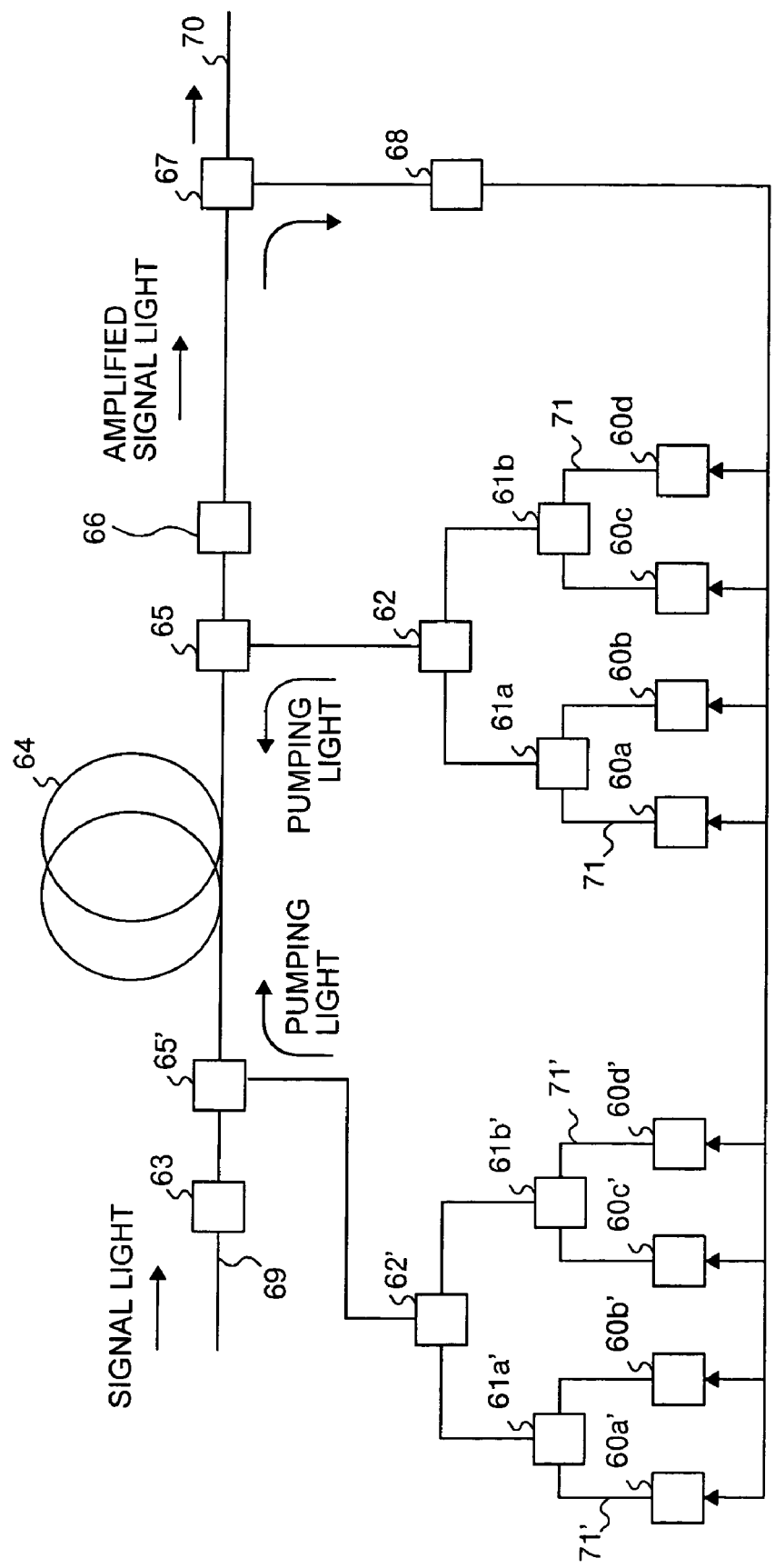
FIG. 19 is a block diagram that shows a modified structure of the optical fiber amplifier according to the fifth embodiment, where the semiconductor laser device employs a bidirectional pumping system.

FIG. 19 is a block diagram that shows a Raman amplifier employing the bidirectional pumping system. The Raman amplifier shown in FIG. 19 has the WDM coupler 65', the semiconductor laser modules 60a' to 60d', the polarization couplers 61a' and 61b', and the WDM coupler 62', in addition to the structure of the Raman amplifier shown in FIG. 15. The Raman amplifier carries out the backward pumping and the copropagating pumping based on this structure.

Figure 20:
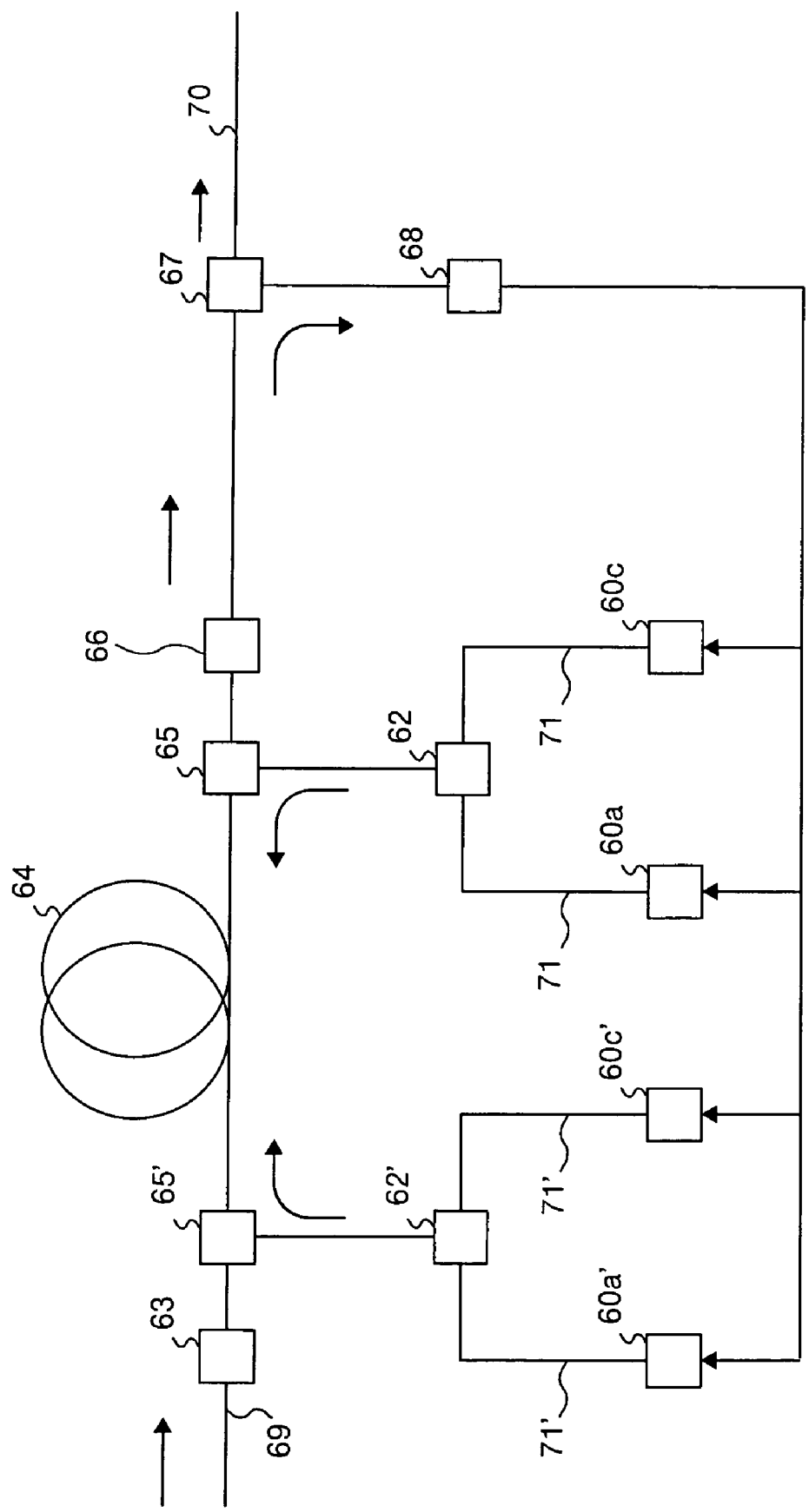
FIG. 20 is a block diagram that shows an example of application of the optical fiber amplifier shown in FIG. 19.

Similarly, FIG. 20 is a block diagram that shows a Raman amplifier employing the bidirectional pumping system. The Raman amplifier shown in FIG. 20 has the WDM coupler 65', the semiconductor laser modules 60a' and 60c', and the WDM coupler 62', in addition to the structure of the Raman amplifier shown in FIG. 15. The Raman amplifier carries out the backward pumping and the copropagating pumping based on this structure.

Figure 21:
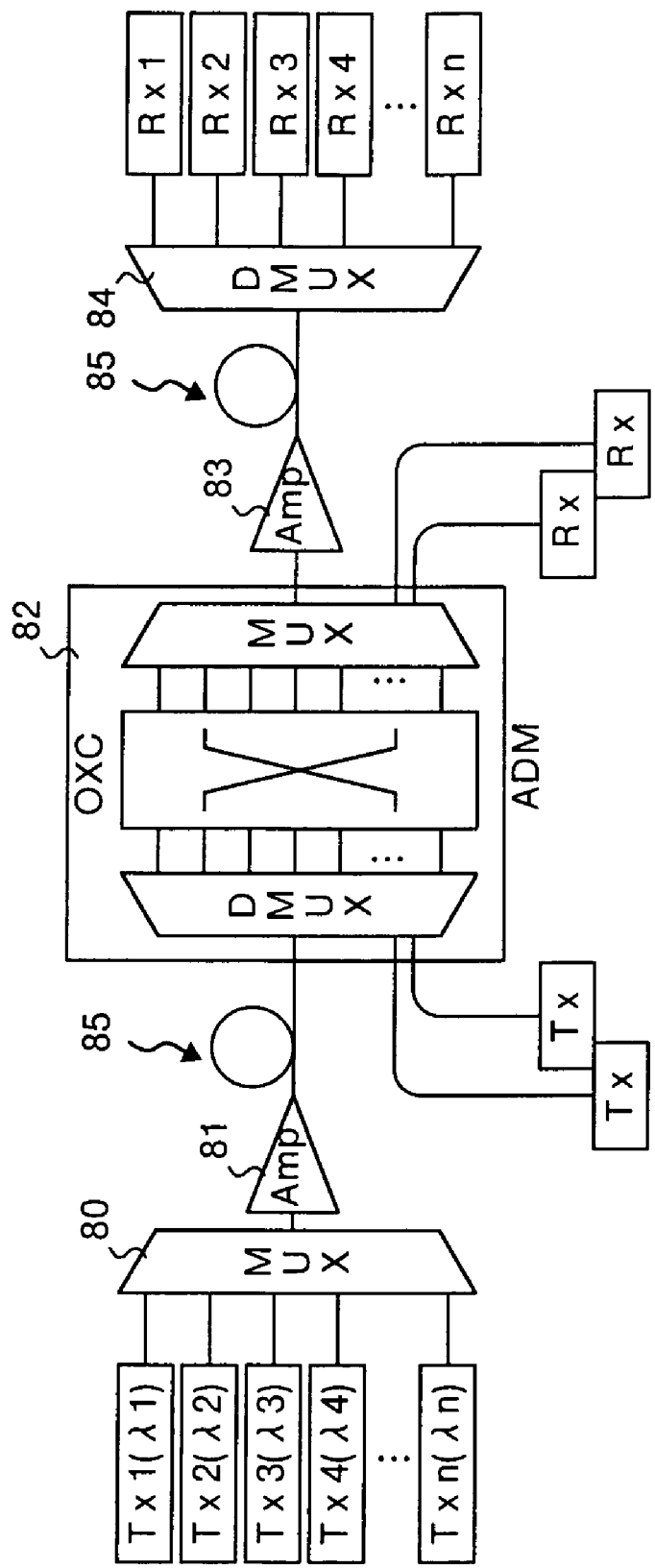
FIG. 21 is a block diagram that shows a schematic structure of a wavelength division multiplexing (WDM) communication system that uses the optical fiber amplifiers according to the fifth embodiment.

As explained above, it is possible to apply the Raman amplifiers shown in FIG. 15 to FIG. 20 to the WDM communication system. FIG. 21 is a block diagram that shows a schematic structure of a WDM communication system that uses the Raman amplifiers shown in FIG. 15 to FIG. 20.

Referring to FIG. 21, a plurality of transmitters Tx1 to Txn transmit light signals having wavelengths λ1 to λn to an optical multiplexer 80. This optical multiplexer 80 multiplexes these light signals, and puts them together into one optical fiber 85. A plurality of Raman amplifiers 81 and 83 corresponding to the Raman amplifiers shown in FIG. 17 to FIG. 20 are disposed according to a distance on the transmission line of this optical fiber 85, and these Raman amplifiers amplify an attenuated light signal. An optical demultiplexer 84 branches the signal transmitted through this optical fiber 85 into the light signals having the wavelengths λ1 to λn. A plurality of receivers Rx1 to Rxn receive these signals. Depending on the situation, add/drop multiplexers (ADM) that add and take out a light signal of an optional wavelength is inserted into the optical fiber 85.

In the fifth embodiment, any one of the semiconductor laser devices explained in the first to third embodiments or the semiconductor laser module explained in the fourth embodiment is used for the pumping source for Raman amplification. However, the use is not limited to this. For example, it is needless to mention that is also possible to use the semiconductor laser device or the semiconductor laser module for the pumping source of the erbium-doped fiber amplifier (EDFA) or the like.

Figure 22:
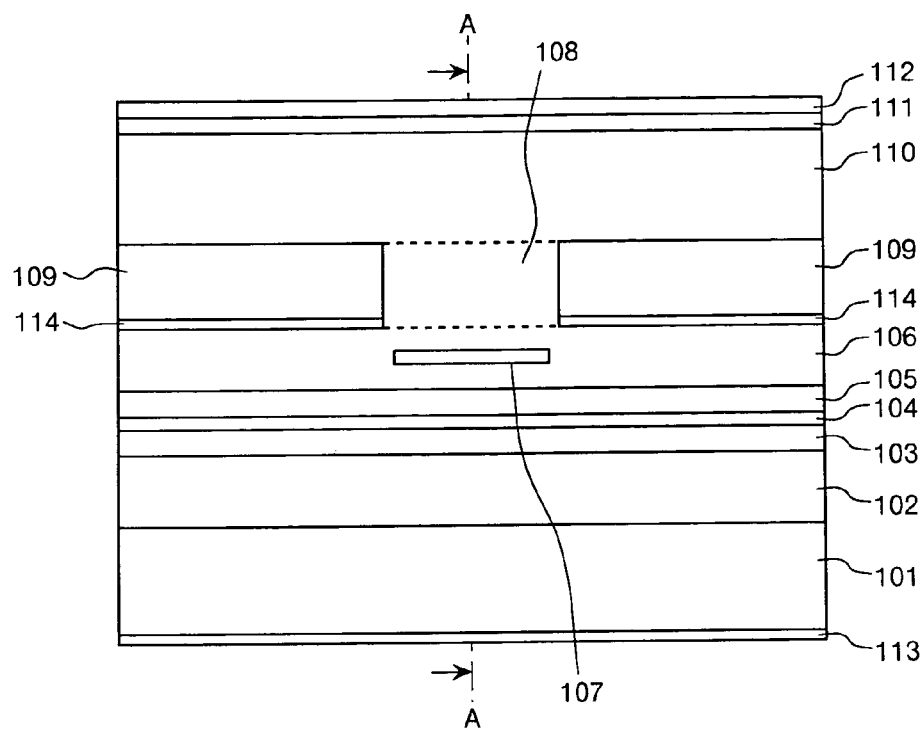
FIG. 22 is a front view of a structure of a semiconductor laser device according to a sixth embodiment of the present invention.
Figure 23:
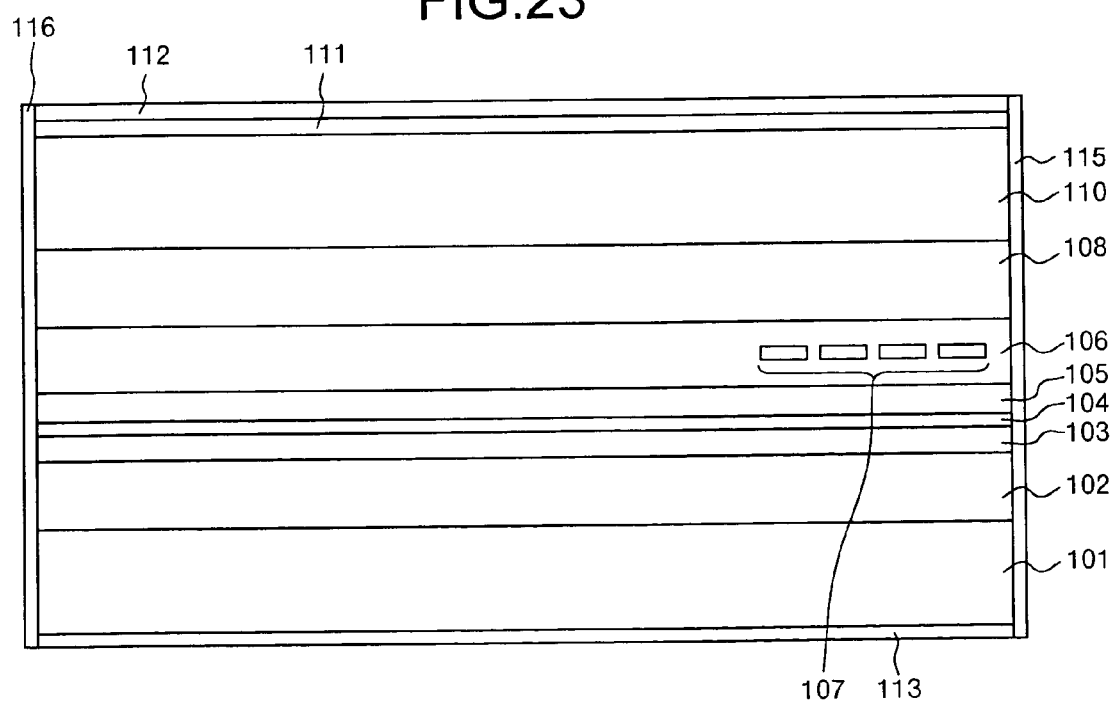
FIG. 23 is a cross-sectional view of the structure of the semiconductor laser device cut along a line A—A in FIG. 2.

A semiconductor laser device according to a sixth embodiment of the present invention is explained. The semiconductor laser device according to the sixth embodiment is a so-called self-aligned structure (SAS) type laser. In this laser, a current blocking layer has not only the current contracting function but also the function of confining the light in a horizontal direction. FIG. 22 is a front view of the semiconductor laser device according to the sixth embodiment of the present invention. FIG. 23 is a cross-sectional view of the semiconductor laser device cut along a line A—A in FIG. 22. The structure of the semiconductor laser device according to the sixth embodiment is explained below with reference to FIG. 22 and FIG. 23.

The semiconductor laser device according to the sixth embodiment has a lower cladding layer 102, a lower SCH layer 103, a quantum well layer 104, an upper SCH layer 105, and a first upper cladding layer 106 sequentially laminated on a substrate 101. A striped-pattern second upper cladding layer 108 that has a longitudinal direction in a laser beam emission direction and that functions as a current passing layer is laminated on a part of the area of the first upper cladding layer 106. A current blocking layer 109 is laminated in an area where the second upper cladding layer 108 is not laminated, on the first upper cladding layer 106. A third upper cladding layer 110 and a contact layer 111 are laminated sequentially on the second upper cladding layer 108 and the current blocking layer 109 respectively. A p-side electrode 112 is disposed on the contact layer 111. An n-side electrode 113 is disposed on the rear surface of the substrate 101. A diffraction grating 107 is disposed in an area beneath the second upper cladding layer 108 within the first upper cladding layer 106. As shown in FIG. 23, a low reflection film 115 is disposed on an end surface at the light emission side (that is, an end surface at the right side in FIG. 23). A high reflection film 116 is disposed on an end surface at the side opposite to the end surface at the light emission side (that is, on an end surface at the left side in FIG. 23).

Each of the substrate 101 and the lower cladding layer 102 consists of InP doped with the n-type impurity. The quantum well layer 104 has at least one quantum well structure. The lower SCH layer 103, the quantum well layer 104, and the upper SCH layer 105 constitute a graded-index separate confinement heterostructure single quantum well (GRIN-SCH-SQW) active layer, when the quantum well layer 104 has one quantum well layer. The lower SCH layer 103, the quantum well layer 104, and the upper SCH layer 105 constitute a graded-index separate confinement heterostructure multi quantum well (GRIN-SCH-MQW) active layer, when the quantum well layer 104 has at least two quantum well layers. The GRIN-SCH structure is preferably a linear GRIN-SCH, and the lower SCH layer 103 and the upper SCH layer 105 have a film thickness of 30 to 40 nm respectively. Based on the GRIN-SCH structure, carriers are more efficiently confined in a layer direction, and it becomes possible to inject the carriers into the active layer more efficiently. The quantum well layer of the multi quantum well structure has five layers, and has compressive strain of one percent to the substrate. When a compensation structure employing a tensile strain structure is used for a barrier layer, it is possible to realize a semiconductor laser device that does not lose crystallinity against a larger strain in the quantum well layer. The wavelength of a laser beam emitted from the quantum well layer 104 is 1200 nm to 1600 nm. The intensity of the laser beam is not smaller than 80 mW, preferably 150 mW or above, and more preferably 250 mW or above. This makes it possible to use the semiconductor laser device according to the sixth embodiment as the pumping source of the optical fiber amplifier to be described later.

The first upper cladding layer 106, the second upper cladding layer 108, and the third upper cladding layer 110 function as upper cladding layers respectively. In the semiconductor laser device according to the sixth embodiment, each of the first upper cladding layer 106, the second upper cladding layer 108, and the third upper cladding layer 110 has InP of the p-type conduction type. The second upper cladding layer 108 also functions as a current passing layer as described above. The current passing layer is an area that passes an externally injected current to a layer direction. The injected current flows into the current passing layer of the active layer, that is, a lower area of the second upper cladding layer 108.

The diffraction grating 107 is made of GaInAsP having the p-type conduction type. As the diffraction grating 107 is structured using the semiconductor material different from that of the surrounding first upper cladding layer 106, this diffraction grating 107 reflects a portion having a predetermined wavelength out of the light generated from the quantum well layer 104. Functions of the diffraction grating 107 is explained in detail later.

The contact layer 111 realizes an ohmic contact between the third upper cladding layer 110 and the p-side electrode 112. The contact layer 111 is doped with high density p-type impurity, and realizes this ohmic contact.

The high reflection film 116 shown in FIG. 23 constitutes a resonator. Therefore, the high reflection film 116 has light reflectivity of not smaller than 80 percent, preferably 90 percent or above, and more preferably 98 percent or above. On the other hand, the low reflection film 115 prevents the laser beam from being reflected from the end surface at the emission side. Therefore, the low reflection film 115 has a film structure of low reflectivity of five percent or below, preferably one percent or below, or more preferably about 0.1 percent.

The current blocking layer 109 contracts the current injected from the p-side electrode 112, thereby to improve the carrier density in a horizontal direction in the quantum well layer 104. To prevent the current injected from the p-side electrode 112 from passing through the inside of the current blocking layer 109, the current blocking layer 109 has the n-type conduction type. As the current blocking layer 109 has the n-type conduction type, the lamination structure of the first upper cladding layer 106, the current blocking layer 109, and the third upper cladding layer 110 forms a pnp junction. Therefore, no current flows into the current blocking layer 109. In the first embodiment, the current blocking layer 109 has a film thickness of about 0.5 μm.

The current blocking layer 109 is made of InP having a higher doped n-type conduction type. In the sixth embodiment, the current blocking layer 109 uses InP as its material, like the second upper cladding layer 108. However, the density of the doped impurity of the current blocking layer 109 is higher than the density of the doped impurity of the second upper cladding layer 108. Therefore, there is a difference between the effective index of the current blocking layer 109 and the effective index of the upper cladding layer 108, for the emitted laser beam. It is preferable to control the impurity of the current blocking layer 109 such that a difference between the effective index of the area in which the current blocking layer 109 exists and the effective index of the area in which the second upper cladding layer 108 exists is not larger than 0.01, preferably not larger than $8 \times 10^{-3}$. It is preferable that the density of the impurity doped in the current blocking layer 109 is not smaller than $1.5 \times 10^{18}$ cm$^{-3}$ and not larger than $9 \times 10^{18}$ cm$^{-3}$, more preferably not smaller than $1.5 \times 10^{18}$ cm$^{-3}$ and not larger than $5 \times 10^{18}$ cm$^{-3}$.

The operation of the semiconductor laser device according to the sixth embodiment is explained. The semiconductor laser device according to the sixth embodiment has a function of confining the light in a horizontal direction based on a difference between the refractive indexes and a wavelength selection function based on the diffraction grating 107. First, the light confinement in a horizontal direction is explained.

In the semiconductor laser device according to the sixth embodiment, the light confinement is carried out based on the difference between the effective indexes. The laser beam emitted from the quantum well layer 104 has a certain spread in a layer direction. Therefore, in considering the confinement in a horizontal direction, it is necessary to consider refractive index distributions in a horizontal direction in the upper and lower areas of the lower SCH layer 103, the quantum well layer 104, and the upper SCH layer 105, as well as distributions in these layers. Particularly, as the first upper cladding layer 106 has a film thickness of about 0.1 μm, the current blocking layer 109 is located near the quantum well layer 104. Therefore, when the refractive index of the current blocking layer 109 is different from the refractive index of the second upper cladding layer 108 located at the same distance from the quantum well layer 104 as the distance between the current blocking layer 109 and the quantum well layer 104, this gives an influence to the light confinement in a horizontal direction.

It is known that the refractive index of a semiconductor layer changes depending on the size of the density of the doped impurity as well as the composition of the materials of the semiconductor layer. Therefore, even when the second upper cladding layer 108 and the current blocking layer 109 are made of the same structure, it is possible to confine the light in a horizontal direction by changing the impurity density. Specifically, when the impurity density increases, the refractive index is lowered due to the plasma effect of the carriers. Therefore, the refractive index of the current blocking layer 109 becomes lower than the refractive index of the second upper cladding layer 108. Consequently, the semiconductor laser device according to the sixth embodiment confines the light in a horizontal direction.

Figure 24:
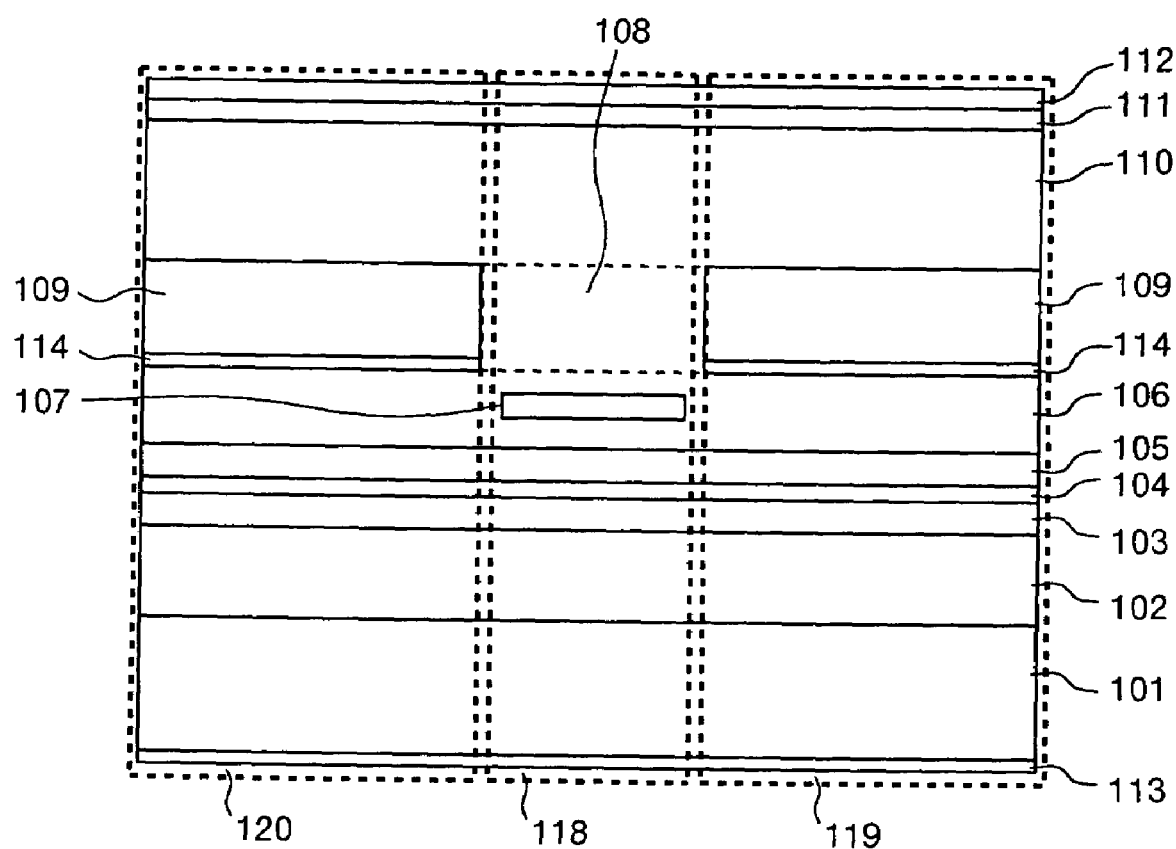
FIG. 24 explains about a light confinement in a horizontal direction of the semiconductor laser device according to the sixth embodiment.

As shown in FIG. 24, by dividing the cross section of the semiconductor laser device into three areas, it is possible to analyze light confinement in a horizontal direction in each area, through a comparison between the refractive indexes in these areas. The method of analyzing a waveguide mode based on the division of the cross section of the semiconductor laser device into three areas as shown in FIG. 24 is called the equivalent refractive index method. This is a method of evaluating the waveguide mode by equivalently substituting the light confinement in a horizontal direction into a planar waveguide having effective indexes of a first area 118 and second areas 119 and 120. It is known that based on this method, it is possible to analyze the waveguide mode in high precision, although as an approximation, when the waveguide has a larger spread in a horizontal direction than a thickness in a layer direction and also when the waveguide has a relatively mild change in the horizontal direction. The second area 119 and the second area 120 have the same structures, and therefore, these areas have the same effective indexes. In comparing the second area 119 and the second area 120 with the first area 118, these second areas 119 and 120 have the current blocking layer 109 on the same layer as the layer where the first area 118 has the second upper cladding layer 108, and the current blocking layer 109 has a lower refractive index than that of the second upper cladding layer 108. Consequently, the refractive indexes of the second areas 119 and 120 become lower than that of the first area 118.

Figure 25A:
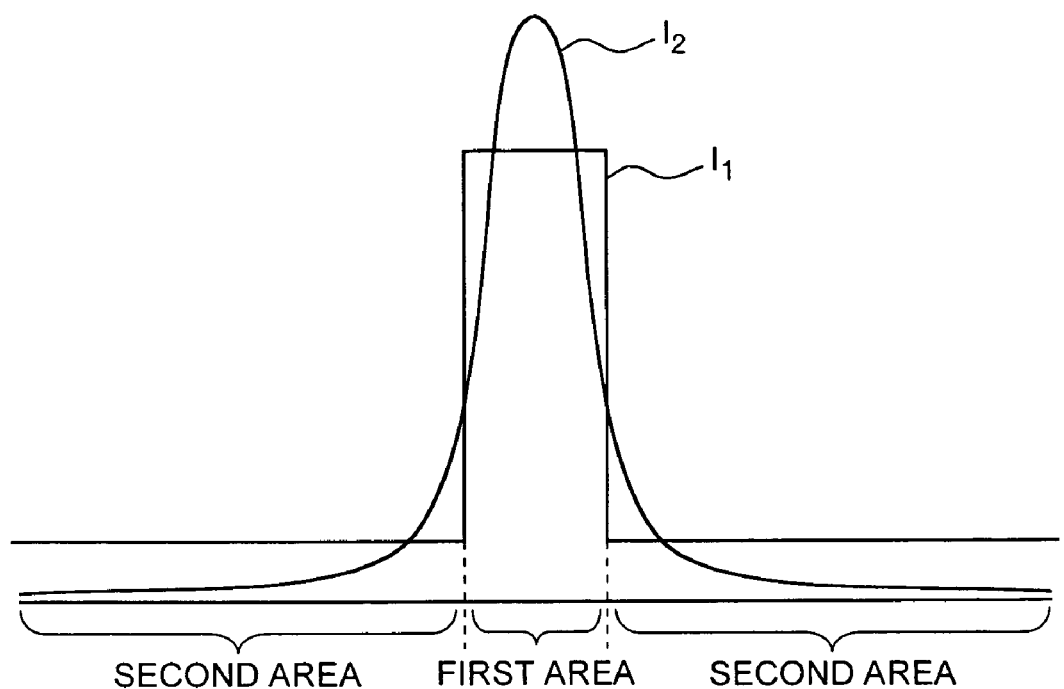
FIG. 25A is a graph that shows a light intensity distribution in a horizontal direction of the conventional semiconductor laser device.
Figure 25B:
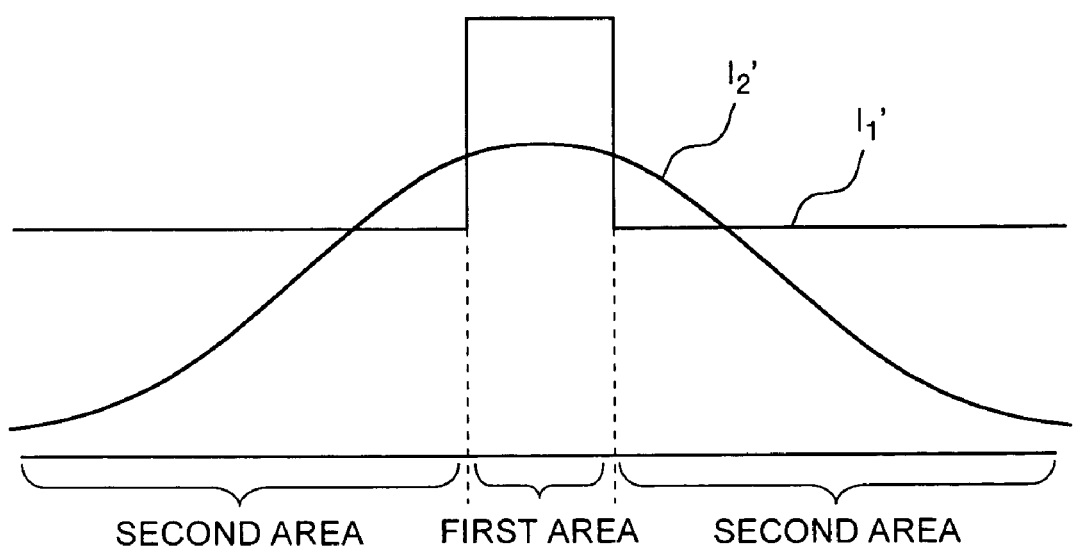
FIG. 25B is a graph that shows a light intensity distribution in a horizontal direction of the semiconductor laser device according to the sixth embodiment.

The light intensity distribution in a horizontal direction of the semiconductor laser device according to the sixth embodiment is explained below with reference to FIG. 25A and FIG. 25B. FIG. 25A shows a pattern of a light intensity distribution in a horizontal direction of the conventional BH laser. FIG. 25B shows a pattern of a light intensity distribution in a horizontal direction of the semiconductor laser device according to the sixth embodiment. A curve $1_1$ and a curve $1_1'$ show effective index distributions in a horizontal direction respectively. A curve $1_2$ and a curve $1_2'$ show light intensity distributions in a horizontal direction respectively.

As explained above, the light confinement in a horizontal direction occurs based on a difference between the effective indexes in a horizontal direction. The size of the light confinement is determined based on a difference between the effective index of the first area 118 and the effective indexes of the second areas 119 and 120. The only difference between the structure of the first area 118 and the structures of the second areas 119 and 120 is that the second upper cladding layer 108 is substituted by the current blocking layer 109 in the second areas 119 and 120. Therefore, the difference between the effective indexes is determined based on a position where the current blocking layer 109 is disposed, and a film thickness and a refractive index of the current blocking layer 109. In general, when the difference between the effective indexes is large, the light confinement in a horizontal direction becomes strong, and the width Wc by which the waveguide mode in a high-order horizontal direction is cut off becomes small. As a result, it becomes difficult to obtain a high output. On the other hand, when the difference between the effective indexes is small, the light confinement in a horizontal direction becomes weak, and the width Wc becomes large. As a result, it becomes possible to obtain a high output.

In the semiconductor laser device according to the sixth embodiment, the current blocking layer 109 is formed using InP as its material, like the surrounding cladding layers. Advantages obtained based on this is explained below.

In general, a forbidden bandwidth is determined based on the composition of the semiconductor layer, irrespective of the conduction type. Therefore, the forbidden bandwidth of the current blocking layer 109 and the forbidden bandwidth of the second upper cladding layer 108 become equal. In the semiconductor laser device according to the sixth embodiment, the quantum well layer 104 is composed of GaInAsP. The wavelength of an emitted laser beam is determined based on a quantum level of the quantum well layer 104. When the forbidden bandwidth of the current blocking layer 109 is smaller than the width of the energy of the emitted laser beam, the beam leaked out to the current blocking layer 109 is absorbed. In the sixth embodiment, as the current blocking layer 109 is made of InP, the quantum level is larger than the energy, and the beam is emitted to the outside without being absorbed. Therefore, it is possible to realize a semiconductor laser device that can obtain a high output. Further, it is not necessary to consider about the effect of the light confinement in a horizontal direction due to the light absorption. Consequently, in designing the structure of the semiconductor laser device, it is possible to realize weak confinement of the light, by changing only parameters of the density of the impurity of the current blocking layer 109, and the position and the film thickness of the current blocking layer 109.

Both the current blocking layer 109 and the second upper cladding layer 108 are made of InP that has a smaller thermal resistance than GaInAsP. Therefore, it is possible to efficiently diffuse heat generated due to the current injection. In general, the semiconductor laser device is fixed such that a laser mount and the p-side electrode 112 are in contact with each other, based on a junction down method. The generated heat is radiated mainly through the p-side electrode 112. As both the current blocking layer 109 and the second upper cladding layer 108 that become the heat-passing routes are made of materials having a small thermal resistance, it is possible to efficiently radiate the heat to the outside. When it is possible to efficiently radiate the heat, it is possible to restrict a rise in the temperature of the quantum well layer 104. Consequently, it is possible to restrict heat saturation that the optical output does not increase even when a large current is injected. Therefore, it is possible to provide a semiconductor laser device that can obtain a high output based on the provision of the function of efficiently radiating the heat.

It is not desirable to sacrifice other characteristics of the semiconductor laser device to weaken the light confinement in a horizontal direction, like the conventional BH laser. It is explained below that even when the semiconductor laser device according to the sixth embodiment takes a measure of weakening the light confinement in a horizontal direction, this does not lower the current contracting function of the current blocking layer 109 and does not affect the light confinement in a layer direction.

In the semiconductor laser device according to the sixth embodiment, the current blocking layer 109 is provided to achieve the current contracting function. As explained above, the current blocking layer 109 is doped with the n-type impurity, and the third upper cladding layer 110 and the first upper cladding layer 106 are doped with the p-type impurity, and these three layers form the pnp junction. To change the refractive index of the current blocking layer 109, the density of the impurity is changed. However, so long as the dopant of the same conduction type is used, the conduction type of the current blocking layer 109 is not changed. Based on the existence of the pnp junction, the current injected from the p-side electrode 112 does not flow into the current blocking layer 109, but passes through only the second upper cladding layer 108, and reaches the quantum well layer 104.

To control the current contracting function, the film thickness and the impurity density of the current blocking layer 109 and the first and third upper cladding layers 106 and 110 respectively are controlled. On the other hand, to control the light confinement in a horizontal direction, according to the sixth embodiment, the three parameters are mainly controlled, i.e., the film thickness and the impurity density of the current blocking layer 109, and the film thickness of the first upper cladding layer 106. There are many controllable parameters. Therefore, the parameters for the current contracting function are determined first, and the parameters for the light confinement control are determined next. Based on this, it is possible to control the parameters relatively easily and without losing the current contracting function. As a result, so long as the pnp junction exists, the current blocking layer 109 can narrow the injection current. The current does not flow into the current blocking layer 109 when the position and the film thickness of the current blocking layer 109 are changed.

When the first upper cladding layer 106 is omitted, and when the current blocking layer 109 and the second upper cladding layer 108 are brought into contact with the upper SCH layer 105, the pnp junction in a layer direction is not established in the area where the current blocking layer 109 is disposed. Consequently, the current blocking layer 109 cannot narrow the current. However, when the third upper cladding layer 110 is omitted, an np junction is established in a layer direction between the current blocking layer 109 and the first upper cladding layer 106. In the semiconductor laser device according to the sixth embodiment, the p-side electrode 112 is an anode. Therefore, a reverse bias is applied to the np junction, and no current flows into the current blocking layer 109. Consequently, although it is not possible to omit the first upper cladding layer 106, it is possible to omit the third upper cladding layer 110.

The influences given to the light confinement in a layer direction when the position, the film thickness, and the refractive index of the current blocking layer 109 are changed is explained. The current blocking layer 109 is disposed above the quantum well layer 104 that generates a beam. Therefore, when the structure of the current blocking layer 109 is changed, this gives an influence to the light confinement in a layer direction. However, it is known that according to the equivalent refractive index method, it is possible to carry out a high-precision analysis when the waveguide has a larger size in a horizontal direction than the size in a layer direction and also when the waveguide has a relatively mild change in the horizontal direction. Therefore, so long as the waveguide mode is considered following the equivalent refractive index method, it is possible to approximate that the current blocking layer 109 gives little influence to the refractive index of the first layer, and there is little change in the light confinement in a layer direction.

From the above explanation, it is clear that when the position, the film thickness, and the refractive index of the current blocking layer 109 are optimized to reduce the light confinement in a horizontal direction, these changes do not affect other characteristics of the semiconductor laser device. Therefore, the semiconductor laser device according to the present invention has a feature that it is possible to design the light confinement in a horizontal direction independent of the light confinement in a layer direction. Consequently, it is possible to achieve the performance of the device to a maximum extent based on the use of a layer structure suitable for high output operation.

The function of the diffraction grating 107 to select an oscillation longitudinal mode is explained. In the sixth embodiment, while the diffraction grating 107 may select one oscillation longitudinal mode, it is assumed that the diffraction grating 107 selects a plurality of oscillation longitudinal modes in the following explanation. Advantages obtained when the diffraction grating 107 selects a plurality of oscillation longitudinal modes will also be explained.

The diffraction grating 107 has a film thickness of 20 nm, and has a length Lg of 50 μm from the reflection end surface of the low reflection film 115 toward the high reflection film 116. This diffraction grating 104 is cyclically formed at a pitch of about 220 nm over this length Lg, and selects a wavelength of a laser beam having a center wavelength of 1.48 μm. The diffraction grating 107 has a setting of a product of a coupling coefficient κ of the diffraction grating and the length Lg of the diffraction grating as not larger than 0.3. Based on this, the diffraction grating 107 makes satisfactory the linearity of the driving current-light output characteristics and increases the stability of the light output (refer to Japanese Patent Application No. 2001-134545). When a resonator length L is 1300 μm, the device oscillates in a plurality of oscillation longitudinal modes when the diffraction grating length Lg is not larger about 300 μm. Therefore, it is desirable that the diffraction grating length Lg is not larger about 300 μm. An interval of the oscillation longitudinal modes changes in proportion to the size of the resonator length L. Therefore, the diffraction grating length Lg is proportional to the resonator length L. In other words, the relationship of (the diffraction grating length Lg) to (the resonator length L) is equal to 300 to 1300 is maintained. Consequently, this relationship can be expanded as follows, to obtain a plurality of oscillation longitudinal modes when the diffraction grating length Lg is not larger than 300 μm.

$$Lg \times (1300 \ (\mu m)/L) \leq 300 \ (\mu m)$$

In other words, the diffraction grating length Lg is set to keep the ratio with the resonator length L, and is set to not larger than 300/1300 times the resonator length L (refer to the Japanese Patent Application No. 2001-134545).

In general, it is possible to express a mode interval Δλ of a longitudinal mode generated by the resonator of the semiconductor laser device, as follows, where n represents an effective index.

$$\Delta\lambda = \lambda_0^2/(2*n*L)$$

Assume that the lasing wavelength $\lambda_0^2$ is 1480 μm, and that the effective index n is 3.5. When the resonator length L is 800 μm, the mode interval Δλ of a longitudinal mode becomes approximately 0.39 nm. When the resonator length L is 3200 μm, the mode interval Δλ of a longitudinal mode becomes approximately 0.1 nm. In other words, when the resonator length L is set longer, the mode interval Δλ of a longitudinal mode becomes smaller, and a selection condition to oscillate a laser beam of a single oscillation longitudinal mode becomes severer.

On the other hand, the diffraction grating 107 selects a longitudinal mode based on its Bragg wavelength. Wavelength selection characteristics of the diffraction grating 107 are expressed as a lasing wavelength spectrum 121 shown in FIG. 26.

Figure 26:
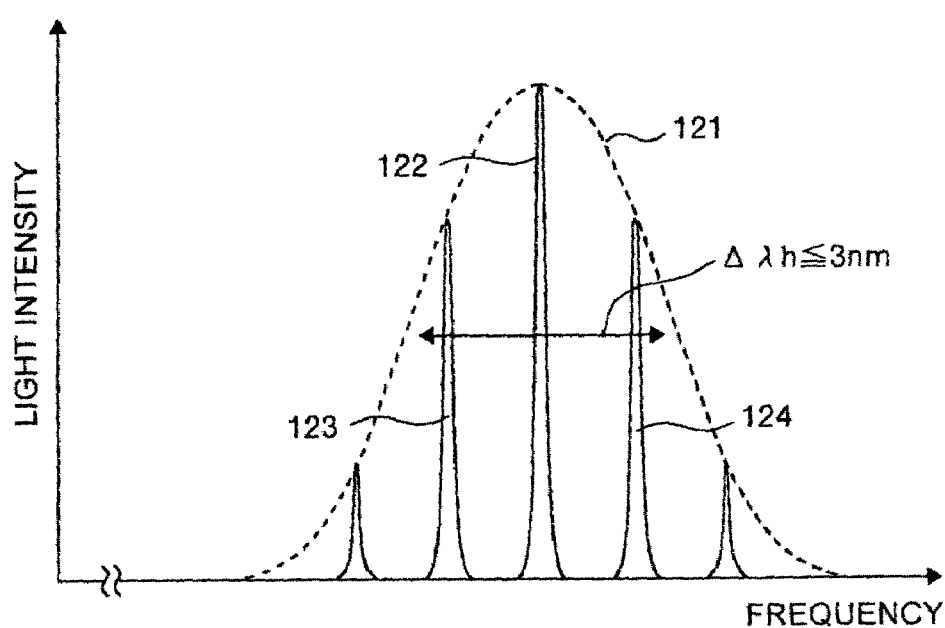
FIG. 26 is a pattern graph that shows a waveform of a laser beam emitted from the semiconductor laser device that has a diffraction grating according to the sixth embodiment.

As shown in FIG. 26, according to the sixth embodiment, a plurality of longitudinal modes exist within the wavelength selection characteristics shown by a half width $\Delta\lambda h$ of the lasing wavelength spectrum 121 of the semiconductor laser device having the diffraction grating 107. According to the conventional distributed Bragg reflector (DBR) semiconductor laser device or the conventional distributed feedback (DFB) semiconductor laser device, it is difficult to carry out the oscillation of a single oscillation longitudinal mode when the resonator length L is not smaller than 800 µm. Therefore, a semiconductor laser device having this resonator length L has not been used. However, the semiconductor laser device according to the sixth embodiment positively sets the resonator length L to 800 µm or above, thereby to carry out a laser output by including a plurality of longitudinal modes within the half width $\Delta\lambda h$ of the lasing wavelength spectrum 121. In FIG. 26, three oscillation longitudinal modes 122 to 124 exist within the half width $\Delta\lambda h$ of the lasing wavelength spectrum 121.

Figure 27A:
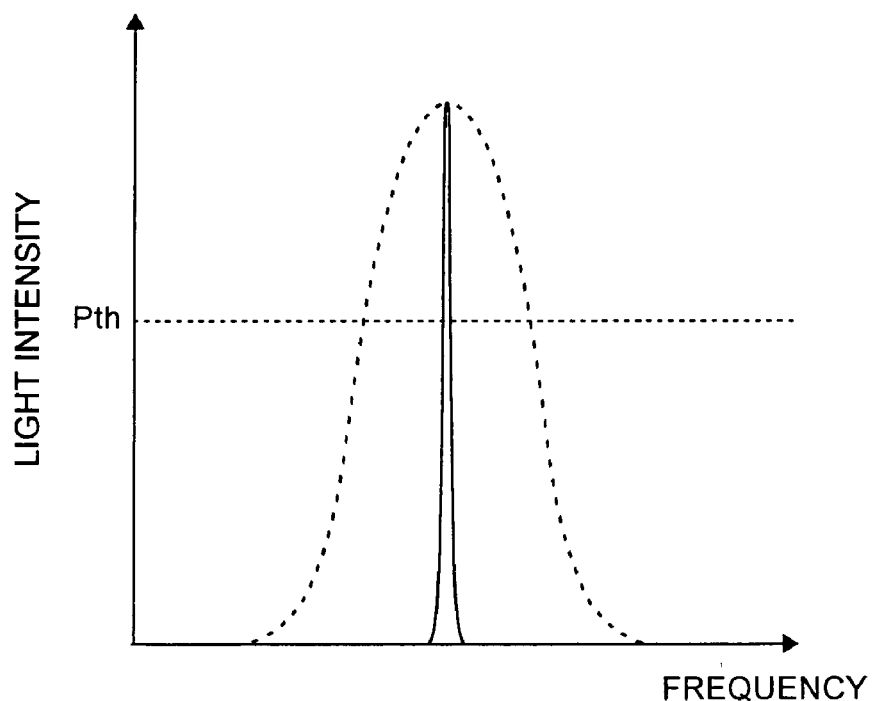
FIG. 27A is a pattern graph that shows a waveform of a laser beam emitted from a conventional semiconductor laser device that has a single oscillation longitudinal mode.

When a laser beam having a plurality of oscillation longitudinal modes is used, it is possible to obtain a higher laser output in the whole lasing wavelength spectrum, while restricting a peak value of the laser output in each oscillation longitudinal mode than when a single longitudinal mode laser beam is used. For example, the semiconductor laser device according to the sixth embodiment can obtain a high laser output at a low peak value in a profile shown in FIG. 27B. On the other hand, a semiconductor laser device of a single longitudinal mode oscillation obtains the same laser output at a high peak value in a profile shown in FIG. 27A.

Figure 27B:
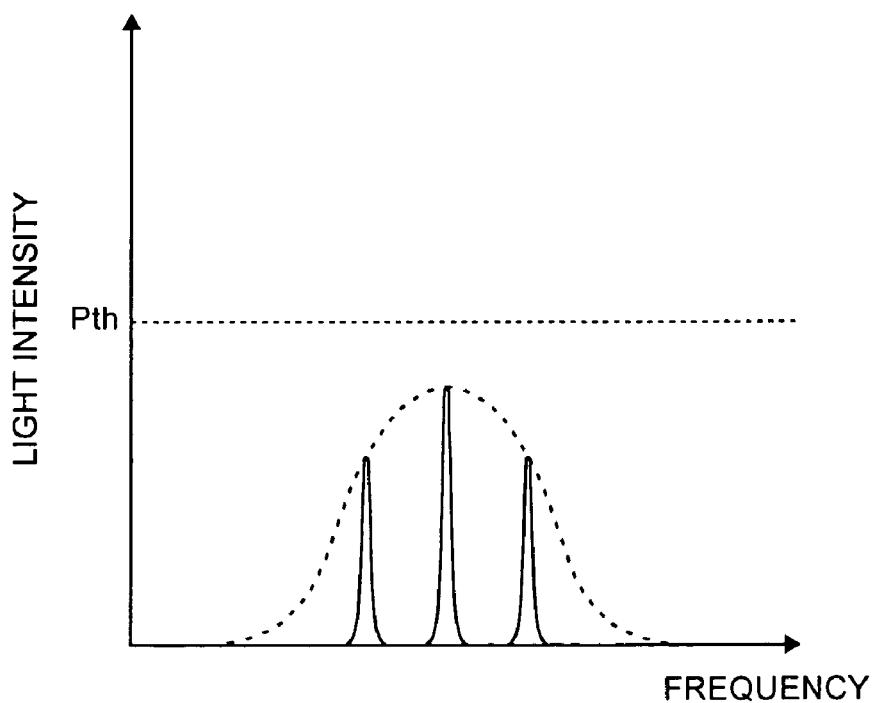
FIG. 27B is a pattern graph that shows a waveform of a laser beam emitted from the semiconductor laser device according to the sixth embodiment.

When the semiconductor laser device is used for a pumping source of a Raman amplifier, it is preferable to increase the pumping light output power to increase the Raman gain. However, when the peak value is high, induced Brillouin scattering occurs, and noise increases. When the induced Brillouin scattering occurs, the induced Brillouin scattering has a threshold value Pth. In obtaining the same laser output power, it is possible to obtain high pumping light output power within the threshold value Pth of the induced Brillouin scattering, when a laser beam has a plurality of oscillation longitudinal modes and when the peak value is restricted, as shown in FIG. 27B. As a result, it is possible to obtain high Raman gain.

The wavelength interval (i.e., the mode interval) $\Delta\lambda$ between the oscillation longitudinal modes 122 and 124 is set to 0.1 nm or above. This is because when the semiconductor laser device is used for the pumping source of the Raman amplifier, it is possible to restrict the induced Brillouin scattering when the mode interval $\Delta\lambda$ is not smaller than 0.1 nm. Consequently, it is preferable to set the resonator length to not larger than 3200 µm, based on the above expression of the mode interval $\Delta\lambda$.

A method of manufacturing the semiconductor laser device according to the sixth embodiment is explained with reference to FIGS. 28A to 28C and FIGS. 29A to 29C. FIGS. 28A to 28C and FIGS. 29A to 29C show a process of manufacturing the semiconductor laser device according to the sixth embodiment.

The lower cladding layer 102, the lower SCH layer 103, the quantum well layer 104, the upper SCH layer 105, the first upper cladding layer 106, and a p-type GaInAsP layer are laminated sequentially on the substrate 101. These layers are laminated according to the metal organic chemical vapor deposition (MOCVD) method. It is also possible to laminate these layers according to the chemical vapor deposition (CVD) method, the molecular beam epitaxy (MBE) method, or other method.

Figure 28A:
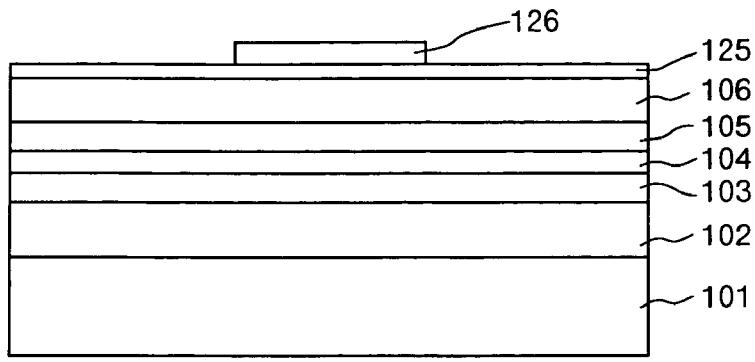
FIG. 28A to FIG. 28C show a process of manufacturing the semiconductor laser device according to the sixth embodiment.

As shown in FIG. 28A, a mask pattern 126 to form the diffraction grating 107 is formed on a p-type GaInAsP layer 125. Specifically, the mask pattern 126 is formed based on the electron beam (EB) exposure using the photolithography. It is preferable to use a negative resist for a resist that constitutes the mask pattern 126. When the negative resist is used, it is sufficient to expose the EB to only the area that forms the mask pattern 126. Therefore, it is possible to substantially reduce the time required to carry out the exposure as compared with when the EB is exposed on the whole resist surface by using a positive resist.

Figure 28B:
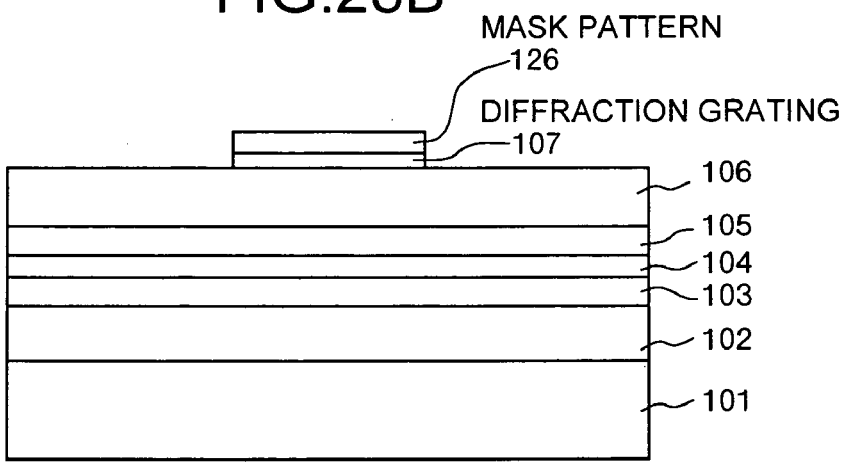
Figure 28C:
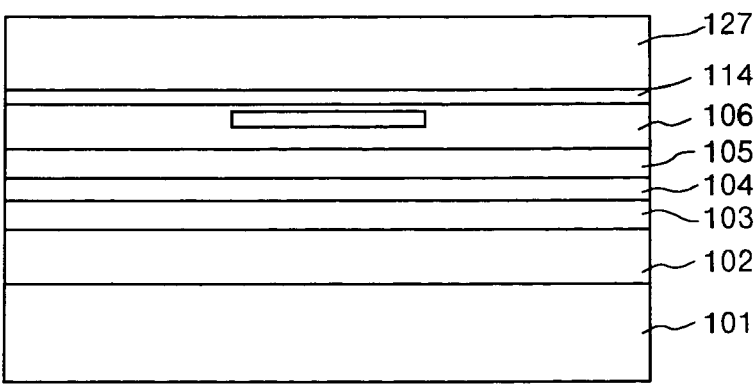

Thereafter, as shown in FIG. 28B, the surplus portion of the p-type GaInAsP layer is removed by etching, thereby to form the diffraction grating 107. After forming the diffraction grating 107, the mask pattern 126 is removed. Then, the rest portion of the first upper cladding layer 106, an etching stop layer 114, and an n-type P layer 127 are laminated sequentially, thereby to form a semiconductor thin film structure as shown in FIG. 28C.

Figure 29A:
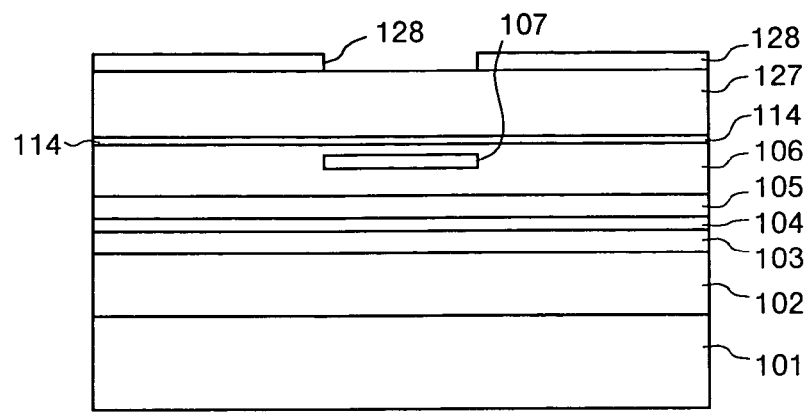
FIG. 29A to FIG. 29C show a process of manufacturing the semiconductor laser device according to the sixth embodiment.
Figure 29B:
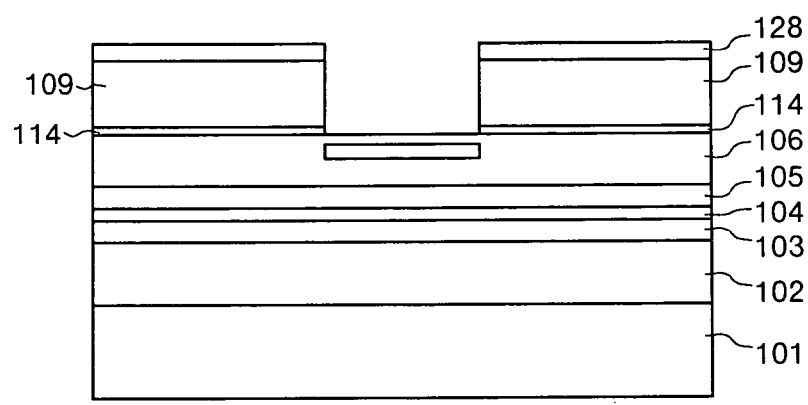

As shown in FIG. 29B, an SiNx mask pattern 128 having an opening is formed in the area where the second upper cladding layer 108 is scheduled to be formed. Specifically, first, an SiNx film having a thickness of about 100 to 200 nm is formed on the whole surface of the n-type InP layer 127 according to the plasma CVD method or the like. A resist is coated on the whole surface of the SiNx film according to the spin coating. After coating the resist, a resist pattern having a desired opening is formed according to the photolithography. After forming the resist pattern, the SiNx exposed to the opening is etched with a reactive ion etching (RIE) device. After etching the SiNx film, an organic solvent cleaning, and an oxygen plasma ashing are carried out, thereby to remove the resist. As a result, the SiNx mask pattern 128 having the opening is obtained.

Figure 29C:
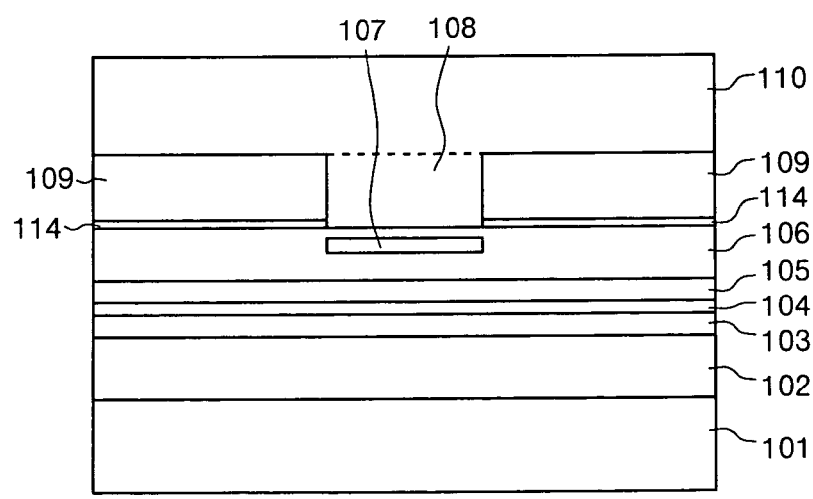

Thereafter, the n-type InP layer 127 is etched, by using the SiNx mask pattern 128 as a mask, according to a chemical etching method. It is also possible to dry etch the n-type InP layer 127 with the RIE device or according to other method. In the sixth embodiment, the chemical etching is carried out by using an etchant having a selectivity for InP. The etching stop layer 114 is made of GaInAsP having a thickness of about 5 nm, and a band gap composition component of about 1.1 µm. Therefore, in the present process, the etching stop layer 114 is not etched, and thus, the first upper cladding layer 106 located beneath this layer is not etched. Thereafter, it is preferable that an etchant having a selectivity for GaInAsP or an etchant having no selectivity for GaInAsP is used based on time control, thereby to remove the etching stop layer 114 that remains in the area where the second upper cladding layer 108 is scheduled to be formed. As a result, the current blocking layer 109 is formed, and a void in which the second upper cladding layer 108 is to be laminated are formed, as shown in FIG. 29B. In the subsequent step, the SiNx mask pattern 128 is removed to laminate semiconductor layers on the first upper cladding layer 106 and the current blocking layer 109. At the same time, the surfaces of the first upper cladding layer 106 and the current blocking layer 109 are cleaned. While the SiNx is used for the mask pattern in the process, it is also possible to use the resist for the mask.

p-type InP layers are laminated on the first upper cladding layer 106 and the current blocking layer 109. As shown in FIG. 29C, at this step, the second upper cladding layer 108 is formed in the area sandwiched between the current blocking layers 109, and the third upper cladding layer 110 is formed on the second upper cladding layer 108 and the current blocking layer 109.

Thereafter, the contact layer 111 is laminated on the third upper cladding layer 110. The p-side electrode 112 and the n-side electrode 113 are formed respectively, by depositing a metal layer based on the vapor deposition method or the sputtering method. Before forming the n-side electrode 113, the rear surface of the substrate is ground to adjust the thickness of the device. Based on the process, it is possible to manufacture the semiconductor laser device according to the sixth embodiment.

In the manufacturing process shown in FIGS. 28A to 28C and FIGS. 29A to 29C, the alignment in a horizontal direction of the current passing layer (i.e., the second upper cladding layer 108) and the diffraction grating 107 is determined based on the precision of the photolithography. Therefore, it is generally difficult to accurately make the position of the current passing layer coincide with the position of the diffraction grating 107. Consequently, it is preferable that the diffraction grating 107 is set in advance to have a larger width in a horizontal direction than the width of the current passing layer.

Figure 30A:
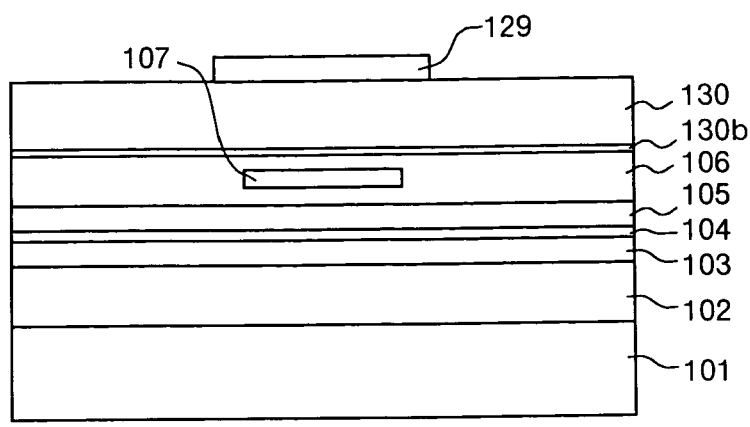
FIG. 30A to FIG. 30C show a part of the process of another method of manufacturing the semiconductor laser device according to the sixth embodiment.
Figure 30B:
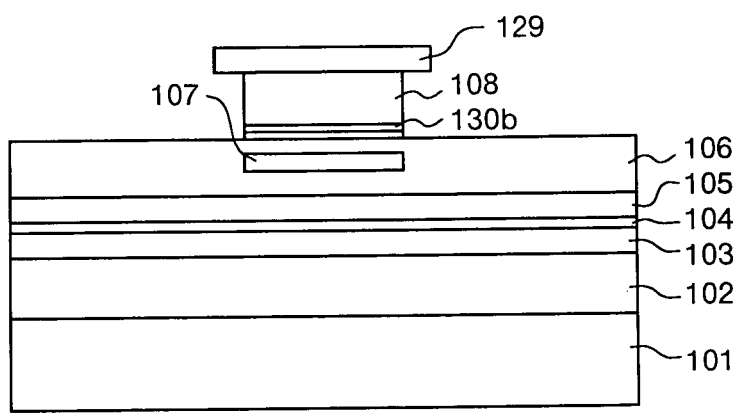
Figure 30C:
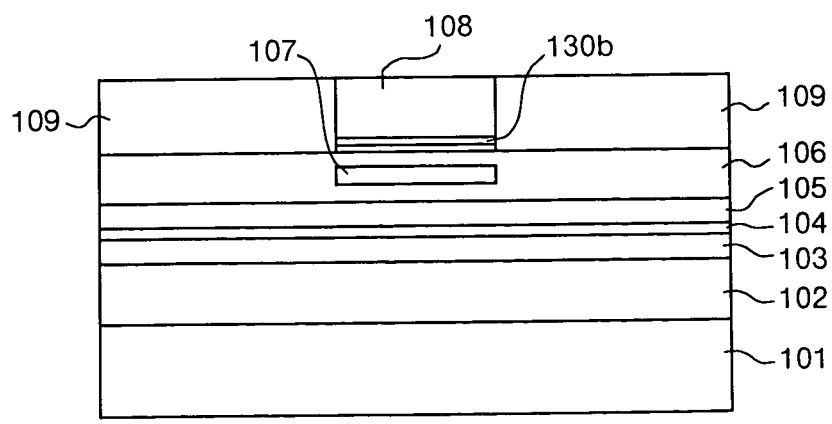

It is also possible to form the current blocking layer 109 and the second upper cladding layer 108 as follows. FIG. 30A to FIG. 30C show a part of the process of another method of manufacturing the semiconductor laser device according to the sixth embodiment. The layers up to the first upper cladding layer 106 are laminated in a similar manner to that of the manufacturing process. Then, an etching stop layer 130b, and a p-type InP layer 130 are laminated. Thereafter, as shown in FIG. 30A, an SiNx mask pattern 129 having an opening is formed in the area where the current blocking layer 109 is scheduled to be formed, on the p-type InP layer 130, and the p-type InP layer 130 is etched. Based on this, as shown in FIG. 30B, the p-type InP layer 130 is formed in a mesa pattern, and the second upper cladding layer 108 is formed. Because of the existence of the etching stop layer 130b, the first upper cladding layer 106 located below the p-type InP layer 130 is not etched. Following the removal of the etching stop layer 130b carried out after processing the p-type InP layer 130, a part of the upper end area of the first upper cladding layer 106 is removed.

Thereafter, the current blocking layer is laminated on the first upper cladding layer 106, and the remaining SiNx mask pattern 129 is removed, thereby to obtain a structure as shown in FIG. 30C. Thereafter, the third upper cladding layer 110, the contact layer 111, the p-side electrode 112, and the n-side electrode 113 are formed sequentially, and the semiconductor laser device according to the sixth embodiment is obtained.

Figure 31:
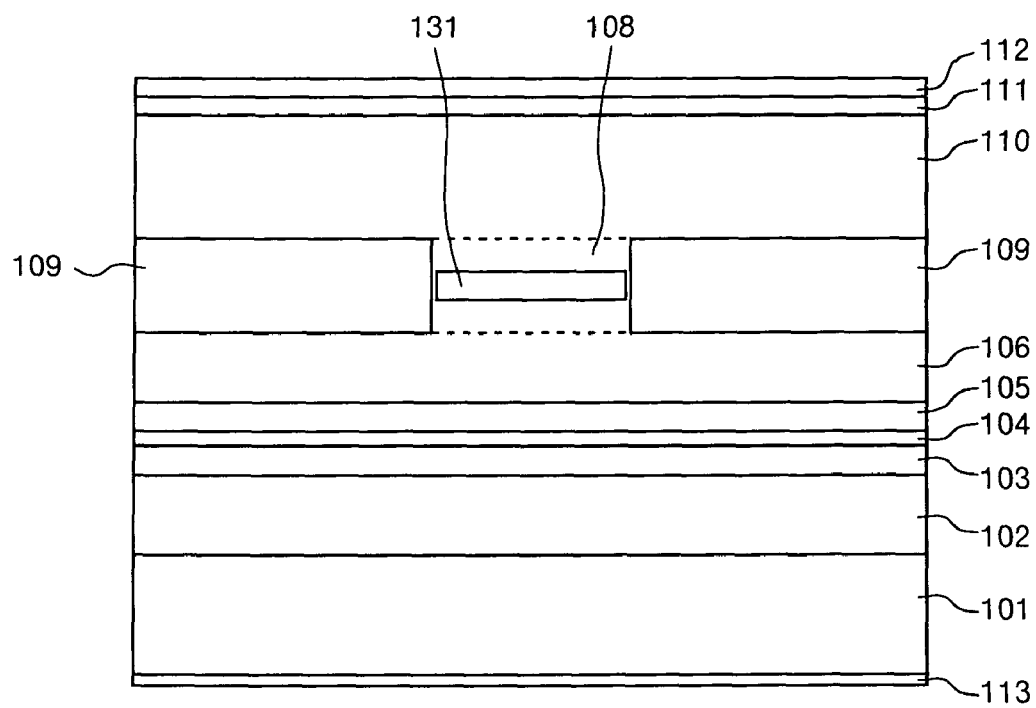
FIG. 31 is a front view of a structure of a modification of the optical fiber amplifier according to the sixth embodiment.

In the sixth embodiment, it is possible to employ any one of the manufacturing process shown in FIGS. 28A to 28C and FIGS. 29A to 29C, and the manufacturing process shown in FIGS. 30A to 30C. However, when the layout of the diffraction grating is changed as described later, it is preferable to select one manufacturing process that is suitable for this structure. For example, when the semiconductor laser device has a structure as shown in FIG. 31, it is preferable to use the manufacturing process shown in FIGS. 30A to 30C. The semiconductor laser device shown in FIG. 31 has a structure that a diffraction grating 131 is disposed within the second upper cladding layer 108. Therefore, the diffraction grating 131 is formed in advance to have a larger width than the width in a horizontal direction of the second upper cladding layer 108. Thereafter, a surplus portion of the diffraction grating 131 is removed at the time of forming the second upper cladding layer 108. Based on this, it is possible to accurately control the position of the diffraction grating 131 regardless of the precision of the photolithography.

In addition to this, there is a method of forming the upper cladding layer 109 based on an ion injection. In this case, when the impurity density of the current blocking layer 109 is changed in a horizontal direction, it is possible to give a refractive index distribution in a horizontal direction that is suitable to confine the light in a horizontal direction. When the impurity is doped based on the ion injection, it is possible to easily change the impurity density in a horizontal direction, by changing the masking pattern and injecting the ion by a few times. Based on this, the portion of the current blocking layer 109 near the boundary with the second upper cladding layer 108 may have the same impurity as that of the second upper cladding layer 108. This makes it possible to provide a low refractive index area, by doping the impurity of high density into the vicinity of the side surface of the current blocking layer 109 in the light emission direction. It is also possible to continuously increase the impurity density toward the end portion.

When the ion injection method is used, it is possible to omit the etching process, and it is also possible to continuously make growth in the vacuum atmosphere to the contact layer 111. Therefore, it is possible to simplify the manufacturing process. At the same time, it is also possible to extremely restrict the crystal surface from being exposed to the atmosphere in the process of laminating the layers. As a result, it is possible to prevent the adhesion of impurities, and it is possible to obtain a crystal of good quality.

While the semiconductor laser device according to the sixth embodiment is explained above, the structure of the semiconductor laser device according to the present invention is not limited to those described above. It is also possible to form the current blocking layer 109 with other materials, thereby to obtain the effects. For example, it is possible to form the current blocking layer 109 with $Ga_x In_{1-x} As_y P_{1-y}$, ($0 < x \leq 1$, $0 < y \leq 1$).

It is also possible to form the current blocking layer 109 with a semiconductor insulation layer. In this case, it is possible to form the current blocking layer 109 by doping iron as an impurity into InP. It is also possible to form the current blocking layer 109 with AlOx formed by selectively oxidizing a material that includes aluminum such as AlInAs.

It is also possible to dispose the current blocking layer not in the upper cladding layer but in the lower cladding layer 102 disposed below the quantum well layer 104. It is also possible to provide the current blocking layer both in the upper cladding layer and in the lower cladding layer 102. Based on these structures, it is also possible to control the light confinement in a horizontal direction, and it is possible to realize a semiconductor laser device that obtains a high output.

The conduction type of each layer that constitutes the semiconductor laser device according to the sixth embodiment may be opposite to that explained above. In other words, the substrate 101, the lower cladding layer 102, and the current blocking layer 109 may be p-type semiconductor materials, and the first upper cladding layer 106, the second upper cladding layer 108, the third upper cladding layer 110, and the contact layer 111 may be n-type semiconductor materials.

It is not always necessary to dispose the second upper cladding layer 108 at the center. It is also possible to realize a semiconductor laser device that achieves a weak confinement of light in a horizontal direction, even when the second upper cladding layer 108 is disposed in an area moved from the center. However, from the viewpoint of symmetry of the emitted laser beam, it is preferable that the second upper cladding layer 108 is disposed at the center, and the current blocking layer 109 is disposed at positions symmetrical with the center.

The first upper cladding layer 106, the second upper cladding layer 108, and the third upper cladding layer 110 may be formed to have mutually different refractive indexes relative to the emission wavelength. For example, to control the light confinement in a layer direction, it is possible to select materials of the respective cladding layers such that the refractive indexes become gradually smaller in the order of the first upper cladding layer 106, the second upper cladding layer 108, and the third upper cladding layer 110. When the refractive indexes of the respective cladding layers are changed, it is possible to control the light confinement in a horizontal direction based on the current blocking layer 109.

While it is desirable to dispose the diffraction grating 107 near the low reflection film 115 as shown in FIG. 23, it is also possible to dispose the diffraction grating 107 near the high reflection film 116. It is also possible to dispose the diffraction grating 107 on the whole surface in the light emission direction. In the area where the light distributes at the time of the laser oscillation, it is possible to select a light having a plurality of oscillation longitudinal modes by optimizing the reflectivities of the low reflection film 115 and the high reflection film 116. When the diffraction grating 107 is disposed at a position moved in the light emission direction, the effective indexes of the second areas 119 and 120 shown in FIG. 24 make no change. Therefore, this does not affect the light confinement in a horizontal direction.

Figure 32:
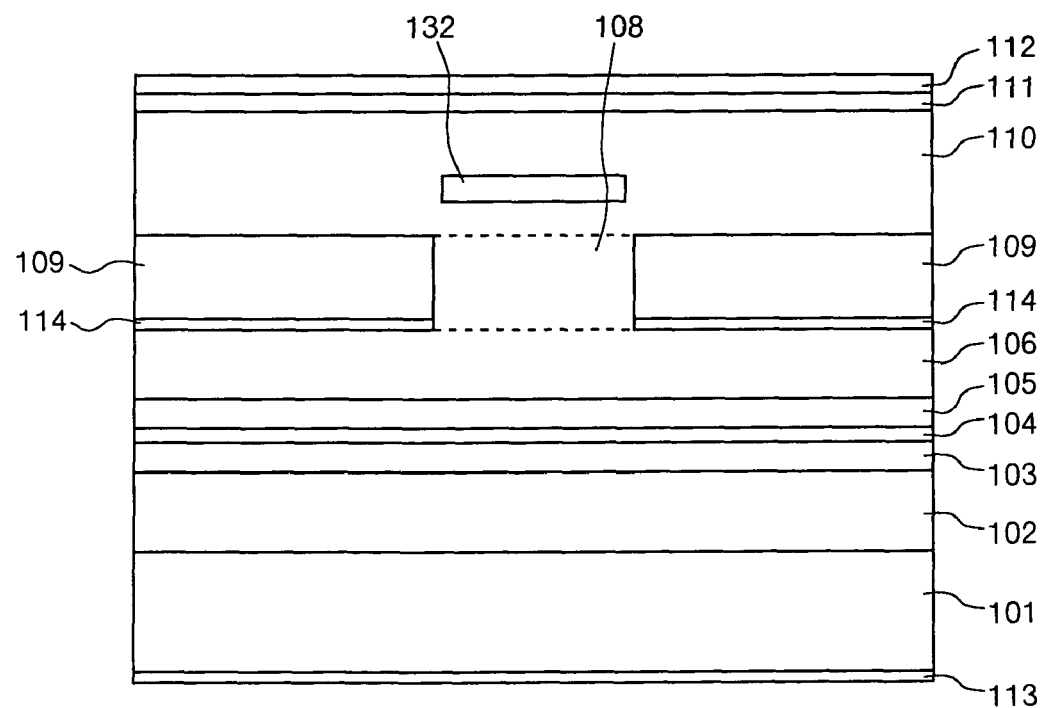
FIG. 32 is a front view of a structure of another modification of the optical fiber amplifier according to the sixth embodiment.
Figure 33:
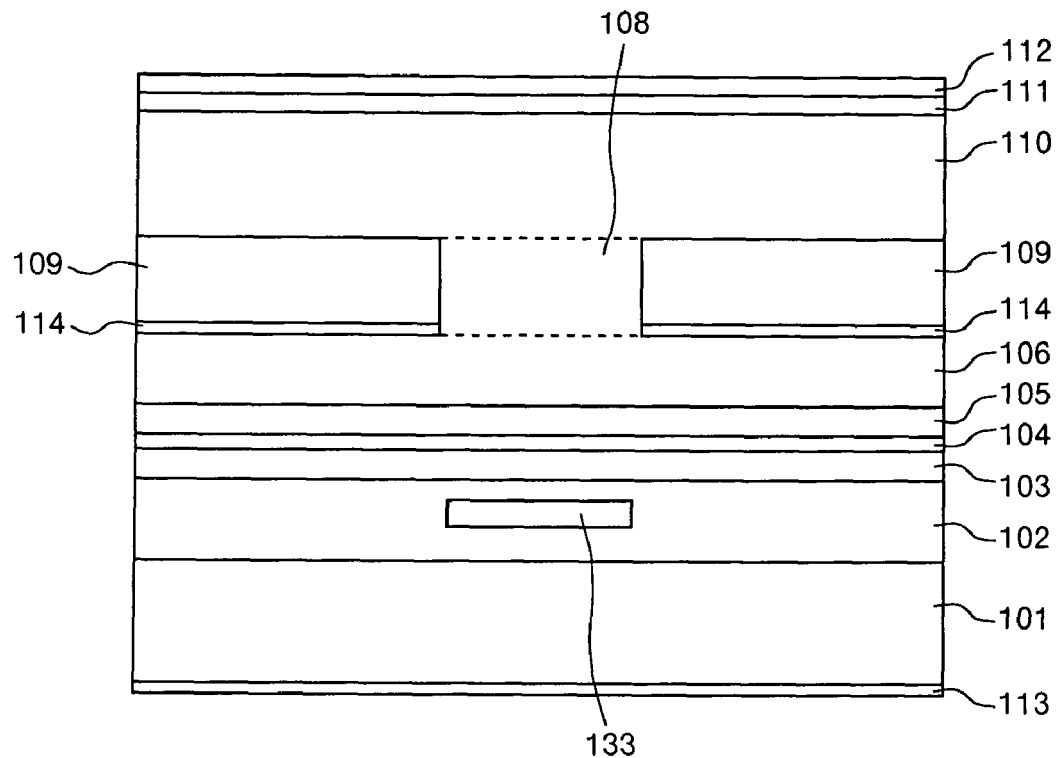
FIG. 33 is a front view of a structure of still another modification of the optical fiber amplifier according to the sixth embodiment.
Figure 34:
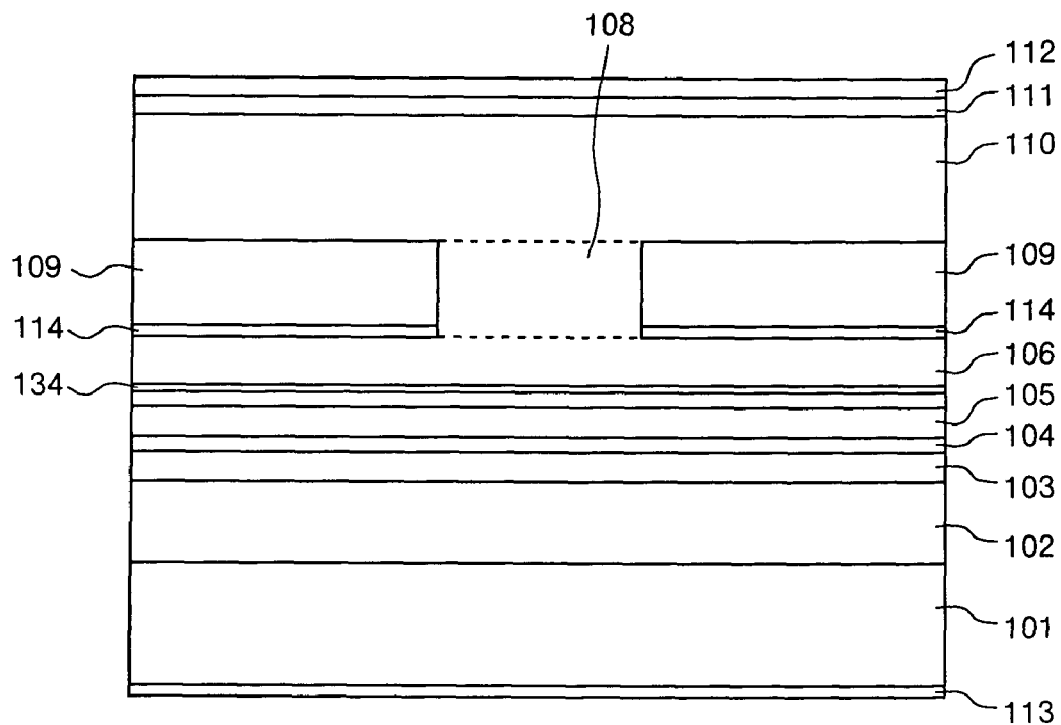
FIG. 34 is a front view of a structure of still another modification of the optical fiber amplifier according to the sixth embodiment.

It is also possible to dispose the diffraction grating 107 at a position different in a layer direction from the position shown in FIG. 22. Specifically, it is possible to dispose the diffraction grating 131 within the second upper cladding layer 108 as shown in FIG. 31, and it is possible to dispose the diffraction grating 131 in the third upper cladding layer 110 as shown in FIG. 32. Further, it is also possible to dispose the diffraction grating 131 in the lower cladding layer 102 below the quantum well layer 104 as shown in FIG. 33, instead of disposing the diffraction grating 131 above the quantum well layer 104. It is possible to select a light having a plurality of oscillation longitudinal modes, when the diffraction grating is disposed in the area where the light is distributed at the emission time of the laser beam, as shown in FIG. 31 to FIG. 33.

It is possible to dispose a diffraction grating 134 on the whole surface in a horizontal direction, instead of providing the diffraction grating 107 on only a part of the surface. In this case, at the time of manufacturing the semiconductor laser device, it is preferable to use the two-beam interference exposure method instead of the EB exposure method, to reduce the time required to form the diffraction grating.

Figure 35:
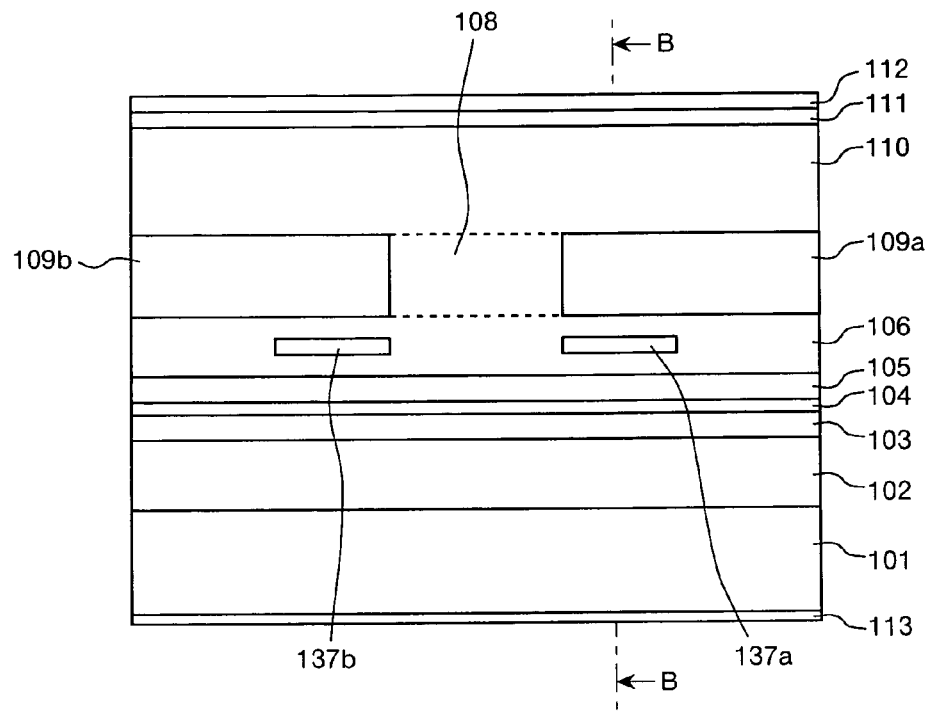
FIG. 35 is a front view of a structure of a semiconductor laser device according to a seventh embodiment of the present invention.
Figure 36:
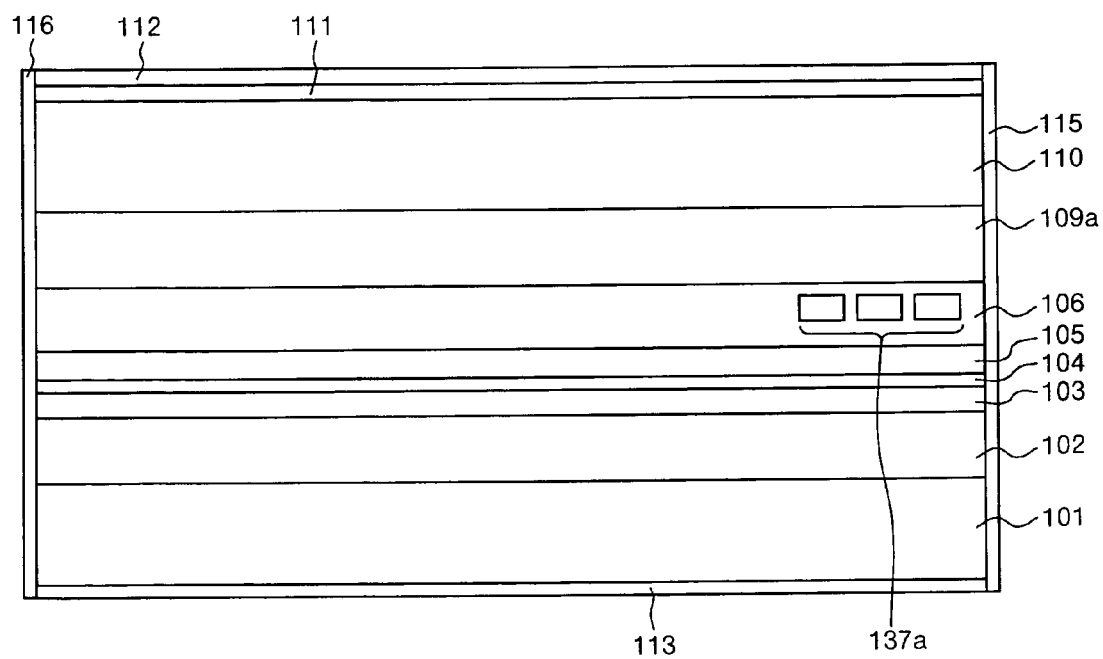
FIG. 36 is a cross-sectional view of the structure of the semiconductor laser device cut along a line B—B in FIG. 35.

A semiconductor laser device according to a seventh embodiment of the present invention is explained. FIG. 35 is a front view of the semiconductor laser device according to the seventh embodiment. FIG. 36 is a cross-sectional view of the semiconductor laser device cut along a line B—B in FIG. 35. The semiconductor laser device according to the seventh embodiment has diffraction gratings disposed in areas where there is a weak distribution of light at the laser beam emission time, i.e., in the areas corresponding to the second areas 119 and 120 shown in FIG. 24.

The semiconductor laser device according to the seventh embodiment has the lower cladding layer 102, the lower SCH layer 103, the quantum well layer 104, the upper SCH layer 105, and the first upper cladding layer 106 sequentially laminated on the substrate 101. The striped-pattern second upper cladding layer 108 that has a longitudinal direction in a laser beam emission direction and that functions as a current passing layer is laminated on a part of the area of the first upper cladding layer 106. Current block layers 109a and 109b are laminated in the area where the second upper cladding layer 108 is not laminated, on the first upper cladding layer 106. The third upper cladding layer 110 and the contact layer 111 are laminated sequentially on the second upper cladding layer 108 and the current blocking layers 109a and 109b respectively. The p-side electrode 112 is disposed on the contact layer 111. The n-side electrode 113 is disposed on the rear surface of the substrate 101. A diffraction grating 137a is disposed in an area beneath the current blocking layer 109a, and a diffraction grating 137b is disposed in an area beneath the current blocking layer 109b, within the first upper cladding layer 106 respectively.

It is preferable that the diffraction gratings 137a and 137b are disposed at mutually symmetrical positions relative to the center axis in a layer direction, and that these diffraction gratings 137a and 137b have mutually the same lengths and widths in a horizontal directions respectively. This is because when the current blocking layers 109a and 109b control the light confinement in a horizontal direction, it is preferable that the semiconductor laser device has a symmetrical structure relative to the center axis in a horizontal direction.

FIG. 36 is a side cross-sectional view in a longitudinal direction that shows a schematic structure of the semiconductor laser device according to the seventh embodiment of the present invention. This semiconductor laser device has the diffraction gratings 137a and 137b as chirped gratings of which grating periods are cyclically changed. Constituent portions that are identical with or similar to those of the sixth embodiment are attached with identical or similar reference symbols.

FIG. 38 shows a cyclic change of the grating period of the diffraction grating 137a. As shown in FIG. 38, this diffraction grating 137a has an average period of 220 nm, and repeats a periodic fluctuation (deviation) of ±0.02 nm in the period of C. Based on the periodic fluctuation of ±0.02 nm, a reflection band of the diffraction grating 137a has a half width of about 2 nm. Based on this, it is possible to have about three to six oscillation longitudinal modes within the half width $\Delta\lambda h$ of the lasing wavelength spectrum, as shown in FIG. 37.

In the seventh embodiment, while the chirped grating of changing the grating period in the constant period C is employed, the change of the grating period is not limited to this. It is also possible to change the grating period at random between a period $\Lambda_1$ (220 nm+0.02 nm) and a period $\Lambda_2$ (220 nm−0.02 nm).

Figure 39A:
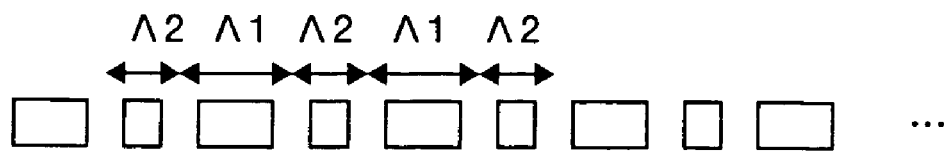
FIG. 39A to FIG. 39C show pattern graphs of modified structures of the diffraction grating according to the seventh embodiment.
Figure 39B:
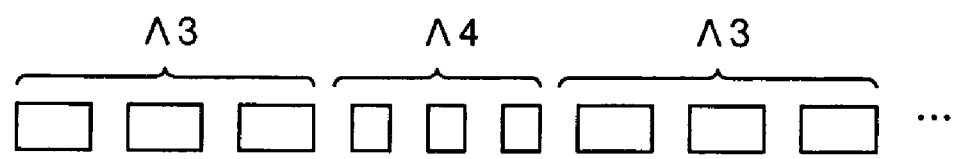
Figure 39C:
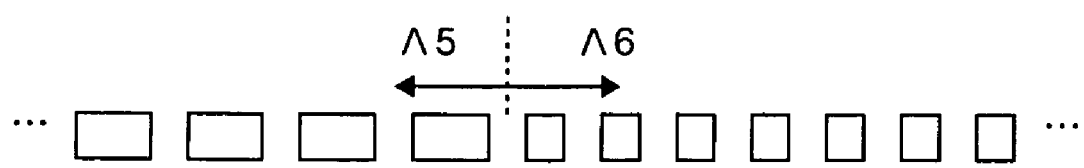

It is also possible to provide diffraction gratings that alternately repeat one period $\Lambda_1$ and one period $\Lambda_2$ with a periodic fluctuation, as shown in FIG. 39A. It is also possible to provide diffraction gratings that alternately repeat a plurality of periods $\Lambda_3$ and a plurality of periods $\Lambda_4$ with a periodic fluctuation, as shown in FIG. 39B. It is also possible to provide diffraction gratings that have a continuous plurality of periods $\Lambda_5$ and a continuous plurality of periods $\Lambda_6$ with a periodic fluctuation, as shown in FIG. 39C. It is also possible to complementarily dispose a period having discrete different values between the periods $\Lambda_1$, $\Lambda_3$, and $\Lambda_5$, and the periods $\Lambda_2$, $\Lambda_4$, and $\Lambda_6$.

In the seventh embodiment, the diffraction gratings provided in the semiconductor laser device have a periodic fluctuation of about ±0.01 to 0.02 nm in the average period, according to the chirped grating or the like. Based on this, the half width of the reflection band is set to a desired value, thereby to finally determine the half width $\Delta\lambda h$ of the lasing wavelength spectrum. The semiconductor laser device emits a laser beam that includes a plurality of oscillation longitudinal modes within the half width $\Delta\lambda h$. With this arrangement, it is possible to provide the semiconductor laser device having similar effects to those of the semiconductor laser devices according to the sixth and seventh embodiments.

Advantages obtained from the structures of the diffraction gratings 137a and 137b in the seventh embodiment is explained next. As described above, in the seventh embodiment, the diffraction gratings 137a and 137b are disposed beneath the current blocking layers 109a and 109b respectively. Therefore, weak light is distributed in the areas where the diffraction gratings 137a and 137b are disposed. In general, the value of the coupling coefficient κ depends on the distributed light. Therefore, the coupling coefficient κ becomes small in the areas where the weak light is distributed. In order for the diffraction gratings 137a and 137b to select desired oscillation longitudinal modes, it is necessary to keep at least a constant value as the product of the coupling coefficient κ and the diffraction grating length Lg, that is, κ·Lg. Therefore, in the seventh embodiment, the diffraction grating length Lg inevitably becomes large to compensate for the reduction of the coupling coefficient κ.

However, when the diffraction grating length Lg becomes larger, other problem occurs. That is, as the half width $\Delta\lambda h$ of the lasing wavelength spectrum becomes smaller when the diffraction grating length Lg becomes larger, the number of the oscillation longitudinal modes decreases. Therefore, the diffraction gratings 137a and 137b cyclically change their periods, or change the periods at random, thereby to increase the half width $\Delta\lambda h$ and secure the half width $\Delta\lambda h$ at a sufficient value. Based on this, a necessary number of oscillation longitudinal modes are secured.

There is some anxiety about the influence that the disposition of the diffraction gratings 137a and 137b in the second areas gives to the light confinement in a horizontal direction. However, there is no problem when the structures of the current blocking layers 109a and 109b are determined based on the assumption that the diffraction gratings 137a and 137b exist. Consequently, in the seventh embodiment, based on the existence of the current blocking layers 109a and 109b, it is possible to control the light confinement in a horizontal direction in a similar manner to that of the sixth embodiment. As a result, it is possible to realize a semiconductor laser device that obtains a high output and has high reliability.

Figure 40:
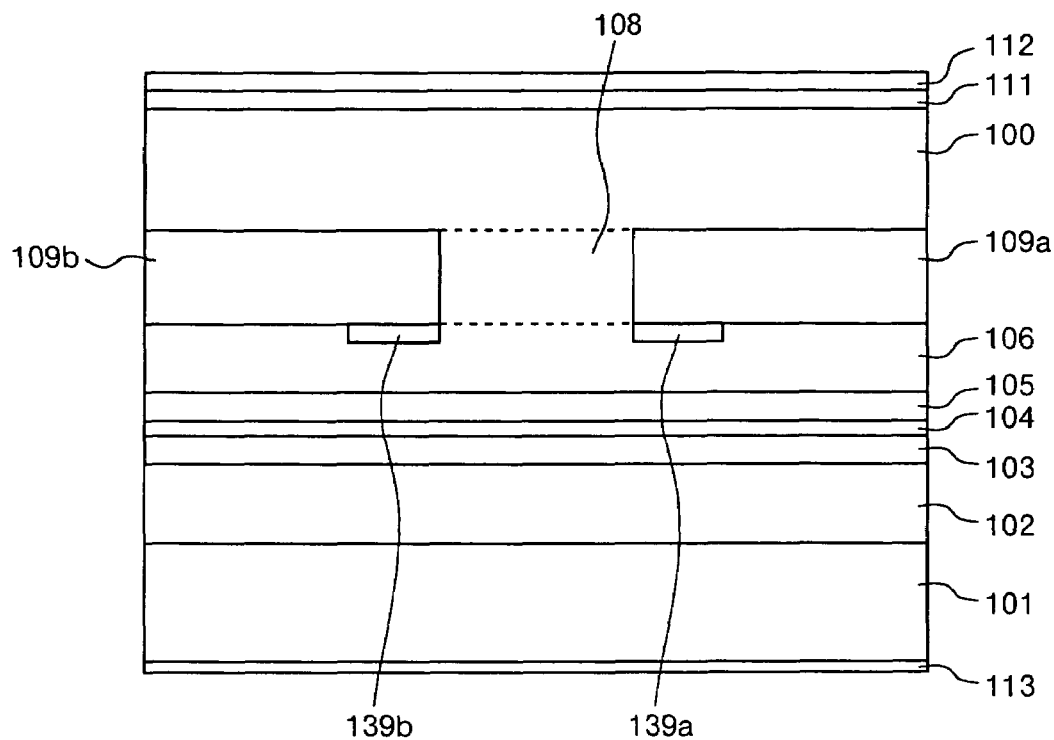
FIG. 40 is a front view of a structure of a modification of the optical fiber amplifier according to the seventh embodiment.
Figure 41:
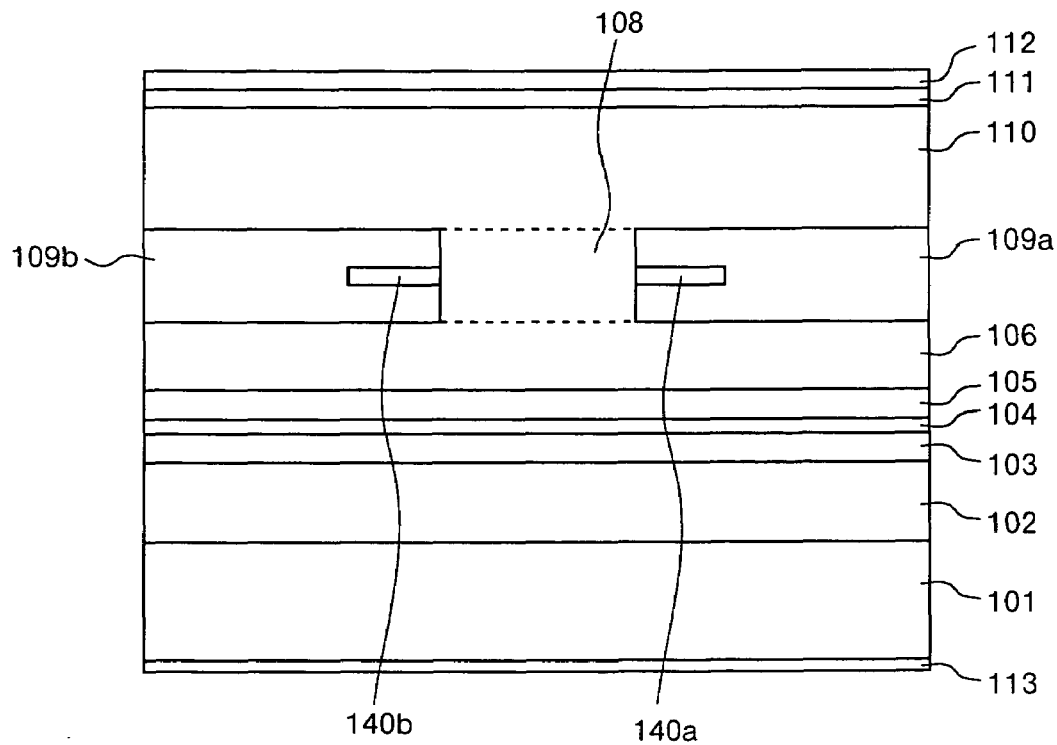
FIG. 41 is a front view of a structure of another modification of the optical fiber amplifier according to the seventh embodiment.

It is possible to dispose the diffraction gratings 137a and 137b not only in the areas as shown in FIG. 35 but also at positions where the diffraction gratings 137a and 137b are in contact with the current blocking layers 109a and 109b as shown in FIG. 40. It is also possible to dispose the diffraction gratings 137a and 137b inside the current blocking layers 109a and 109b as shown in FIG. 41. As the semiconductor laser device according to the seventh embodiment has weak light confinement in a horizontal direction, it is possible to secure the Λ·Lg that makes it possible to sufficiently select a wavelength in the areas shown in FIG. 40 and FIG. 41. It is also possible to dispose a diffraction grating in the second area within the lower cladding layer 102 although not shown in the drawings. It is also possible to dispose a diffraction grating in the area isolated from the first area 118 and the second areas 19 and 120 instead of at the boundaries with these areas, so long as it is possible to secure the Λ·Lg value.

It is also possible to apply the diffraction gratings having the structures shown in FIG. 38 and FIG. 39 to the semiconductor laser device according to the sixth embodiment. Particularly, the light distribution in a layer direction is determined mainly based on the lower SCH layer 103 and the upper SCH layer 105. Depending on the structures of these layers, the intensity of light confinement in a layer direction is high, and the first area 118 has an area where the light distribution is weak. In this case, it is possible to use the diffraction gratings having the structures shown in FIG. 38 and FIG. 39. Based on this, it is possible to realize a semiconductor laser device that has the half width $\Delta\lambda h$ at a sufficient level and has a sufficient number of oscillation longitudinal modes, regardless of the presence of a large diffraction grating length Lg.

A semiconductor laser module according to an eighth embodiment of the present invention is explained. In the eighth embodiment, the semiconductor laser module is structured by using the semiconductor laser device according to the sixth embodiment or the seventh embodiment.

Figure 42:
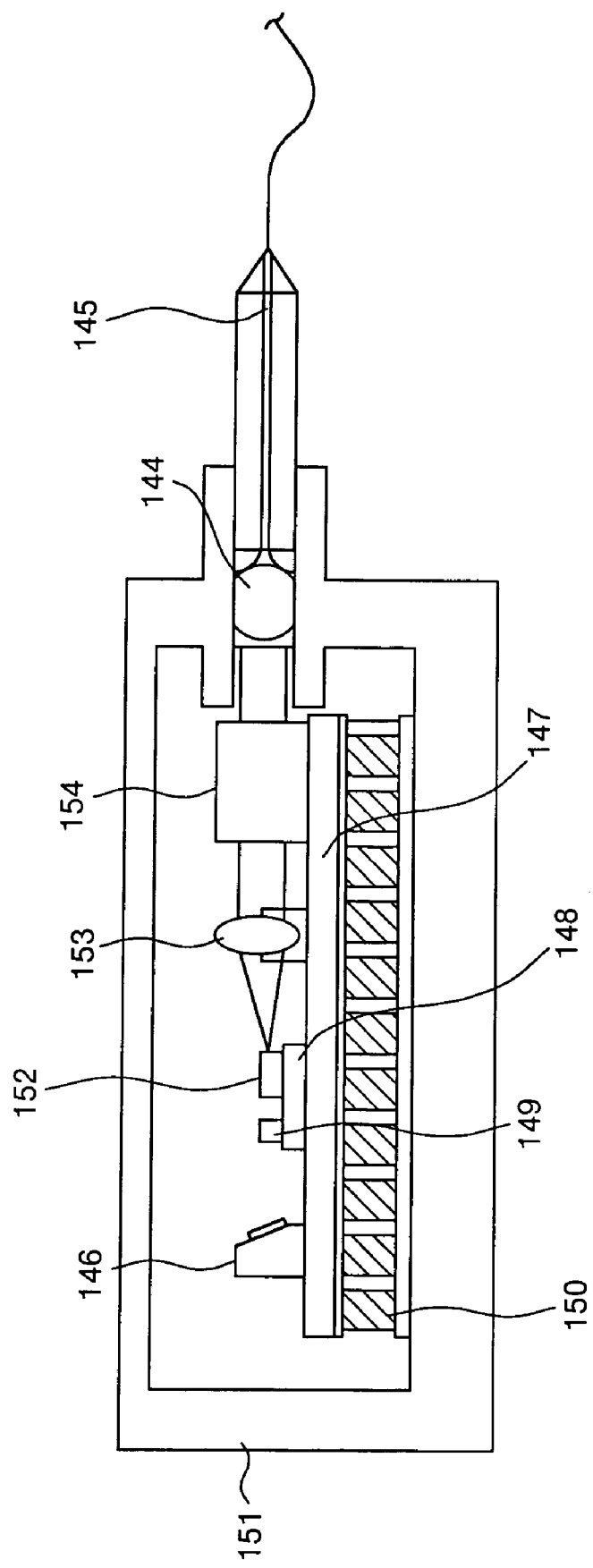
FIG. 42 is a side cross-sectional view of a structure of a semiconductor laser module according to an eighth embodiment of the present invention.

FIG. 42 is a side cross-sectional view of a structure of the semiconductor laser module according to the eighth embodiment of the present invention. The semiconductor laser module according to the eighth embodiment has a semiconductor laser device 152 according to the six embodiment or the seventh embodiment. This semiconductor laser device 152 has a junction down structure of having the opposite side of the substrate joined to a laser mount 148. A package 151 made of a ceramic or the like is provided as a casing of the semiconductor laser module. A temperature control module 150 is disposed as a temperature control unit on the inside bottom surface of the package 151. A base 147 is disposed on the temperature control module 150, and the laser mount 148 is disposed on this base 147. A current not shown is supplied to the temperature control module 150. The temperature control module 150 carries out cooling and heating based on the polarity of the current, and this module mainly functions as a cooler. The temperature control module 150 controls the temperature based on a result of a detection carried out by a thermistor 149 disposed near the semiconductor laser device 152 on the laser mount 148. A controller not shown controls the temperature control module 150 so as to keep the temperature of the laser mount 148 always at a constant level.

In the semiconductor laser device according to the sixth or the seventh embodiment, the diffraction grating selects a lasing wavelength. This semiconductor laser device has a smaller fluctuation in the lasing wavelength due to the driving current than a Fabry-Perot (FP) laser having no diffraction grating. However, the temperature of the light emission area rises along the increase in the driving current, and the lasing wavelength becomes longer. It is also possible to control the temperature control module 150 to prevent the occurrence of a deviation of the lasing wavelength due to a rise in the temperature of the semiconductor laser device 152. In other words, when the wavelength of the laser beam is longer than a desired wavelength, it is possible to control the temperature control module 150 to keep a low temperature by cooling. When the wavelength of the laser beam is shorter than a desired wavelength, it is possible to control the temperature control module 150 to keep a high temperature by heating. In the present invention, the semiconductor laser device gives smaller current to the temperature control module to correct the wavelength deviation than the FP laser, which is preferable, as this leads to a reduction in power consumption.

Based on this temperature control, it is possible to improve the output stability of the semiconductor laser device 152, which is effective to improve the yield. It is desirable that the laser mount 148 is made of a material having high thermal conductivity such as diamond. This is because the laser mount 148 made of diamond can restrict the heat generation when a high current is applied to this.

On the base 147, there are disposed the laser mount 148 on which the semiconductor laser device 152 and the thermistor 149 are disposed, a first lens 153, and a photodetector 146. The semiconductor laser device 152 emits a laser beam. The laser beam is guided to an optical fiber 145 via the first lens 153, an isolator 154, and a second lens 144. The second lens 144 is provided on an optical axis of the laser beam on the package 151, and is optically coupled with the optical fiber 145 externally connected. The photodetector 146 monitors a beam leaked out from the high reflection film of the semiconductor laser device 152. The optical coupling system may be the system that uses the two lenses as shown in FIG. 42, or a system that processes the lens at the front end of the fiber.

In the present semiconductor laser module, the isolator 154 is provided between the semiconductor laser device 152 and the optical fiber 145 to prevent beams reflected from other optical parts from returning to the resonator.

An optical fiber amplifier according to a ninth embodiment is explained. In the ninth embodiment, the semiconductor laser module explained in the eighth embodiment is applied to a Raman amplifier.

Figure 43:
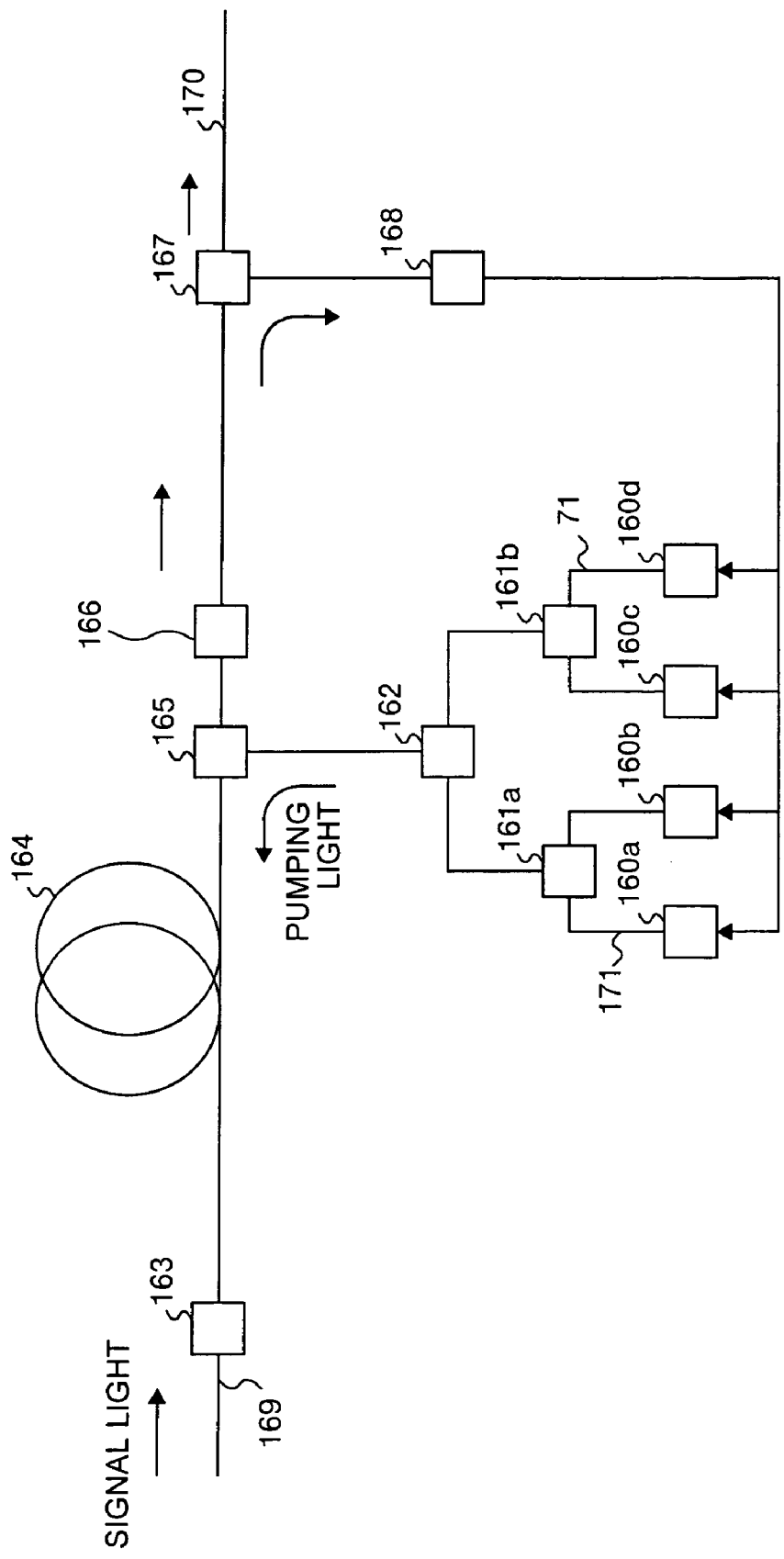
FIG. 43 is a block diagram that shows a structure of an optical fiber amplifier according to a ninth embodiment of the present invention.

FIG. 43 is a block diagram that shows a structure of the Raman amplifier according to the ninth embodiment of the present invention. This Raman amplifier is used for a WDM communication system. In FIG. 43, this Raman amplifier uses semiconductor laser modules 160a to 160d that have the same structures as that of the semiconductor laser module explained in the eighth embodiment.

Each of the semiconductor laser modules 160a and 160b outputs a laser beam having a plurality of oscillation longitudinal modes to a polarization coupler 161a via a polarization maintaining fiber 171. Each of the semiconductor laser modules 160c and 160d outputs a laser beam having a plurality of oscillation longitudinal modes to a polarization coupler 161b via the polarization maintaining fiber 171. The laser beams that the semiconductor laser modules 160a and 160b oscillate have the same wavelengths. The laser beams that the semiconductor laser modules 160c and 160d oscillate have the same wavelengths, which are different from the wavelength of the laser beams that the semiconductor laser modules 160a and 160b oscillate. This difference of the wavelengths is because the Raman amplification has polarization dependency. The polarization couplers 161a and 161b output laser beams after canceling the polarization dependency.

A WDM coupler 162 combines the laser beams having different wavelengths output from the polarization couplers 161a and 161b, and outputs the combined laser beam to an amplification fiber 164 as the pumping light for Raman amplification via a WDM coupler 165. This pumping light is input to the amplification fiber 164. The amplification fiber 164 receives an input signal light to be amplified, and Raman amplifies this signal.

The amplification fiber 164 outputs the Raman amplified signal light (i.e., an amplified signal light) to a monitor light distribution coupler 167 via the WDM coupler 165 and the isolator 166. The monitor light distribution coupler 167 outputs a part of the amplified signal light to a control circuit 168, and outputs the rest of the amplified signal light to a signal light output fiber 170 as an output laser beam.

The control circuit 168 controls the laser output states of the semiconductor laser modules 160a to 160d, such as the light intensities, based on a part of the input amplified signal light, and feedback controls these semiconductor laser modules so that the gain band after the Raman amplification becomes flat.

The Raman amplifier explained in the ninth embodiment uses the semiconductor laser module 160a that incorporates the semiconductor laser device explained in the sixth or seventh embodiment. Therefore, it is possible to increase the intensity of the laser beam emitted from the semiconductor laser module. Further, the Raman amplifier does not use a semiconductor laser module that has the semiconductor laser device and the fiber grating coupled with a polarization maintaining fiber, but uses the semiconductor laser module 160a that incorporates the semiconductor laser device explained in the sixth or seventh embodiment. Therefore, it is possible to reduce the use of the polarization maintaining fiber 171. In other words, as each of the semiconductor laser modules 160a to 160d has a plurality of oscillation longitudinal modes, it is possible to decrease the length of the polarization maintaining fiber. As a result, it is possible to realize a reduction in size, a reduction in weight, and a reduction in cost of the Raman amplifier.

Figure 44:
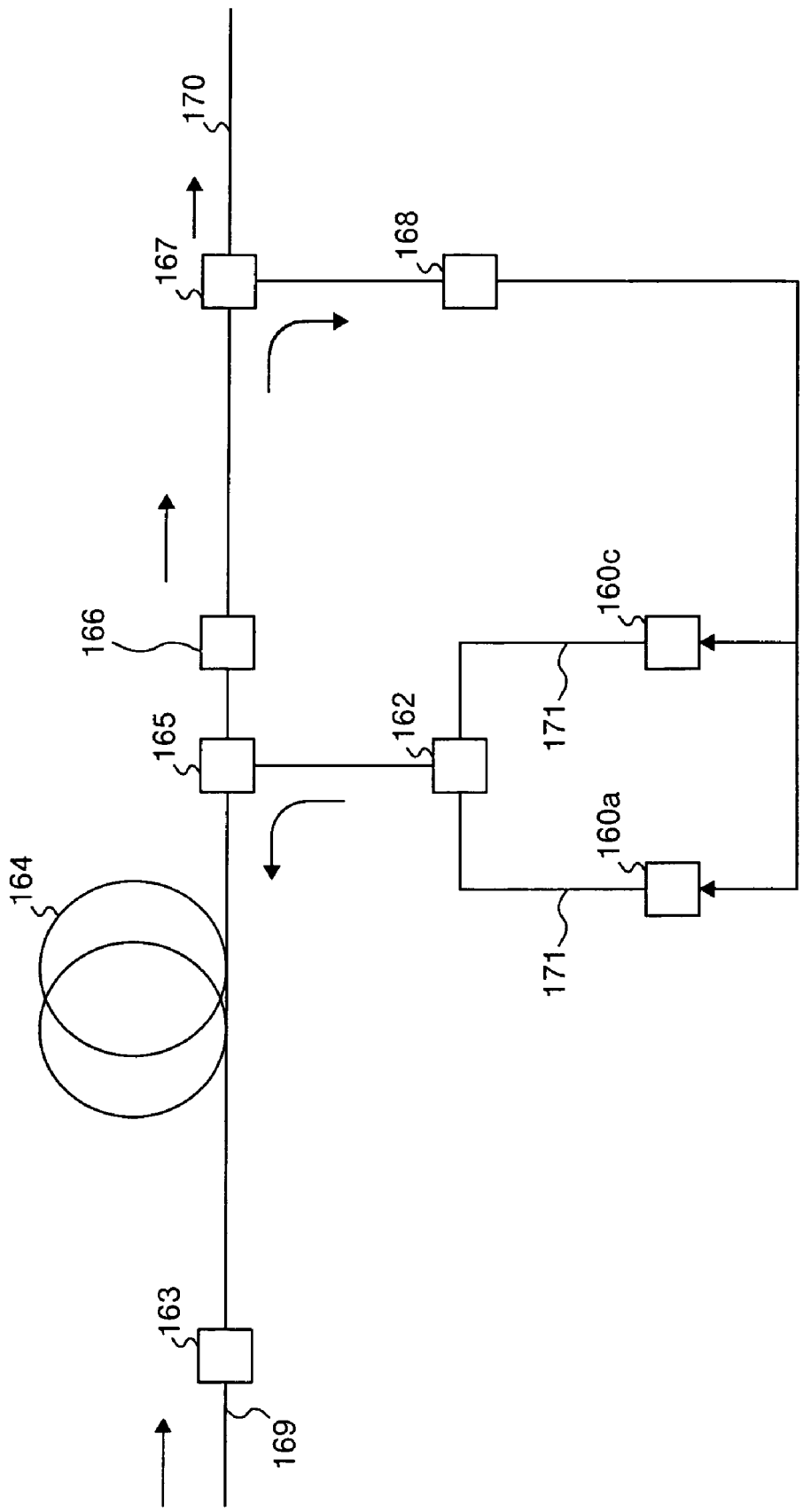
FIG. 44 is a block diagram that shows an example of application of the optical fiber amplifier according to the ninth embodiment.
Figure 45:
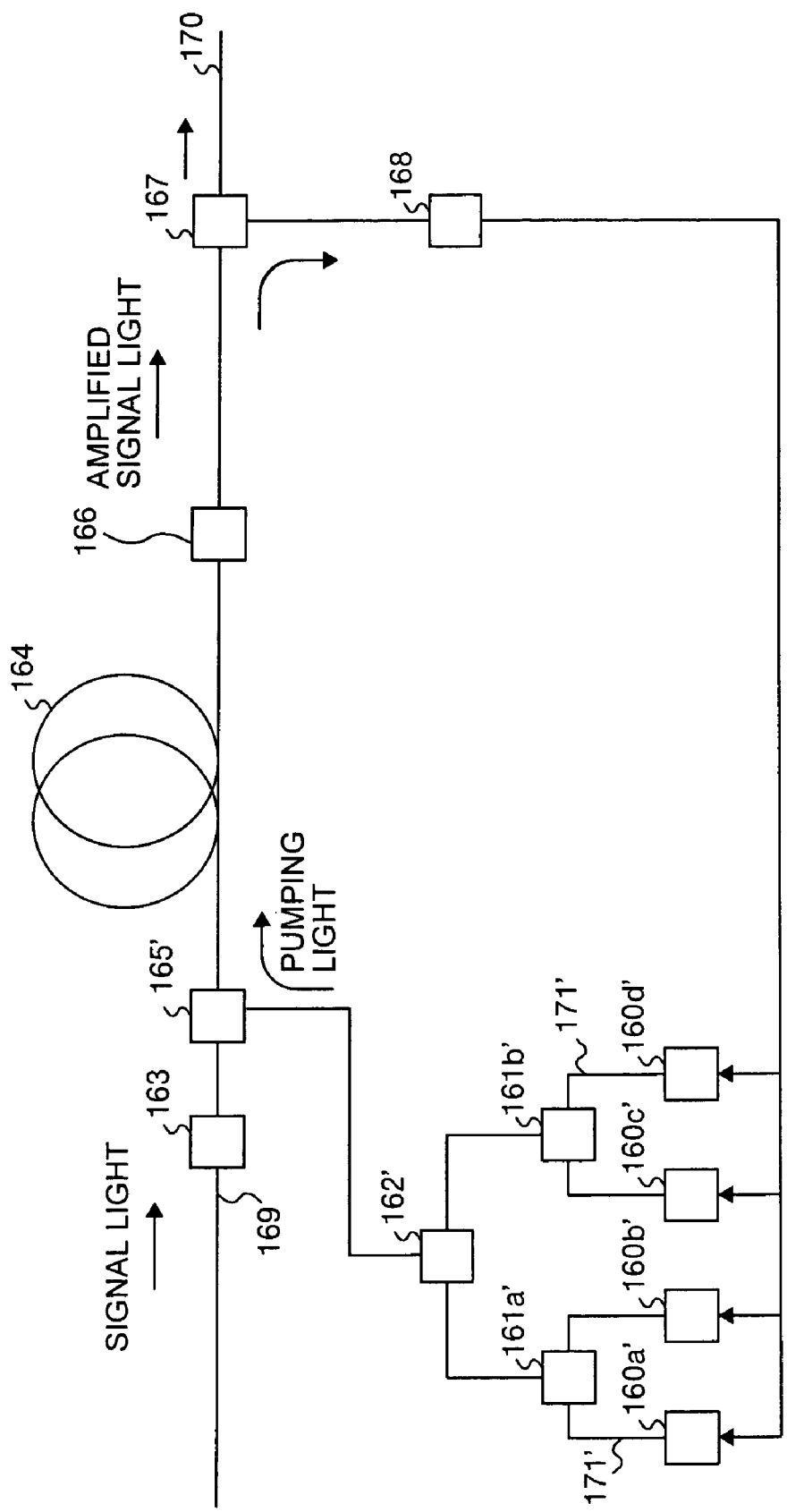
FIG. 45 is a block diagram that shows a modified structure of the optical fiber amplifier according to the ninth embodiment, where the semiconductor laser device employs a copropagating pumping system.

While the Raman amplifier shown in FIG. 45 uses the polarization couplers 161a and 161b, it is possible to arrange such that the semiconductor laser modules 160a and 160c directly output lights to the WDM coupler 162 via the polarization maintaining fibers 171 respectively, as shown in FIG. 44. In this case, the planes of polarization of the semiconductor laser modules 160a and 160c form an angle of 45 degrees relative to the polarization maintaining fibers 171 respectively. Based on this, it is possible to avoid the polarization dependency of the light output from the polarization maintaining fibers 171. Therefore, it is possible to realize a Raman amplifier having smaller sizes and having a smaller number of parts.

When the number of oscillation longitudinal modes increases, a coherent length decreases, and the degree of polarization (DOP) becomes smaller based on the depolarization. Consequently, it is possible to avoid the polarization dependency. As a result, it is possible to further simplify and reduce sizes of the Raman amplifier.

In the semiconductor laser device according to the sixth and seventh embodiments, the diffraction grating selects a wavelength, and it is not necessary to use a fiber grating. Therefore, the semiconductor laser device can reduce relative intensity noise (RIN) as compared with the semiconductor laser device that uses a fiber grating. Consequently, it is possible to restrict a fluctuation in the Raman gain, and it is possible to carry out stable Raman amplification.

In the semiconductor laser device according to the sixth and seventh embodiments, a laser beam has a plurality of oscillation modes. Therefore, it is possible to generate a high output pumping light without generating an induced Brillouin scattering. As a result, it is possible to obtain a stable and high Raman gain.

While the Raman amplifiers shown in FIG. 43 and FIG. 44 are based on the backward pumping system, it is also possible to carry out a stable Raman amplification based on the copropagating pumping system or the bidirectional system, as the semiconductor laser modules 160a to 160d output stable pumping lights.

For example, FIG. 45 is a block diagram that shows a Raman amplifier employing the copropagating pumping system. While the WDM coupler 165 is disposed near the isolator 166 in the Raman amplifier shown in FIG. 43, the Raman amplifier shown in FIG. 45 has a WDM coupler 165' disposed near an isolator 163. A circuit that has semiconductor laser modules 160a' to 160d', polarization couplers 161a' and 161b', and a WDM coupler 162' corresponding to the semiconductor laser modules 160a to 160d, the polarization couplers 161a and 161b, and the WDM coupler 162 respectively, is connected to the WDM coupler 165'. This Raman amplifier carries out the copropagating pumping of outputting the pumping light from the WDM coupler 162' to the same direction as the direction to which the signal light is output.

Figure 46:
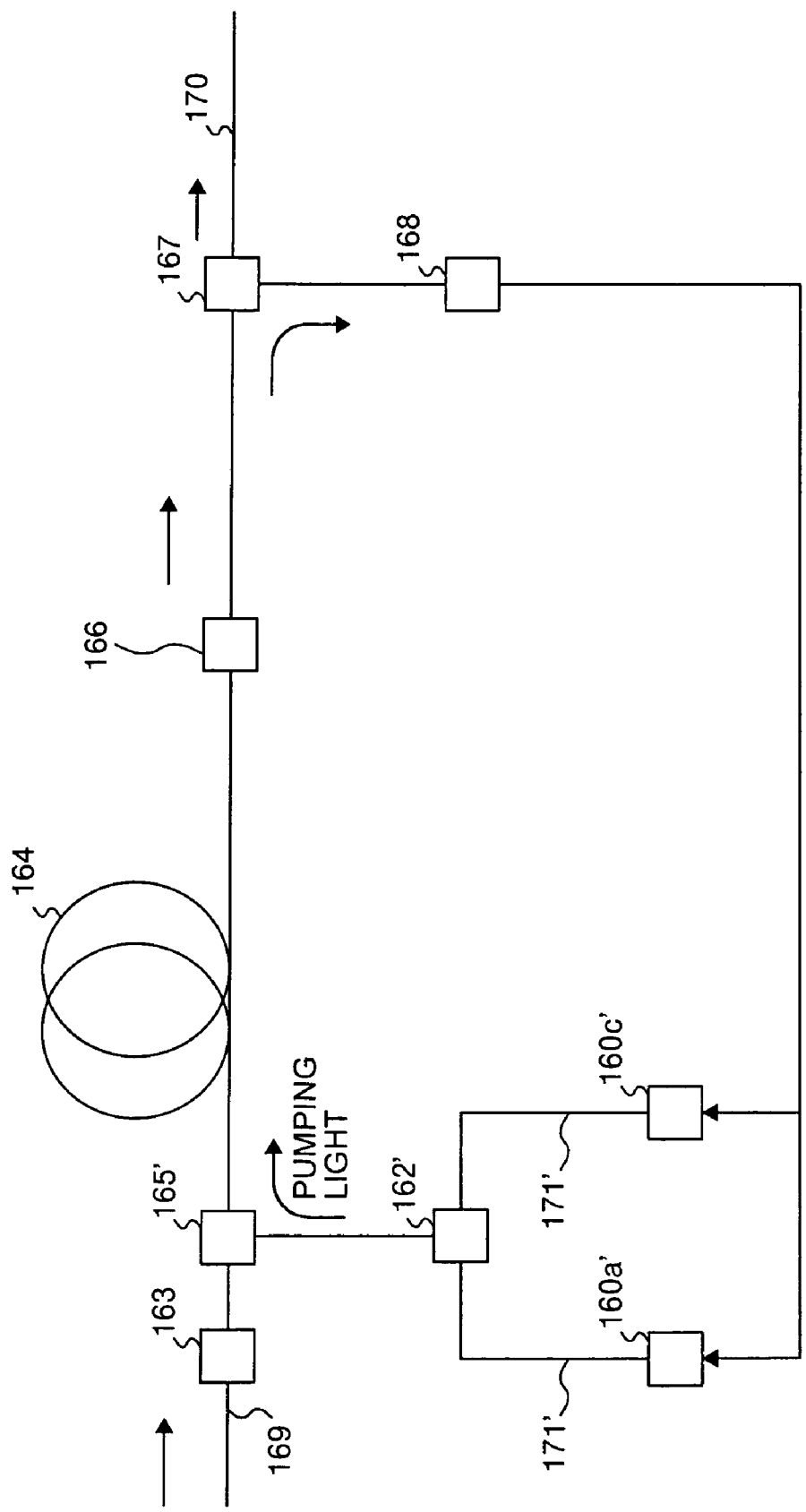
FIG. 46 is a block diagram that shows an example of application of the optical fiber amplifier shown in FIG. 45.

Similarly, FIG. 46 is a block diagram that shows a Raman amplifier employing the copropagating pumping system. While the Raman amplifier shown in FIG. 44 has the WDM coupler 165 disposed near the isolator 166, the Raman amplifier shown in FIG. 46 has the WDM coupler 165' disposed near the isolator 163. A circuit that has the semiconductor laser modules 160a' and 160c', and the WDM coupler 162' corresponding to the semiconductor laser modules 160a and 160c, and the WDM coupler 162 respectively, is connected to the WDM coupler 165'. This Raman amplifier carries out the copropagating pumping of outputting the pumping light from the WDM coupler 162' to the same direction as the direction to which the signal light is output.

Figure 47:
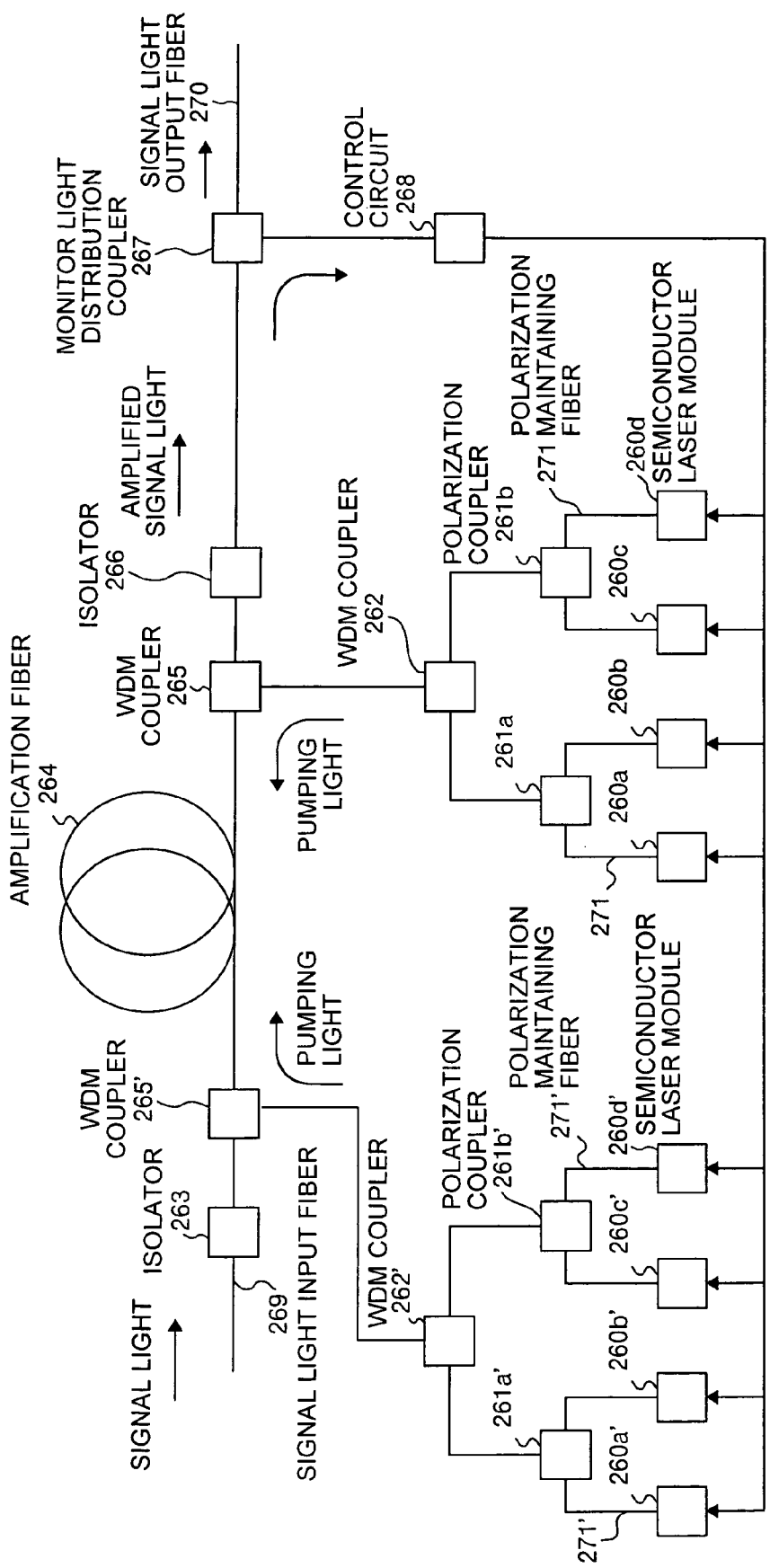
FIG. 47 is a block diagram that shows a modified structure of the optical fiber amplifier according to the ninth embodiment, where the semiconductor laser device employs a bidirectional pumping system.

FIG. 47 is a block diagram that shows a Raman amplifier employing the bidirectional pumping system. The Raman amplifier shown in FIG. 47 has the WDM coupler 165', the semiconductor laser modules 160a' to 160d', the polarization couplers 161a' and 161b', and the WDM coupler 162', in addition to the structure of the Raman amplifier shown in FIG. 43. The Raman amplifier carries out the backward pumping and the copropagating pumping based on this structure.

Figure 48:
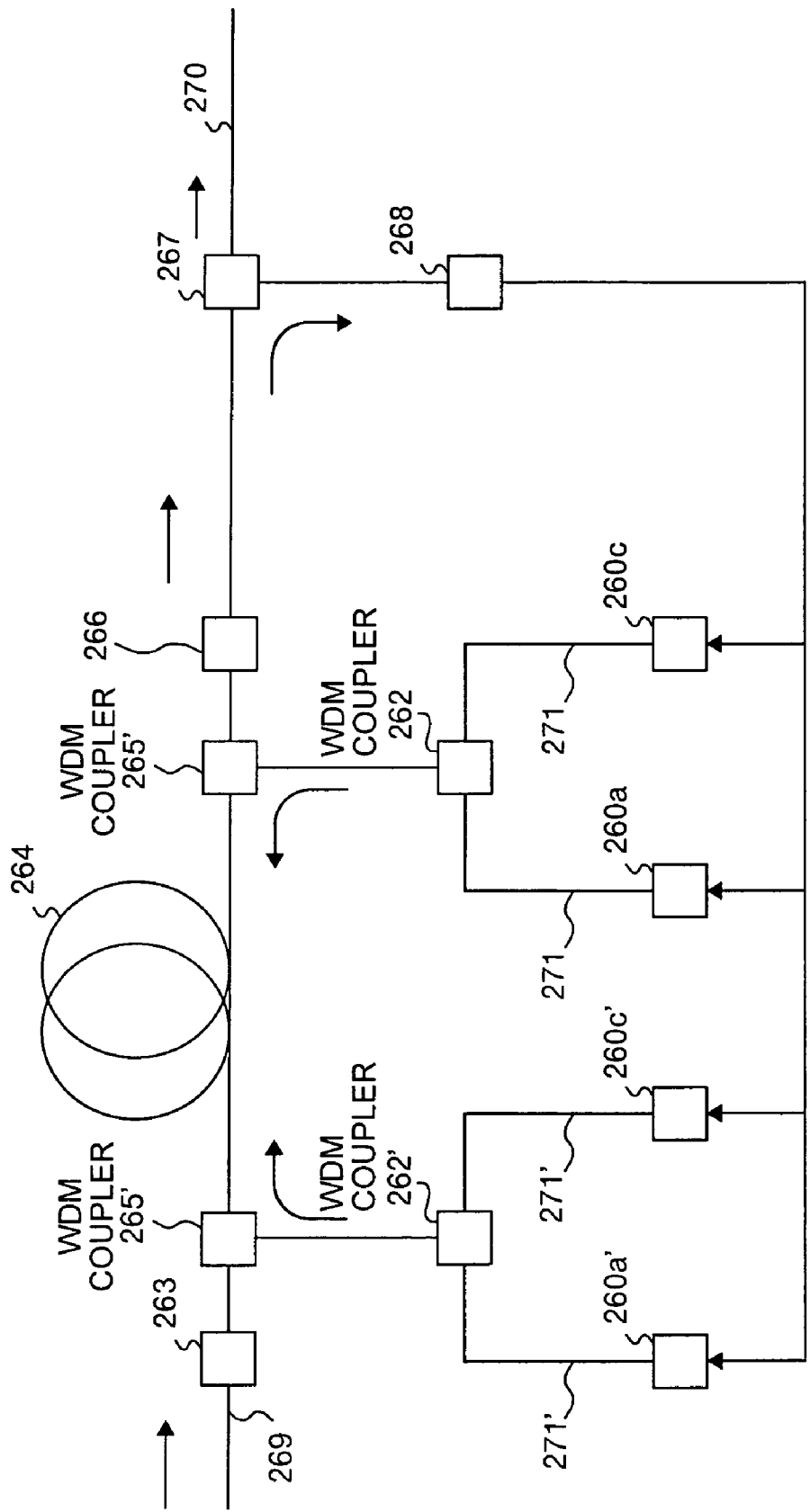
FIG. 48 is a block diagram that shows an example of application of the optical fiber amplifier shown in FIG. 47.

Similarly, FIG. 48 is a block diagram that shows a Raman amplifier employing the bidirectional pumping system. The Raman amplifier shown in FIG. 48 has the WDM coupler 165', the semiconductor laser modules 160a' and 160c', and the WDM coupler 162', in addition to the structure of the Raman amplifier shown in FIG. 44. The Raman amplifier carries out the backward pumping and the copropagating pumping based on this structure.

Figure 49:
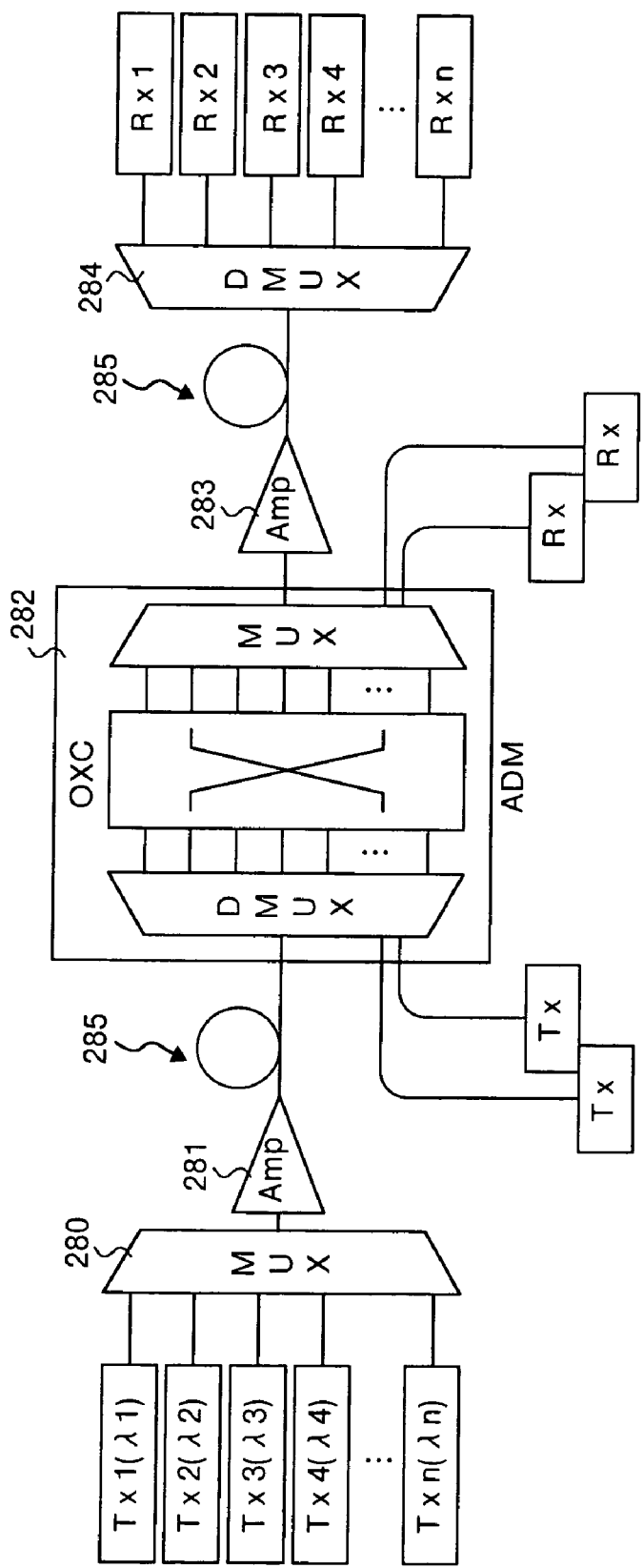
FIG. 49 is a block diagram that shows a schematic structure of a wavelength division multiplexing (WDM) communication system that uses the optical fiber amplifier according to the ninth embodiment.

As explained above, it is possible to apply the Raman amplifiers shown in FIG. 43 to FIG. 48 to the WDM communication system. FIG. 49 is a block diagram that shows a schematic structure of a WDM communication system that uses the Raman amplifiers shown in FIG. 43 to FIG. 48.

Referring to FIG. 49, a plurality of transmitters Tx1 to Txn transmit light signals having wavelengths λ1 to λn to an optical multiplexer 180. This optical multiplexer 180 multiplexes these light signals, and puts them together into one optical fiber 185. A plurality of Raman amplifiers 181 and 183 corresponding to the Raman amplifiers shown in FIG. 45 to FIG. 48 are disposed according to a distance on the transmission line of this optical fiber 185, and these Raman amplifiers amplify an attenuated light signal. An optical demultiplexer 184 branches the signal transmitted through this optical fiber 185 into the light signals having the wavelengths λ1 to λn. A plurality of receivers Rx1 to Rxn receive these signals. Depending on the situation, ADM that add and take out a light signal of an optional wavelength is inserted into the optical fiber 185.

In the ninth embodiment, the semiconductor laser device explained in the sixth or seventh embodiment or the semiconductor laser module explained in the eighth embodiment is used for the pumping source for Raman amplification. However, the use is not limited to this. For example, it is needless to mention that is also possible to use the semiconductor laser device or the semiconductor laser module for the pumping source of the erbium-doped fiber amplifier (EDFA) or the like. Particularly, in the EDFA that has a few km to a few dozens of km as a transmission distance to the EDF for the pumping light, the use of the semiconductor laser device according to any one of the sixth to eighth embodiments for the pumping source makes it possible to effectively restrict a reduction in the amplification gain attributable to the induced Brillouin scattering during the transmission.

Figure 50:
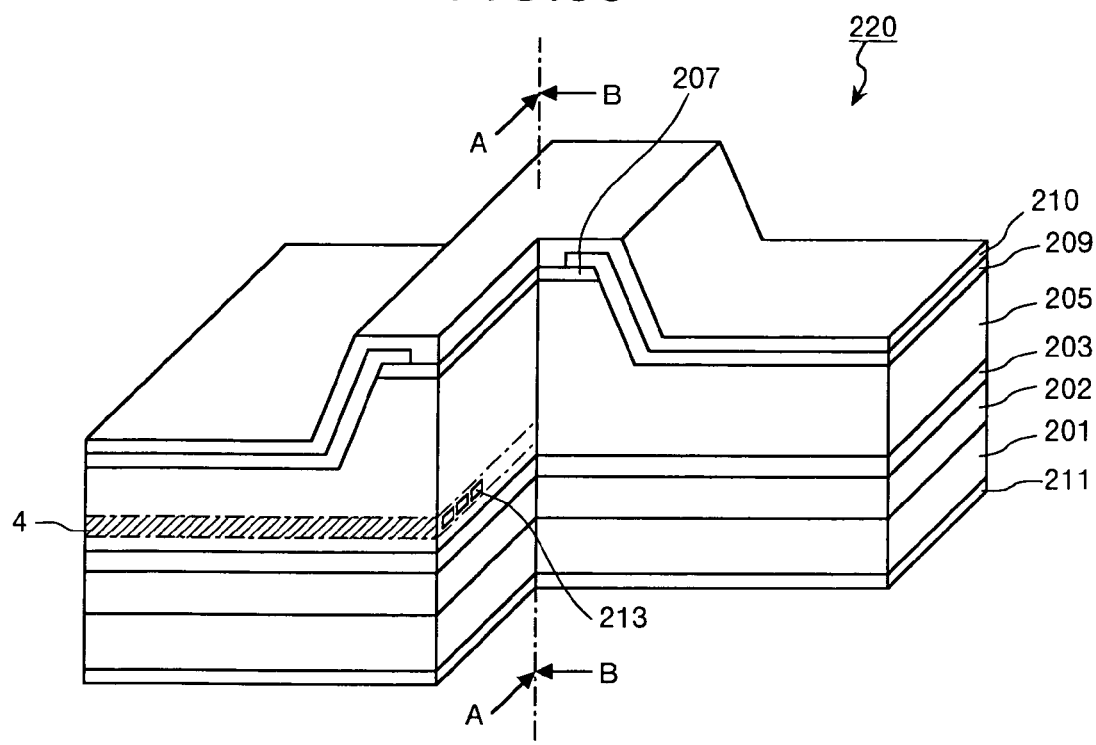
FIG. 50 is a perspective cross-sectional broken view of a semiconductor laser device according to a tenth embodiment of the present invention.
Figure 51:
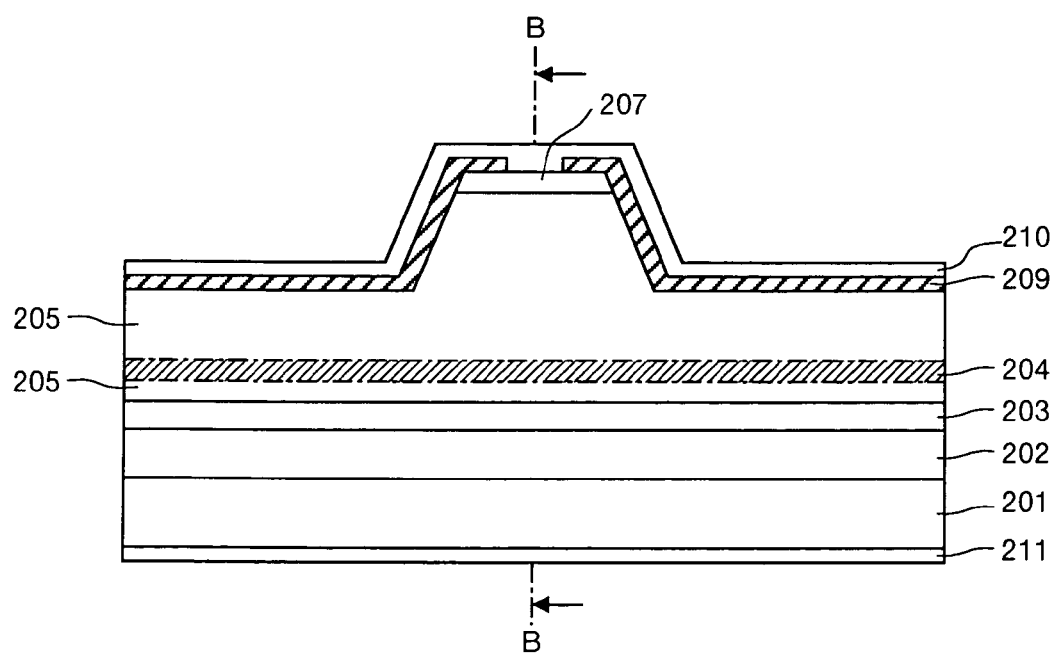
FIG. 51 is a cross-sectional view of the structure of the semiconductor laser device cut along a line A—A in FIG. 50.
Figure 52:
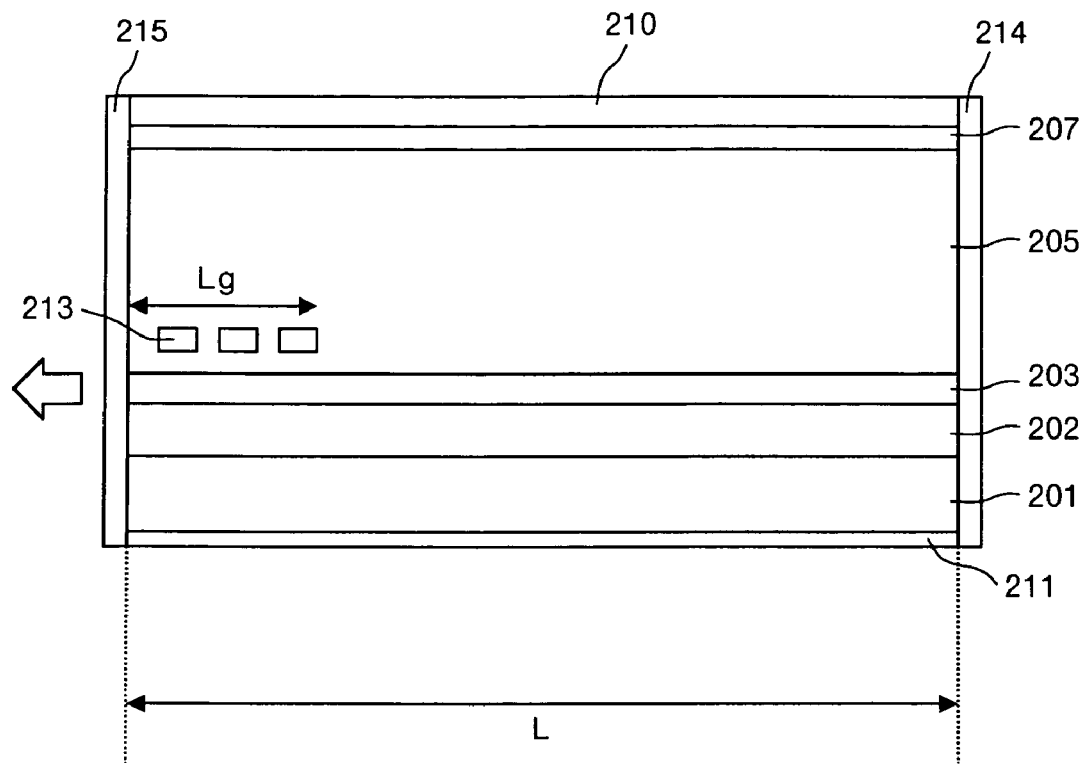
FIG. 52 is a cross-sectional view of the structure of the semiconductor laser device cut along a line B—B in FIG. 50.

A semiconductor laser device according to a tenth embodiment of the present invention is explained next. FIG. 50 is a perspective cross-sectional broken view of a semiconductor laser device according to the tenth embodiment. FIG. 51 is a cross-sectional view of the structure of the semiconductor laser device parallel with a line A—A in FIG. 50. FIG. 52 is a cross-sectional view of the semiconductor laser device in a longitudinal direction cut along a line B—B in FIG. 50 and FIG. 51. In FIG. 50 to FIG. 52, a semiconductor laser device 220 according to the tenth embodiment is a so-called ridge type structure. On the (100) surface of an n-InP substrate 201, there are sequentially formed an n-InP lower cladding layer 202 working as a buffer layer, a graded-index separate confinement heterostructure multi quantum well (GRIN-SCH-MQW) active layer 203, a p-InP upper cladding layer 205, and a p-InGaAsP contact layer 207. A part of the p-InP upper cladding layer 205 and the p-InGaAsP contact layer 207 form a mesa strip (i.e., a ridge shape). This mesa stripe realizes a current contracting, and a light confinement utilizing a difference between the refractive index of air and the refractive index of the semiconductor (i.e., the p-InP upper cladding layer 205).

In FIG. 50, a diffraction grating 213 as one of the characteristics of the present invention is provided in the area expressed as a diffraction grating layer 204. The diffraction grating 213 is made of p-InGaAsP, and has a film thickness of 20 nm, and a length Lg of 50 μm from the reflection end surface of an emission-side reflection film 215 toward a high reflection film 214 shown in FIG. 52. This diffraction grating 213 is cyclically formed at a pitch of about 220 nm over this length Lg, and selects a wavelength of a laser beam having a center wavelength of 1.48 μm. The diffraction grating 213 has a setting of a product of a coupling coefficient K of the diffraction grating and the length Lg of the diffraction grating as not larger than 0.3. Based on this, the diffraction grating 213 makes satisfactory the linearity of the driving current-light output characteristics and increases the stability of the light output (refer to Japanese Patent Application No. 2001-134545). When a resonator length L is 1300 μm, the device oscillates in a plurality of oscillation longitudinal modes when the diffraction grating length Lg is not larger about 300 μm. Therefore, it is desirable that the diffraction grating length Lg is not larger about 300 μm.

An interval of the oscillation longitudinal modes changes in proportion to the size of the resonator length L. Therefore, the diffraction grating length Lg is proportional to the resonator length L. In other words, the relationship of (the diffraction grating length Lg) to (the resonator length L) is equal to 300 to 1300 is maintained. Consequently, this relationship can be expanded as follows, to obtain a plurality of oscillation longitudinal modes when the diffraction grating length Lg is not larger than 300 μm.

$$Lg \times (1300\ (\mu m)/L) \leq 300\ (\mu m)$$

In other words, the diffraction grating length Lg is set to keep the ratio with the resonator length L, and is set to not larger than 300/1300 times the resonator length L (refer to the Japanese Patent Application No. 2001-134545).

As shown in FIG. 50 and FIG. 51, an $SiN_x$ film 209 that functions as an insulation and protection film is formed on the surface of the mesa stripe, except the center portion of the p-InGaAsP contact layer 207. A p-side electrode 210 is formed to cover an exposed portion of the p-InGaAsP contact layer 207 and the surface of the $SiN_x$ film 209. Based on this, the p-side electrode 210 and the p-InGaAsP contact layer 207 are electrically contacted to each other. On the other hand, an n-side electrode 211 is formed on the rear surface of the n-InP substrate 201.

The reflection film 214 having high light reflectivity of not smaller than 80 percent, preferably not smaller than 98 percent, is formed on the light reflection end surface as one end surface in a longitudinal direction of the semiconductor laser device 220. On the light emission end surface as the other end surface, there is formed an emission-side reflection film 215 having low light reflectivity of not larger than 10 percent, preferably not larger than 5 percent, 1 percent, and 0.5 percent respectively, and more preferably not larger than 0.1 percent. The reflection film 214 reflects a light generated within the GRIN-SCH-MQW active layer 203 of the light resonator formed by the reflection film 214 and the emission-side reflection film 215. This semiconductor laser device emits the light through the emission-side reflection film 215. At this time, the diffraction grating 213 selects a wavelength for the emission.

The laser beam output from the semiconductor laser device 220 may oscillate in a single transverse mode. The structure of the active layer or the light waveguide is not limited to that explained above. In the present invention, particularly the active layer is formed to include a material of an Al mixed crystal system. Specifically, the well layer and the barrier layer that constitute the GRIN-SCH-MQW active layer 203 are made of $(Al_xGa_{1-x})_yIn_{1-y}As$ (0<x, y<1). It is preferable to have a strain compensation structure such that the well layer has a compressive strain of about 1.4 percent, and that the barrier layer has a tensile strain of about 0.1 percent. While it is possible to form the SCH layer using InGaAsP, it is preferable to use a material of the Al mixed crystal system such as $(Al_xGa_{1-x})_yIn_{1-y}As$ (0<x, y<1).

As explained above, when the material of the Al mixed crystal system is used for any one of the active layer and the photoconductive layer or both, it is possible to restrict the carrier overflow. As a result, it is possible to realize a high output, a reduction in the temperature dependency of a light output, and a reduction in the temperature dependency of a threshold current. It is possible to restrict the carrier overflow because there is a larger difference in energy between the well layer and the barrier layer when the Al mixed system material is used than when the conventional GaInAsP or the like of the Al non-mixed system is used.

Figure 53:
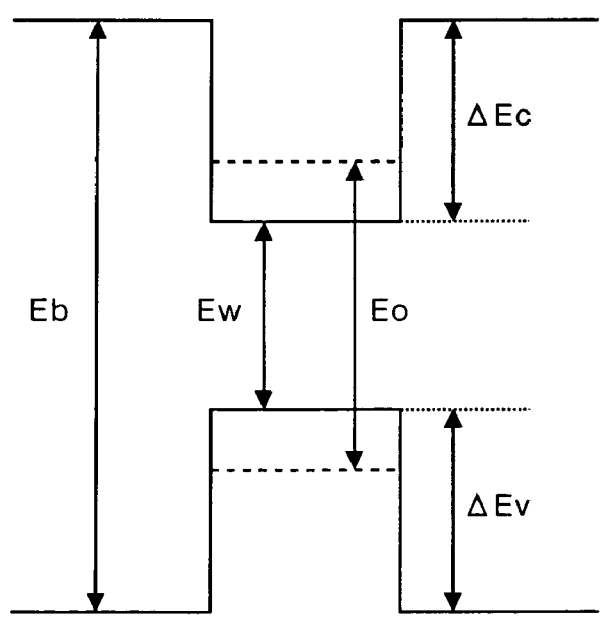
FIG. 53 is an energy level diagram that explains about a restriction of carrier overflow.

FIG. 53 is an energy level diagram that explains about a restriction of carrier overflow. As is clear from FIG. 53, even when the injection current is large, it is possible to restrict the overflow of electron when an energy difference ΔEc between the conduction band of the barrier layer and the conduction band of the well layer is large. When an energy difference ΔEv between the valence band of the barrier layer and the valence band of the well layer is large, it is possible to restrict the overflow of a hole. As the effective mass of electron is smaller than the effective mass of the hole, the overflow of electron is dominant. Therefore, to restrict the carrier overflow, it is more effective to make ΔEc larger than ΔEv.

An energy difference ΔEg between an energy band gap Eb of the barrier layer and an energy band gap Ew of the well layer is defined as follows.

$$\Delta Eg = Eb - Ew$$

ΔEc is substantially determined based on the product of a constant and ΔEg for each material system. It is known that ΔEc of the GaInAsP system obtained as follows, $$\Delta Ec = 0.4 \Delta Eg$$

and ΔEc of the AlGaInAs system is obtained as follows $\Delta Ec = 0.72\ \Delta Eg$. In other words, ΔEc of the AlGaInAs system is larger than ΔEc of the GaInAsP system. It is clear that to restrict the carrier overflow, it is effective to use the material of the AlGaInAs system for the active layer.

The tenth embodiment is based on the assumption that the semiconductor laser device 220 is used for the pumping source of the Raman amplifier. The lasing wavelength $\lambda_0$ is 1100 nm to 1600 nm, and the resonator length L is not smaller than 800 μm and not larger than 3200 μm. In general, it is possible to express a mode interval Δλ of a longitudinal mode generated by the resonator of the semiconductor laser device, as follows, where n represents an effective index.

$$\alpha \lambda = \lambda_0^2 / (2*n*L)$$

Assume that the lasing wavelength $\lambda_0^2$ is 1480 μm, and that the effective index n is 3.5. When the resonator length L is 800 μm, the mode interval Δλ of a longitudinal mode becomes approximately 0.39 nm. When the resonator length L is 3200 μm, the mode interval Δλ of a longitudinal mode becomes approximately 0.1 nm. In other words, when the resonator length L is set longer, the mode interval Δλ of a longitudinal mode becomes smaller, and a selection condition to oscillate a laser beam of a single oscillation longitudinal mode becomes severer.

Figure 54:
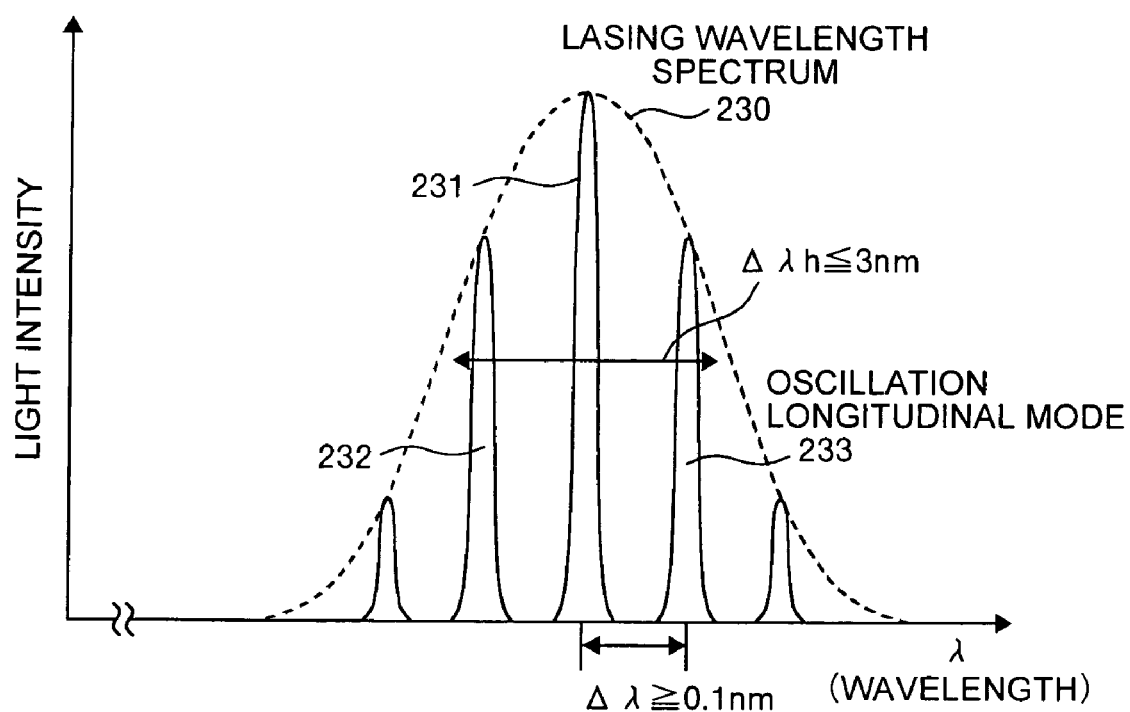
FIG. 54 shows a relationship between an oscillation waveform spectrum and an oscillation longitudinal mode of the semiconductor laser device shown in FIG. 50.

On the other hand, the diffraction grating 213 selects a longitudinal mode based on its Bragg wavelength. Wavelength selection characteristics of the diffraction grating 213 are expressed as a lasing wavelength spectrum 230 shown in FIG. 54. As shown in FIG. 54, according to the tenth embodiment, a plurality of longitudinal modes exist within the wavelength selection characteristics shown by a half width Δλh of the lasing wavelength spectrum 230 of the semiconductor laser device 220 having the diffraction grating 213. According to the conventional distributed Bragg reflector (DBR) semiconductor laser device or the conventional distributed feedback (DFB) semiconductor laser device, it is difficult to carry out the oscillation of a single oscillation longitudinal mode when the resonator length L is not smaller than 800 μm. Therefore, a semiconductor laser device having this resonator length L has not been used. However, the semiconductor laser device 220 according to the tenth embodiment positively sets the resonator length L to 800 μm or above, thereby to carry out a laser output by including a plurality of longitudinal modes within the half width Δλh of the lasing wavelength spectrum. In FIG. 54, three oscillation longitudinal modes 231 to 233 exist within the half width Δλh of the lasing wavelength spectrum.

Figure 55A:
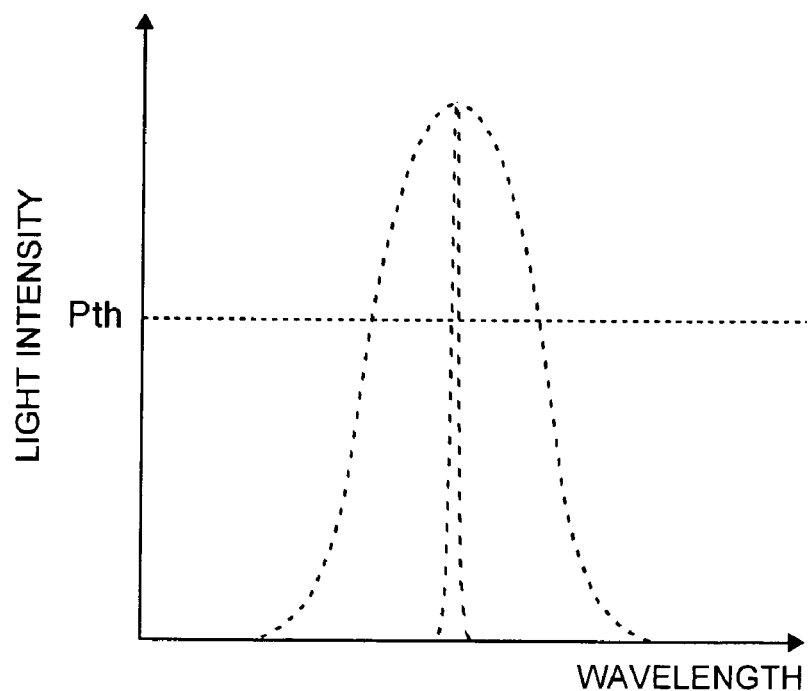
FIG. 55A shows a relationship between a single oscillation longitudinal mode and laser optical output power, and a threshold value of an induced Brillouin scattering.

When a laser beam having a plurality of oscillation longitudinal modes is used, it is possible to obtain a higher laser output in the whole lasing wavelength spectrum, while restricting a peak value of the laser output in each oscillation longitudinal mode than when a single longitudinal mode laser beam is used. For example, the semiconductor laser device according to the tenth embodiment can obtain a high laser output at a low peak value in a profile shown in FIG. 55B. On the other hand, a semiconductor laser device of a single longitudinal mode oscillation obtains the same laser output at a high peak value in a profile shown in FIG. 55A.

Figure 55B:
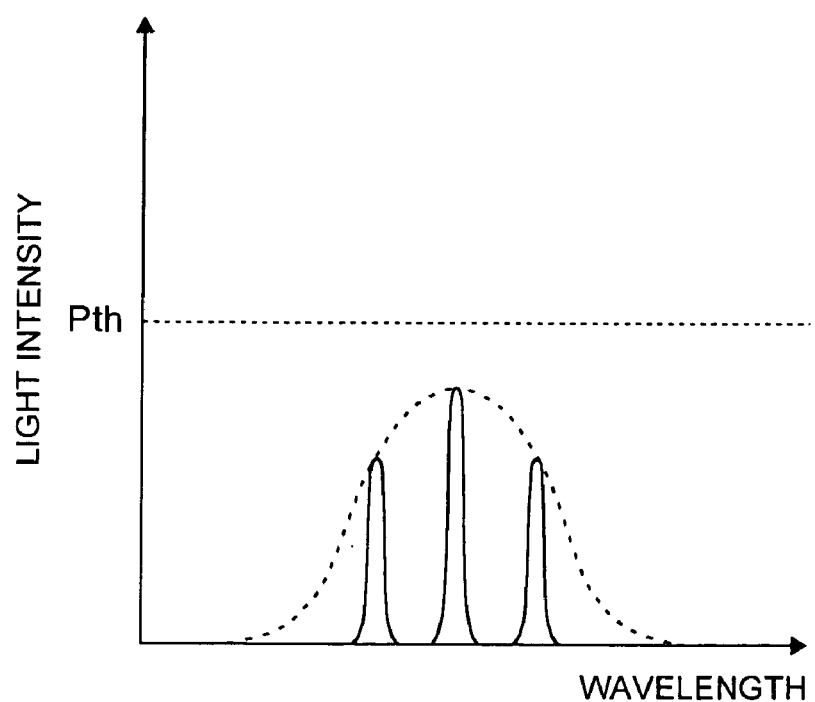
FIG. 55B shows a relationship between plural oscillation longitudinal modes and laser optical output power, and a threshold value of an induced Brillouin scattering.

When the semiconductor laser device is used for a pumping source of a Raman amplifier, it is preferable to increase the pumping light output power to increase the Raman gain. However, when the peak value is high, induced Brillouin scattering occurs, and noise increases. When the induced Brillouin scattering occurs, the induced Brillouin scattering has a threshold value Pth. In obtaining the same laser output power, it is possible to obtain high pumping light output power within the threshold value Pth of the induced Brillouin scattering, when a laser beam has a plurality of oscillation longitudinal modes and when the peak value is restricted, as shown in FIG. 55B. As a result, it is possible to obtain high Raman gain.

In this example, the wavelength interval (i.e., the mode interval) $\Delta\lambda$ between the oscillation longitudinal modes 231 and 233 is set to 0.1 nm or above. This is because when the semiconductor laser device 220 is used for the pumping source of the Raman amplifier, there is a high possibility of the occurrence of the induced Brillouin scattering when the mode interval $\Delta\lambda$ is not larger than 0.1 nm. Consequently, it is preferable to set the resonator length to not larger than 3200 μm, based on the expression of the mode interval $\Delta\lambda$.

From the above viewpoint, it is preferable that a plurality of oscillation longitudinal modes are included in the half width $\Delta\lambda h$ of the lasing wavelength spectrum 230, and it is preferable that each oscillation longitudinal mode has a large spectrum amplitude. In the Raman amplification, the amplification gain has polarization dependency. Therefore, it is necessary to minimize the influence due to the deviation between the polarization direction of the signal light and the polarization direction of the pumping light. For this purpose, there is a method of depolarizing the pumping light. Specifically, there is a method that the polarization coupler polarization couples the beams output from two semiconductor laser devices 220. There is also a method that one semiconductor laser device 220 emits a laser beam and propagates the beam to a plane-of-polarization holding fiber having a predetermined length as a depolarizer. When the latter method is used to carry out the depolarization, it is possible to decrease the length of the plane-of-polarization holding fiber necessary to carry out the depolarization, as the coherency of the laser beam becomes lower along the increase in the number of oscillation longitudinal modes and the increase in the spectrum amplitude of the oscillation longitudinal mode. Particularly, when the number of the oscillation longitudinal modes becomes four or five, the necessary length of the plane-of-polarization holding fiber rapidly becomes short. Therefore, at the time of depolarizing the laser beam emitted from the semiconductor laser device 220 to use the beam for the Raman amplifier, it is not necessary to polarization couple the beams emitted from two semiconductor laser devices, but it is possible to depolarize the laser beam emitted from one semiconductor laser device 220. Consequently, it is possible to further decrease the number of parts used for the Raman amplifier and reduce sizes of the Raman amplifier.

When the lasing wavelength spectrum amplitude is too large, the multiplexing loss due to the wavelength coupler becomes large. Further, the move of the wavelength within the lasing wavelength spectrum amplitude causes the generation of noise or a gain fluctuation. Therefore, it is necessary to set the half width $\Delta\lambda h$ of the lasing wavelength spectrum 230 to not larger than 3 nm, preferably not larger than 2 nm.

The conventional semiconductor laser device uses a fiber grating, which is used for the semiconductor laser module. Therefore, the light of degraded coherence is fed back to the semiconductor laser element 202, as explained above. As a composite resonator structure is employed, the relative intensity noise (RIN) becomes large. Therefore, the semiconductor laser device cannot carry out stable Raman amplification based on the copropagating pumping system. However, the semiconductor laser device 220 explained in the tenth embodiment does not use the fiber grating 233, but uses the laser beam emitted from the emission-side reflection film 215 straight for the pumping source of the Raman amplifier. Therefore, the relative intensity noise becomes small. As a result, the fluctuation of the Raman gains becomes small, and it becomes possible to carry out stable Raman amplification.

According to the conventional semiconductor laser module, it is necessary to have mechanical coupling within the resonator. Therefore, the laser oscillation characteristics may change due to vibration or the like. However, in the semiconductor laser device according to the tenth embodiment, there is no change in the oscillation characteristics of the laser due to mechanical vibration. Therefore, it is possible to obtain a stable light output.

In the tenth embodiment, the semiconductor laser device outputs a laser beam having a plurality of oscillation longitudinal modes based on the wavelength selectivity that the diffraction grating 213 has in the center wavelength. It is also possible to obtain a semiconductor laser device that has an increased number of oscillation longitudinal modes by positively providing the diffraction grating 213 with fluctuation.

Figure 56:
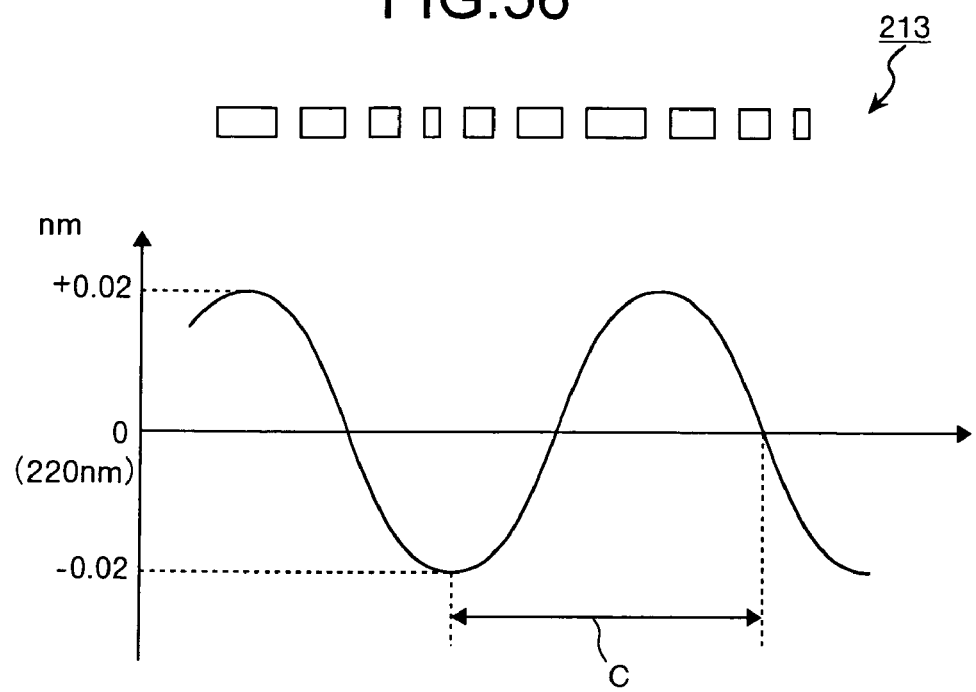
FIG. 56 shows a cyclic change of a grating period of a diffraction grating.

FIG. 56 shows a cyclic change of a grating period of the diffraction grating 213. This diffraction grating 213 has a chirped grating that has the grating period cyclically changed. As shown in FIG. 56, this diffraction grating 213 has an average period of 220 nm, and repeats a periodic fluctuation (deviation) of ±0.02 nm in the period of C. Based on the periodic fluctuation of ±0.02 nm, it is possible to have about three to six oscillation longitudinal modes within the half width $\Delta\lambda h$ of the lasing wavelength spectrum.

Figure 57:
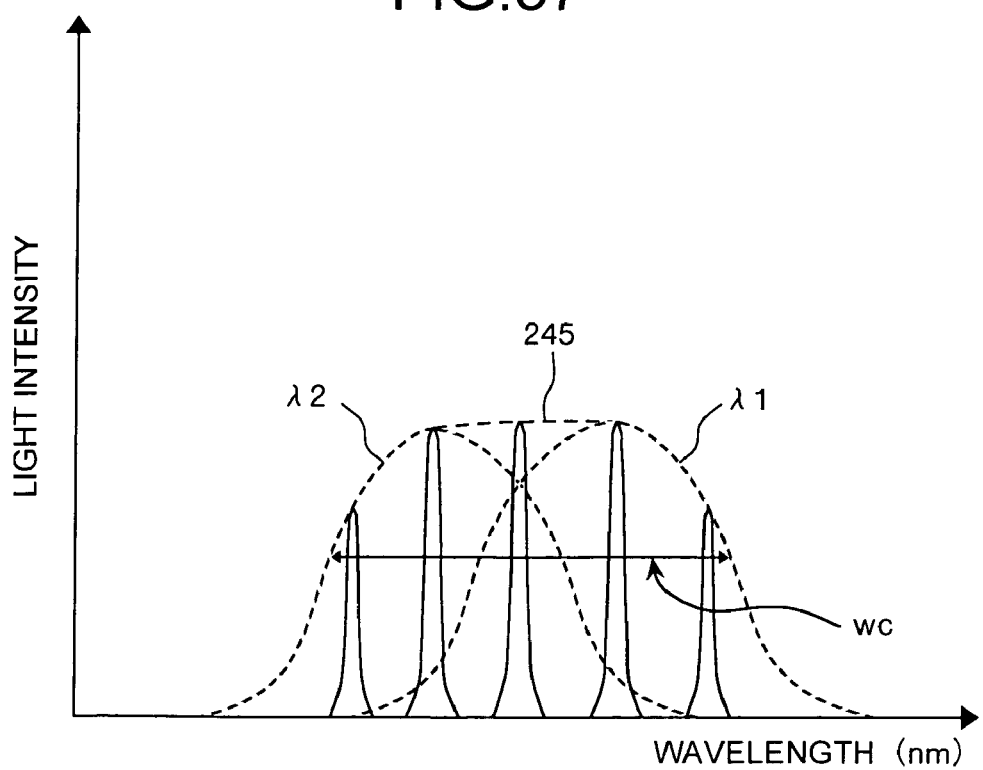
FIG. 57 shows a lasing wavelength spectrum when a chirped grating is applied to a diffraction grating.

FIG. 57 shows a lasing wavelength spectrum of a semiconductor laser device that has diffraction gratings having different periods $\Lambda_1$ and $\Lambda_2$. In FIG. 57, a diffraction grating having a period $\Lambda_1$ forms a lasing wavelength spectrum having a wavelength $\lambda_1$, and selects three oscillation longitudinal modes within this lasing wavelength spectrum. On the other hand, a diffraction grating having a period $\Lambda_2$ forms a lasing wavelength spectrum having a wavelength $\lambda_2$, and selects three oscillation longitudinal modes within this lasing wavelength spectrum. Therefore, a composite lasing wavelength spectrum 245 based on the diffraction gratings having the periods $\Lambda_1$ and $\Lambda_2$ includes four to five oscillation longitudinal modes. Consequently, it is possible to easily selectively output more oscillation longitudinal modes than when a single lasing wavelength spectrum is formed. As a result, it is possible to increase the light output.

A structure of the diffraction grating 213 is not limited to the chirped grating of changing the grating period in the constant period C. It is also possible to change the grating period at random between the period $\Lambda_1$ (220 nm+0.02 nm) and the period $\Lambda_2$ (220 nm−0.02 nm).

Figure 58A:
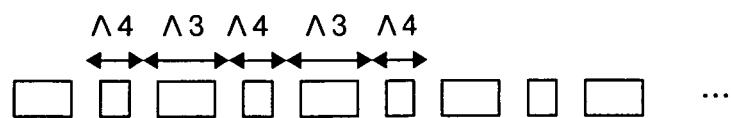
FIG. 58A to FIG. 58C show pattern graphs of modified structures of a diffraction grating that realize periodic fluctuation.
Figure 58B:
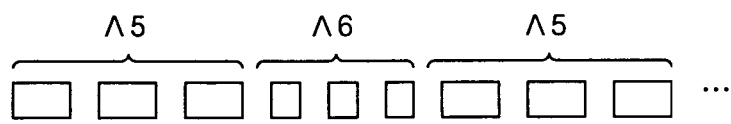
Figure 58C:
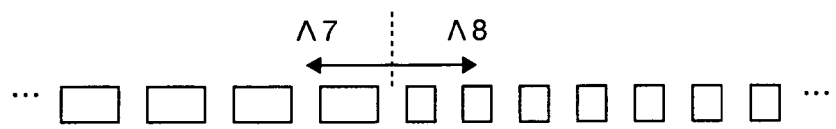

It is also possible to provide diffraction gratings that alternately repeat one period $\Lambda_3$ and one period $\Lambda_4$ that are different from each other, with a periodic fluctuation, as shown in FIG. 58A. It is also possible to provide diffraction gratings that alternately repeat a plurality of periods $\Lambda_5$ and a plurality of periods $\Lambda_6$, with a periodic fluctuation, as shown in FIG. 58B. It is also possible to provide diffraction gratings that have a continuous plurality of periods $\Lambda_7$ and a continuous plurality of periods $\Lambda_8$ that are different from the periods $\Lambda_7$, with a periodic fluctuation, as shown in FIG. 58C. It is also possible to complementarily dispose a period having discrete different values between the periods $\Lambda_3$, $\Lambda_5$, and $\Lambda_7$, and the periods $\Lambda_4$, $\Lambda_6$, and $\Lambda_8$.

As explained above, in the semiconductor laser device according to the tenth embodiment, the diffraction grating 213 is provided at the emission-side reflection film 215 side over a part of the resonator length L. This diffraction grating 213 forms a plurality of oscillation longitudinal modes, and superimposes a modulation frequency signal on a bias current, thereby to expand the spectrum amplitude of the oscillation longitudinal mode. Based on this, it is possible to restrict the occurrence of the induced Brillouin scattering when the Raman amplifier is used for the pumping source. It is also possible to stabilize the laser beam in a desired lasing wavelength, and it is possible to output the laser beam in high efficiency.

As any one of the active layer and the photoconductive layer or both includes the material of the Al mixed system, it is possible to take advantage of aluminum. In other words, it is possible to restrict the carrier overflow, and it is possible to obtain a high output of a laser beam, and it is possible to improve the temperature characteristics.

In the tenth embodiment, while the diffraction grating 213 is provided at the emission-side reflection film 215 side, the position of the diffraction grating is not limited to this. It is also possible to provide the diffraction grating 213 at the reflection film 214 side, or at both the reflection film 214 side and the emission-side reflection film 215 side. In this case, to provide the diffraction grating at the reflection film 214 side with wavelength selectivity and reflection characteristics, it is desirable to set a product of the coupling coefficient κ and the length Lg of the diffraction grating, to a large value, such as "2" or above.

In place of the n-InP lower cladding layer 202, it is possible to use other material having a structure that is in lattice alignment with InP. Particularly, when an AlInAs lower buffer layer of the Al mixed system is used, it is possible to improve the temperature characteristics, and it is possible to further lower the resistance.

When the n-type impurity is doped into the active layer area as disclosed in Japanese Patent Application No. 2001-303732, it is possible to lower the element resistance and the thermal resistance. It is possible to dope the impurity into a part of the well layer or the barrier layer instead of doping the impurity into all of the well layer and the barrier layer, as disclosed in this patent application. It is also possible to dope a similar impurity into the SCH layer.

A semiconductor laser device according to an eleventh embodiment is explained. In the semiconductor laser device according to the tenth embodiment, a diffraction grating layer is provided in the upper cladding layer not included in the mesa stripe. On the other hand, in the semiconductor laser device according to the eleventh embodiment, a diffraction grating layer is provided in the upper cladding layer included in the mesa stripe, or at both sides of the mesa stripe in the area not included in the mesa stripe.

Figure 59:
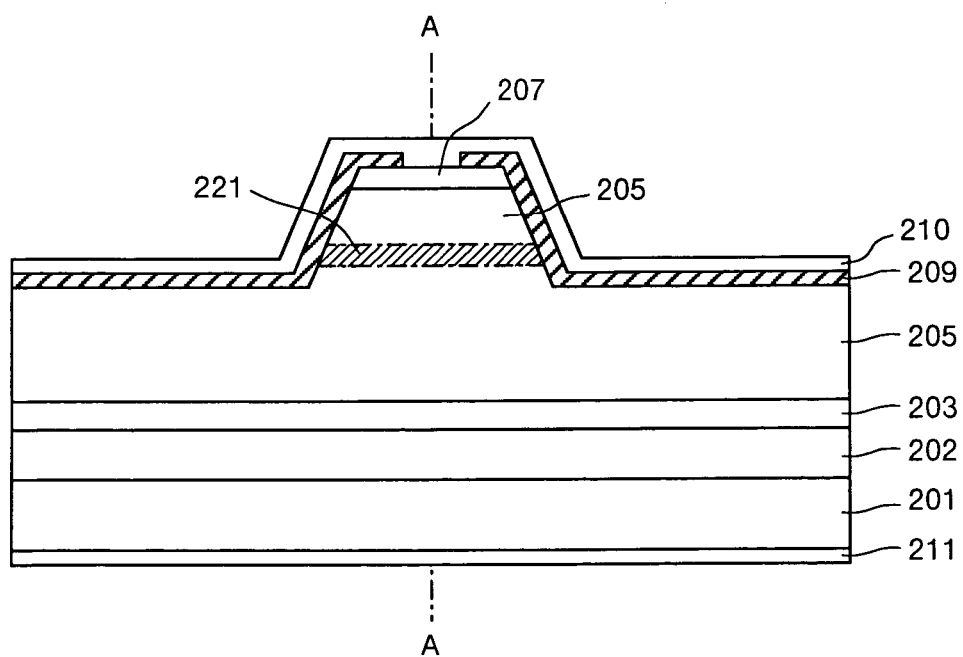
FIG. 59 is a cross-sectional view of a semiconductor laser device parallel with an emission end surface according to an eleventh embodiment of the present invention.
Figure 60:
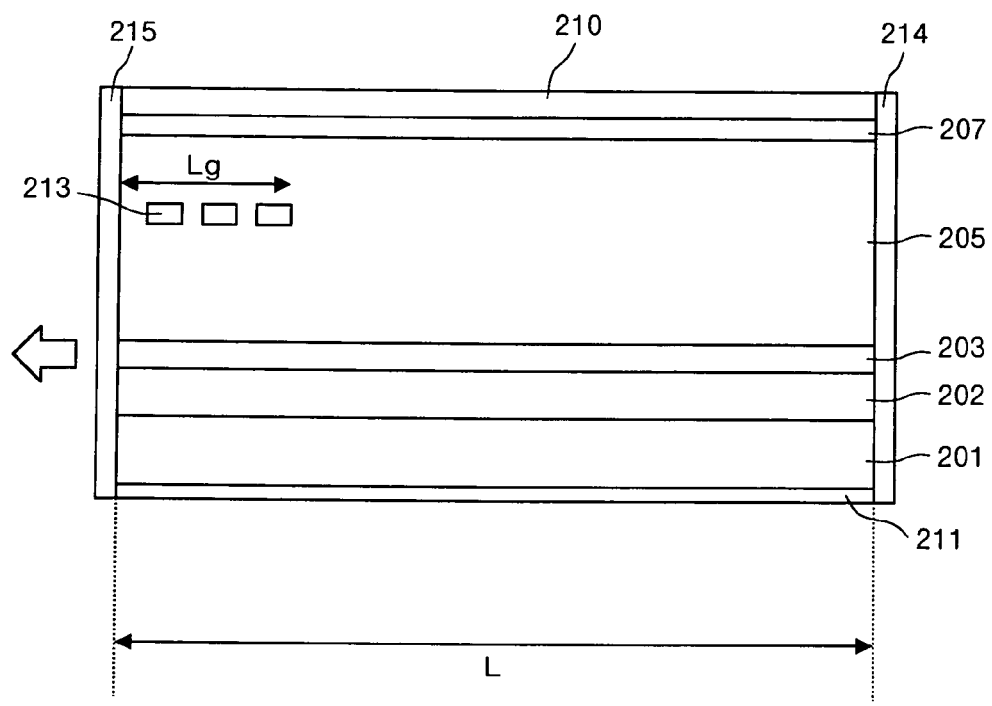
FIG. 60 is a cross-sectional view of the structure of the semiconductor laser device cut along a line A—A in FIG. 59.

FIG. 59 is a cross-sectional view of the semiconductor laser device parallel with the emission end surface according to the eleventh embodiment. FIG. 60 is a cross-sectional view in a longitudinal direction of the semiconductor laser device cut along a line A—A in FIG. 59. In FIG. 59 and FIG. 60, portions that are common to those in FIG. 51 and FIG. 52 are attached with identical reference symbols, and their explanation is omitted.

As shown in FIG. 59 and FIG. 60, the diffraction grating 213 explained in the tenth embodiment is formed within the diffraction grating layer 221 located at the portion where the mesa stripe is formed, within the p-InP upper cladding layer 205. In other words, in this semiconductor laser device, the diffraction grating 213 constitutes a part of the mesa stripe. This diffraction grating 213 has the same functions as those explained in the tenth embodiment.

Figure 61:
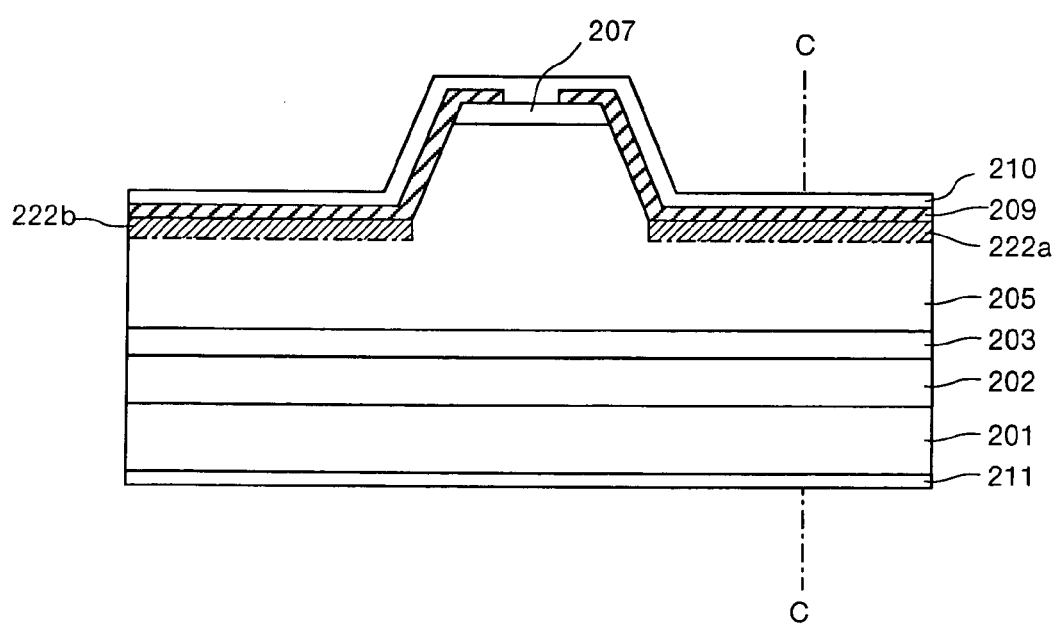
FIG. 61 is a cross-sectional view of another example of the semiconductor laser device parallel with an emission end surface according to the eleventh embodiment.
Figure 62:
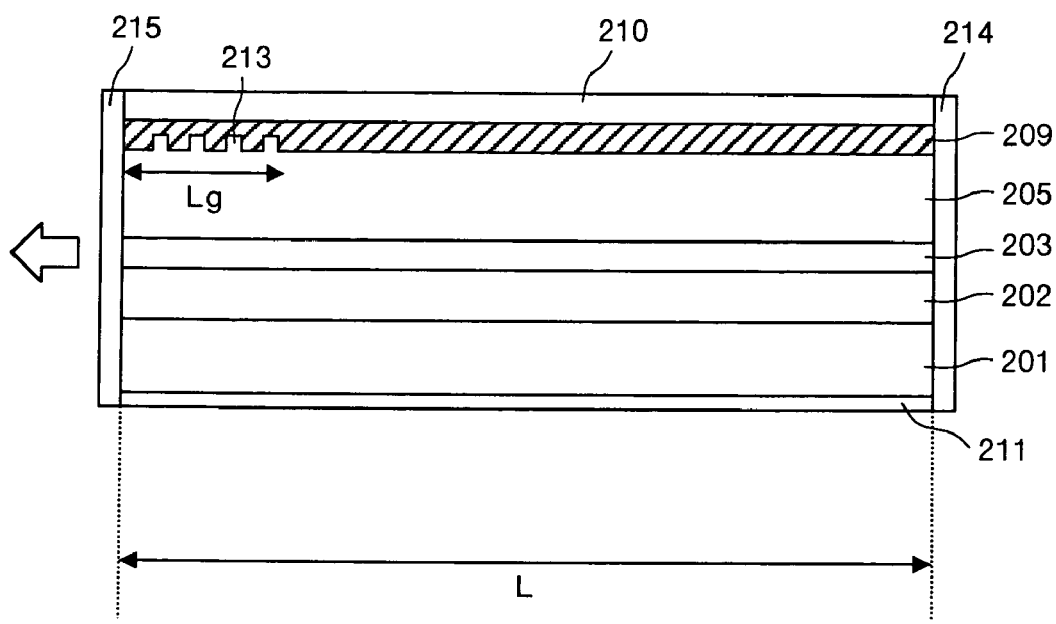
FIG. 62 is a cross-sectional view of the structure of the semiconductor laser device cut along a line C—C in FIG. 61.

FIG. 61 is a cross-sectional view of another example of the semiconductor laser device parallel with the emission end surface according to the eleventh embodiment. FIG. 62 is a cross-sectional view in a longitudinal direction of the semiconductor laser device cut along a line C—C in FIG. 61. In FIG. 61 and FIG. 62, portions that are common to those in FIG. 51 and FIG. 52 are attached with identical reference symbols, and their explanation is omitted.

As shown in FIG. 61 and FIG. 62, the diffraction grating 213 explained in the tenth embodiment is formed within both diffraction grating layers 222a and 222b located at both sides of the mesa stripe, at portions where the mesa stripe is not formed, within the p-InP upper cladding layer 205. In other words, in this semiconductor laser device, the diffraction grating 213 is separated to sandwich the mesa stripe. The diffraction grating 213 formed within each of the diffraction grating layers 222a and 222b is realized to form a boundary shape between the p-InP upper cladding layer 205 and the $SiN_x$ layer 209.

In the eleventh embodiment, the diffraction grating is formed at a position far from the active layer, as compared with the diffraction grating explained in the tenth embodiment. Further, the diffraction grating shown in FIG. 61 is located at positions deviated in the lateral direction from the area where the light intensity is strong. In this case, the light intensity at the portions of the diffraction grating is weak. Therefore, the coupling coefficient κ becomes small. On the other hand, in order for the diffraction grating to select a desired oscillation longitudinal mode, it is necessary that the product of the coupling coefficient κ and the length Lg of the diffraction grating takes a certain range of values. Therefore, in the eleventh embodiment, the diffraction grating needs to have a large length Lg. In the extreme case, it is necessary to form the diffraction grating over the whole length of the resonator. However, when the length Lg of the diffraction grating is set long, this has a problem that the half width Δλh of the lasing wavelength spectrum becomes small. In this case, when the grating period has a predetermined periodic fluctuation or when the grating period is changed at a predetermined period, it is possible to obtain a sufficient plurality of oscillation longitudinal modes, and this is preferable. The diffraction grating 213 has the same functions as those of the diffraction grating explained in the tenth embodiment.

As explained above, in the semiconductor laser device according to the eleventh embodiment, the diffraction grating is provided in the upper cladding layer included in the mesa stripe, or at both sides of the mesa stripe in the area not included in the mesa stripe. Based on this structure, it is possible to obtain the effects similar to those of the tenth embodiment.

A semiconductor laser device according to a twelfth embodiment is explained. As compared with the structure of the semiconductor laser device explained in the eleventh embodiment, the lower cladding layer and the upper cladding layer are formed using a material of the Al mixed system and a material of the Al non-mixed system respectively.

Figure 63:
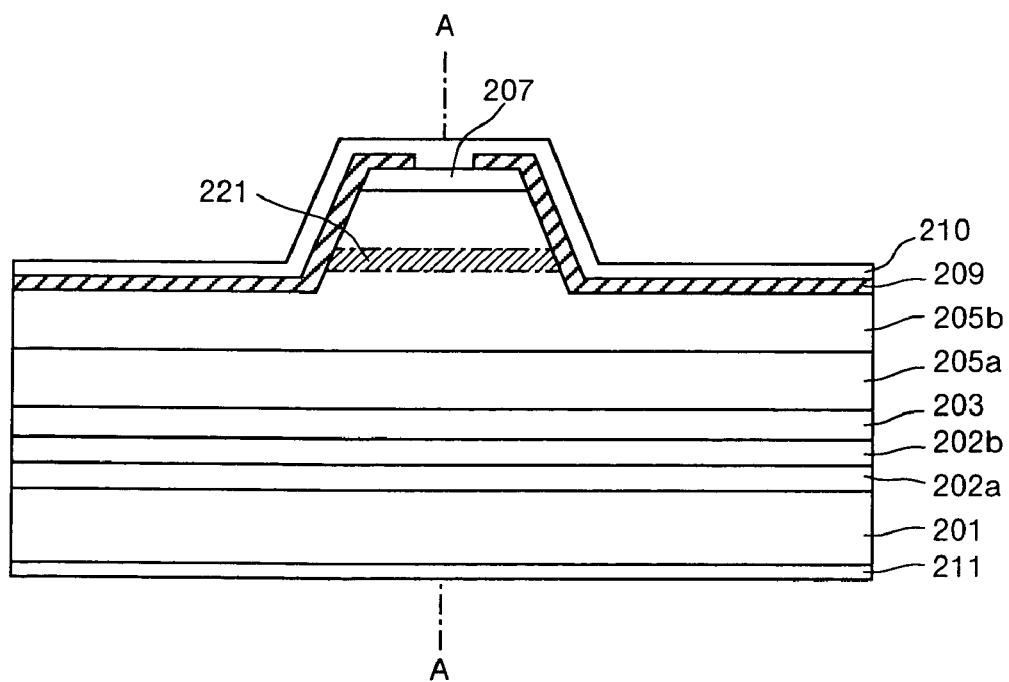
FIG. 63 is a cross-sectional view of a semiconductor laser device parallel with an emission end surface according to a twelfth embodiment of the present invention.
Figure 64:
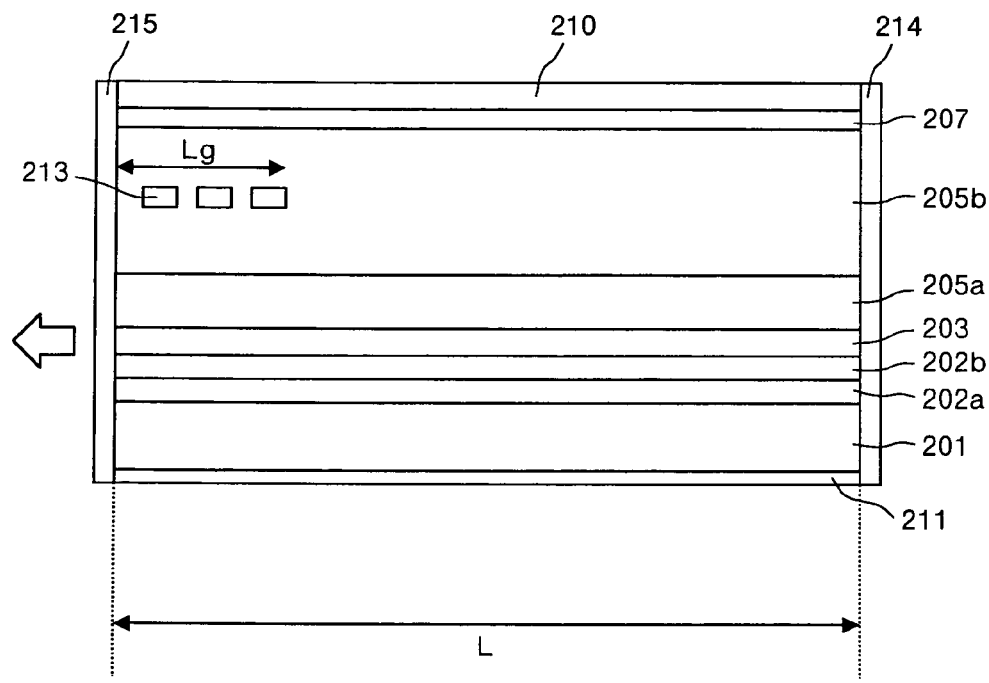
FIG. 64 is a cross-sectional view of the structure of the semiconductor laser device cut along a line A—A in FIG. 63.

FIG. 63 is a cross-sectional view of the semiconductor laser device parallel with the emission end surface according to the twelfth embodiment. FIG. 64 is a cross-sectional view in a longitudinal direction of the semiconductor laser device cut along a line A—A in FIG. 63. Particularly, the structures shown FIG. 63 and FIG. 64 correspond to modifications of the structures shown in FIG. 59 and FIG. 60 respectively explained in the eleventh embodiment. In FIG. 63 and FIG. 64, portions that are common to those in FIG. 59 and FIG. 60 are attached with identical reference symbols, and their explanation is omitted.

Figure 65:
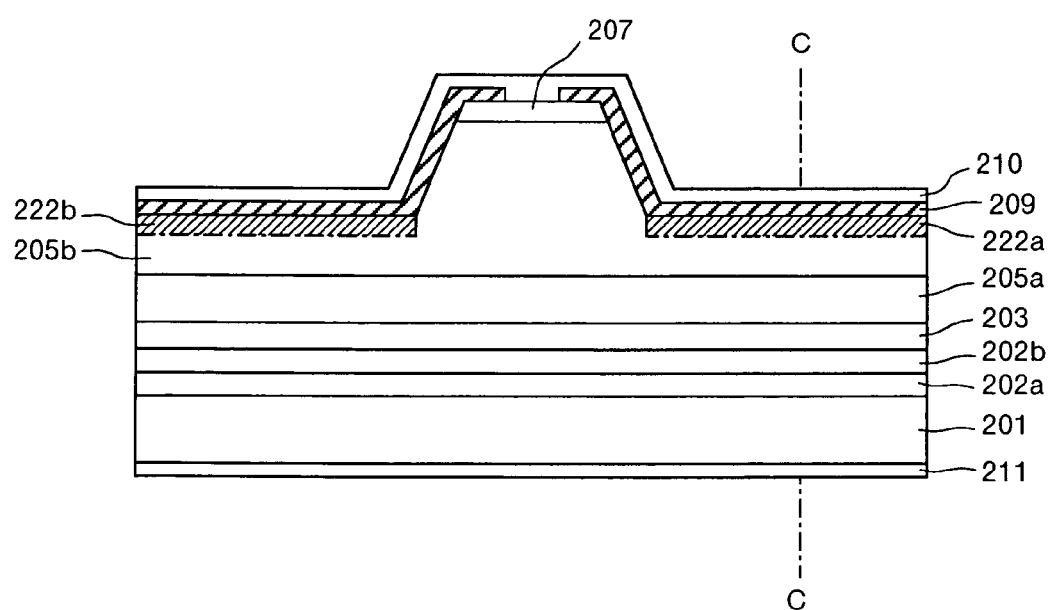
FIG. 65 is a cross-sectional view of another example of the semiconductor laser device parallel with an emission end surface according to the twelfth embodiment.
Figure 66:
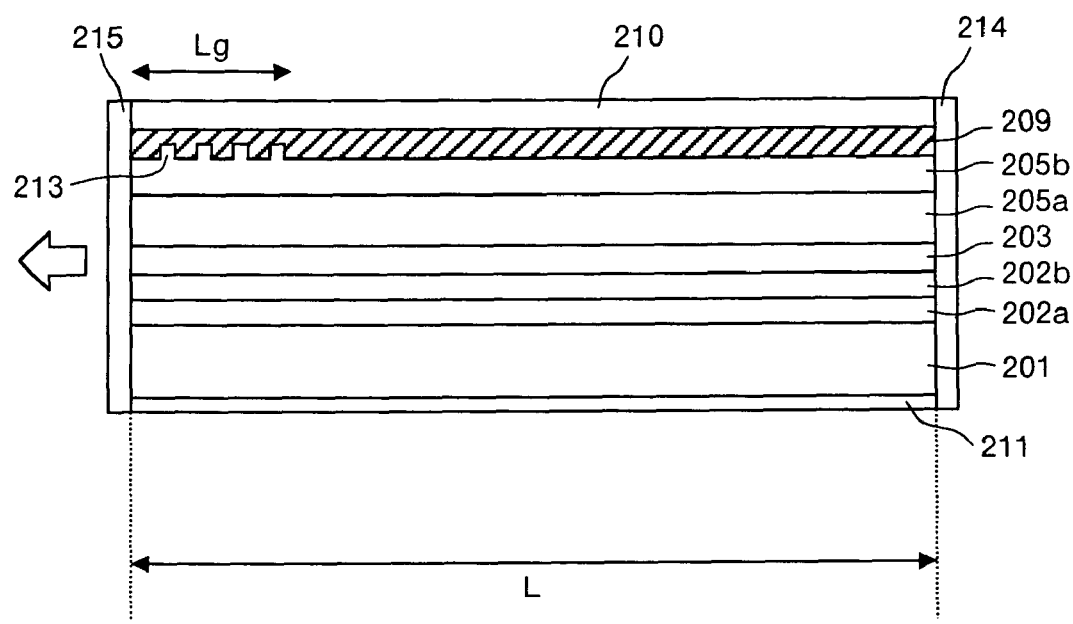
FIG. 66 is a cross-sectional view of the structure of the semiconductor laser device cut along a line A—A in FIG. 65.

FIG. 65 is a cross-sectional view of another example of the semiconductor laser device parallel with the emission end surface according to the twelfth embodiment. FIG. 66 is a cross-sectional view in a longitudinal direction of the semiconductor laser device cut along a line A—A in FIG. 65. Particularly, the structures shown FIG. 65 and FIG. 66 correspond to modifications of the structures shown in FIG. 61 and FIG. 62 respectively explained in the eleventh embodiment. In FIG. 65 and FIG. 66, portions that are common to those in FIG. 61 and FIG. 62 are attached with identical reference symbols, and their explanation is omitted.

As shown in FIG. 63 to FIG. 66, the lower cladding layer includes an n-InP cladding layer 202$a$, and an n-AlInAs cladding layer 202$b$ laminated on this layer. The upper cladding layer includes an n-AlInAs cladding layer 205$a$, and an n-InP cladding layer 205$b$ laminated on this layer.

As explained above, the lower and upper cladding layers include the materials of the Al mixed system. Based on this, it is possible to take advantage of aluminum as explained in the tenth embodiment. In other words, it is possible to improve the temperature characteristics, and it is possible to further lower the resistance.

As explained above, in the semiconductor laser device according to the twelfth embodiment, the materials of the Al mixed system are included in the cladding layers in the semiconductor laser apparatus of the ridge type structure explained in the eleventh embodiment. Therefore, it is possible to obtain effects similar to those obtained in the tenth embodiment. At the same time, it is possible to further improve the temperature characteristics obtained from aluminum, and it is possible to further lower the resistance. As a result, it is possible to obtain a higher output of a laser beam.

In the twelfth embodiment, while it is explained that both the lower and upper cladding layers include the materials of the Al mixed system, it is also possible that only one of these cladding layers includes the materials of the Al mixed system. Specifically, there are examples of combination as follows: (the upper cladding layer, the lower cladding layer) =(InP/AlInAs, InP), (InP/AlInAs, AlInAs), and (InP, InP/AlInAs). When the lower cladding layer includes InP and AlInAs, to increase the carrier injection efficiency, it is preferable that a high-density impurity is doped into a thin layer that belongs to AlInAs, near the boundary between InP and AlInAs. In the lower cladding layer, the InP layer may be laminated on the AlInAs layer.

The tenth to twelfth embodiments explain about the semiconductor laser devices that employ a ridge type structure. The idea that the active layer and the photoconductive layer, or the cladding layer includes the material of the Al mixed system can also be applied to the buried-heterostructure (BH) disclosed in Japanese Patent Application No. 2001-134545, and the self-aligned structure (SAS) disclosed in Japanese Patent Application No. 2002-048679. It is possible to give these structures the effects similar to those explained above.

However, the ridge structure is superior to the buried-heterostructure (BH) or the self-aligned structure (SAS) in that the ridge structure does not require the buried growth process. Particularly, in the buried growth, when the material of the Al mixed system is used, it is necessary to give sufficient considerations to the influence of the oxidation at this portion, and a high technique is required for the buried growth. Therefore, in the semiconductor structure that uses the material of the Al mixed system, it is preferable to use the ridge type structure. Further, according to the ridge type structure, the active layer can be formed over the whole length in a lateral direction of the semiconductor laser device, unlike the buried-heterostructure (BH) where the active layer is disconnected in a lateral direction. Therefore, it becomes easy to make small the difference between the refractive index of the light emission area and the refractive index of the area of the active layer. As a result, it is possible to increase the lateral width of the light emission area, and easily obtain a high output.

A semiconductor laser module according to a thirteenth embodiment of the present invention is explained. The semiconductor laser module in the thirteenth embodiment shows a modularization of the semiconductor laser devices explained in the tenth to twelfth embodiments.

Figure 67:
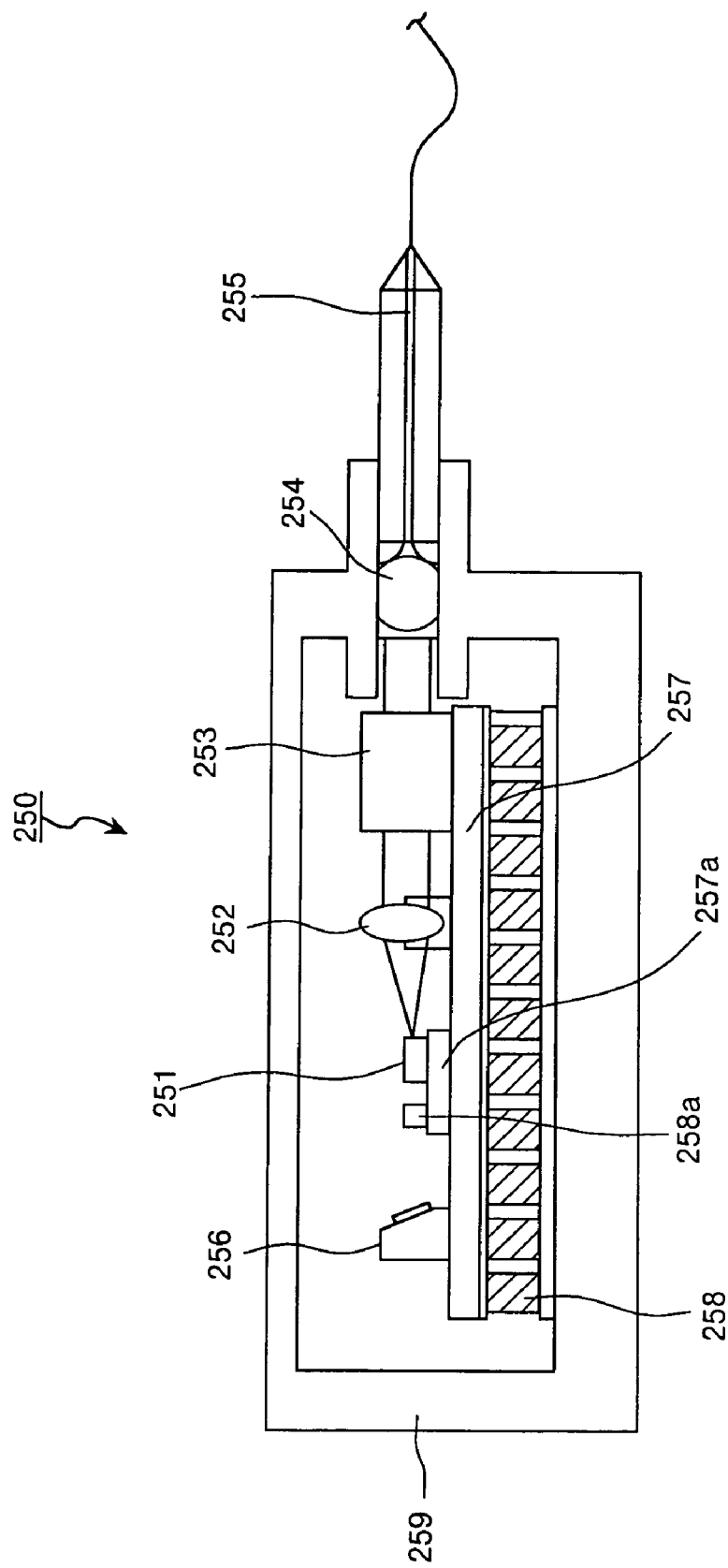
FIG. 67 is a longitudinal cross-sectional view of a structure of a semiconductor laser module according to a thirteenth embodiment of the present invention.

FIG. 67 is a longitudinal cross-sectional view of a structure of the semiconductor laser module according to the thirteenth embodiment. A semiconductor laser module 250 has a semiconductor laser device 251 corresponding to the semiconductor laser devices explained in the tenth to twelfth embodiments. This semiconductor laser device 251 has a junction down structure of having the p-side electrode joined to a heat sink 257$a$. A package 259 made of a ceramic or the like is provided as a casing of the semiconductor laser module 250. A Peltier element 258 is disposed as a temperature control unit on the inside bottom surface of the package 259. A base 257 is disposed on the Peltier element 258, and the heat sink 257$a$ is disposed on this base 257. A current not shown is supplied to the Peltier element 258. The Peltier element 258 carries out cooling and heating based on the polarity of the current, and this module mainly functions as a cooler. The Peltier element 258 controls the temperature based on a result of a detection carried out by a thermistor 258$a$ disposed near the semiconductor laser device 251 on the heat sink 257$a$. A controller not shown controls the Peltier element 258 so as to keep the temperature of the heat sink 257$a$ always at a constant level.

In the semiconductor laser devices according to the tenth to twelfth embodiments, the diffraction grating selects a lasing wavelength. This semiconductor laser device has a smaller fluctuation in the lasing wavelength due to the driving current than a Fabry-Perot (FP) laser having no diffraction grating. However, the temperature of the light emission area rises along the increase in the driving current, and the lasing wavelength becomes longer. It is also possible to control the Peltier element 258 to prevent the occurrence of a deviation of the lasing wavelength due to a rise in the temperature of the semiconductor laser device 251. In other words, when the wavelength of the laser beam is longer than a desired wavelength, it is possible to control the Peltier element 258 to keep a low temperature by cooling. When the wavelength of the laser beam is shorter than a desired wavelength, it is possible to control the Peltier element 258 to keep a high temperature by heating. In the present invention, the semiconductor laser device gives smaller current to the Peltier element 258 to correct the wavelength deviation than the FP laser, which is preferable, as this leads to a reduction in power consumption.

Based on this temperature control, it is possible to improve the output stability of the semiconductor laser device 251, which is effective to improve the yield. It is desirable that the heat sink 257a is made of a material having high thermal conductivity such as diamond. This is because the heat sink 257a made of diamond can restrict the heat generation when a high current is applied to this.

On the base 257, there are disposed the heat sink 257a on which the semiconductor laser device 251 and the thermistor 258a are disposed, a first lens 252, and a current monitor 256. The semiconductor laser device 251 emits a laser beam. The laser beam is guided to an optical fiber 255 via the first lens 252, an isolator 253, and a second lens 254. The second lens 254 is provided on an optical axis of the laser beam on the package 259, and is optically coupled with the optical fiber 255 externally connected. The current monitor 256 monitors a beam leaked out from the reflection film of the semiconductor laser device 251.

In the present semiconductor laser module 250, the isolator 253 is provided between the semiconductor laser device 251 and the optical fiber 255 to prevent beams reflected from other optical parts from returning to the resonator. It is possible to incorporate the isolator 253 in the semiconductor laser module 250 not based on the inline type fiber, unlike the conventional semiconductor laser module that uses the fiber grating. Therefore, it is possible to minimize the insertion loss due to the isolator. It is also possible to achieve lower relative intensity noise (RIN), and it is possible to decrease the number of parts.

In the thirteenth embodiment, the semiconductor laser devices explained in the tenth to twelfth embodiments are modularized. Therefore, it is possible to reduce the insertion loss due to the isolator, and it is also possible to further reduce noise and decrease the number of parts.

Figure 68:
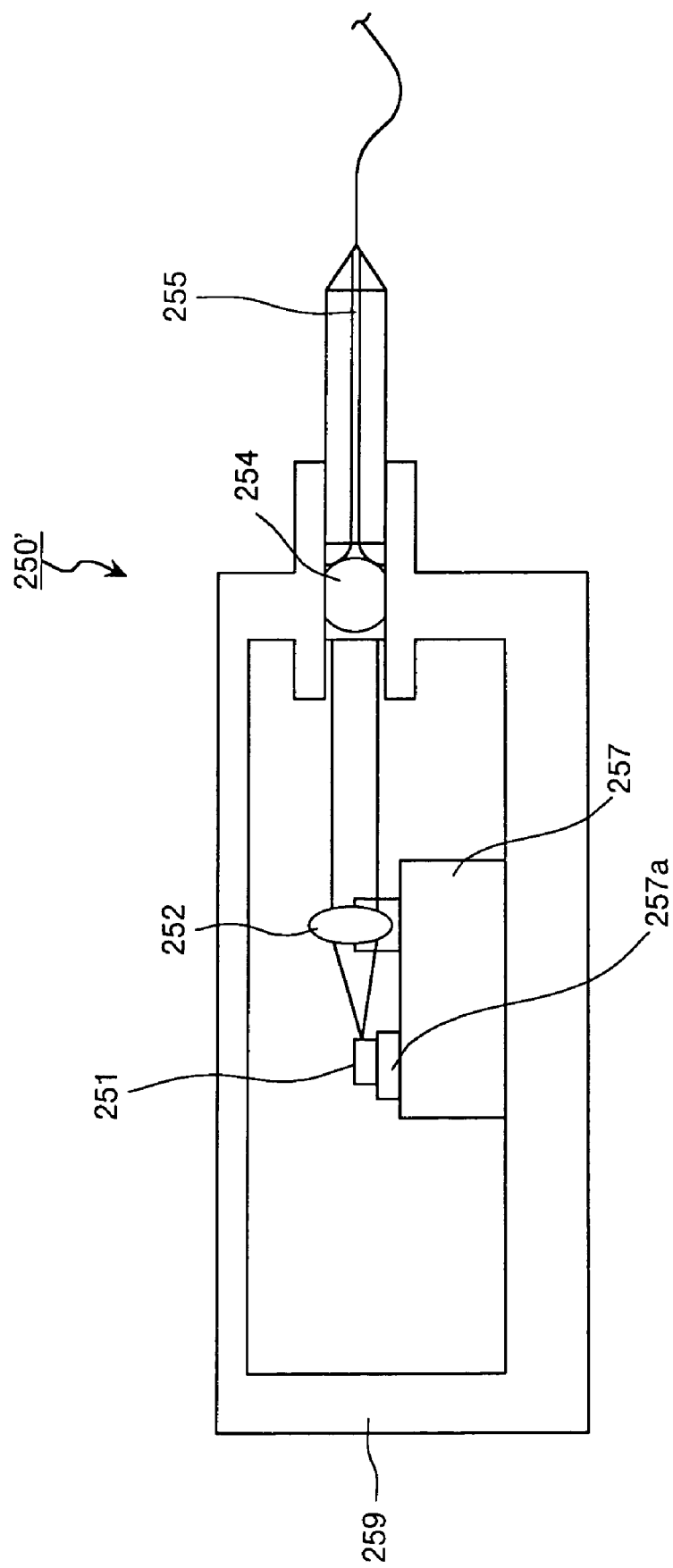
FIG. 68 is a longitudinal cross-sectional view of another structure of the semiconductor laser module according to the thirteenth embodiment.

As explained in the tenth to twelfth embodiments, the semiconductor laser device 251 incorporated in the semiconductor laser module 250 has satisfactory temperature characteristics. Therefore, when the system carries out transmission over a short distance and does not require a large optical amplification gain, it is possible to exclude the Peltier element 258 and its control unit thereby to lower the cost. FIG. 68 is a longitudinal cross-sectional view of a structure of a semiconductor laser module that has weight in low cost. In FIG. 68, portions common to those in FIG. 67 are attached with identical reference symbols, and their explanation is omitted.

In FIG. 68, a semiconductor laser module 250' does not include the Peltier element 258, the current monitor 256, the thermistor 258a, and the isolator 253 shown in FIG. 67, and has a very simple structure. Even when the semiconductor laser device 151 (251) is not structured using the material of the Al mixed system, it is possible to employ a semiconductor laser module that excludes the temperature control mechanism and the noise reduction mechanism, when the EDFA in the system of a short transmission distance does not particularly require a high-output pumping light.

An optical fiber amplifier according to a fourteenth embodiment of the present invention is explained. In the fourteenth embodiment, the semiconductor laser module according to the thirteenth embodiment is applied to a Raman amplifier.

Figure 69:
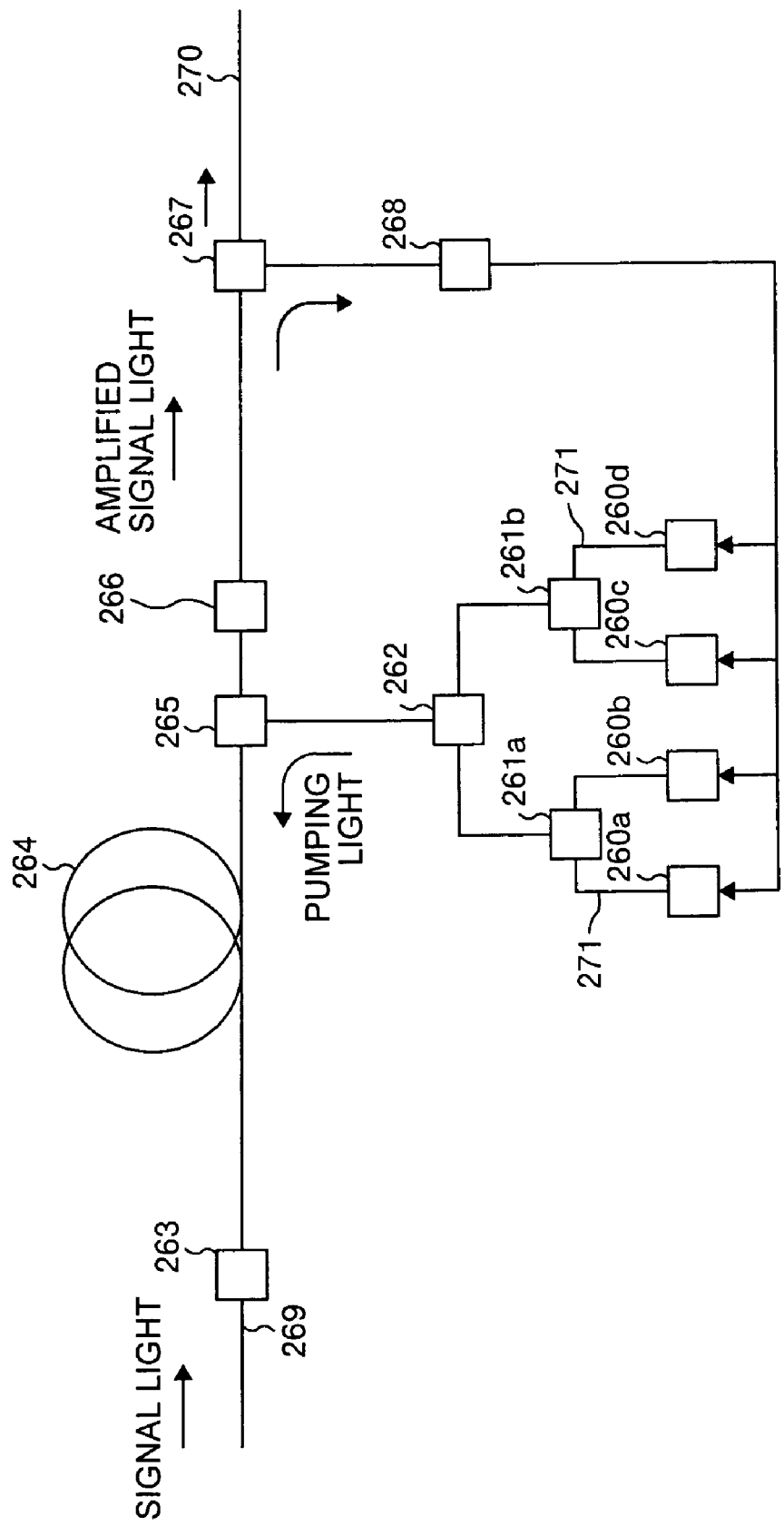
FIG. 69 is a block diagram of a structure of a Raman amplifier according to a fourteenth embodiment of the present invention.

FIG. 69 is a block diagram of a structure of a Raman amplifier according to the fourteenth embodiment. In FIG. 69, this Raman amplifier uses semiconductor laser modules 260a to 260d that have the same structures as that of the semiconductor laser module explained in the thirteen embodiment.

Each of the semiconductor laser modules 260a and 260b outputs a laser beam having a plurality of oscillation longitudinal modes to a polarization coupler 261a via a polarization maintaining fiber 271. Each of the semiconductor laser modules 260c and 260d outputs a laser beam having a plurality of oscillation longitudinal modes to a polarization coupler 261b via the polarization maintaining fiber 271. The laser beams that the semiconductor laser modules 260a and 260b oscillate have the same wavelengths. The laser beams that the semiconductor laser modules 260c and 260d oscillate have the same wavelengths, which are different from the wavelength of the laser beams that the semiconductor laser modules 260a and 260b oscillate. This difference of the wavelengths is because the Raman amplification has polarization dependency. The polarization couplers 261a and 261b output laser beams after canceling the polarization dependency.

A WDM coupler 262 combines the laser beams having different wavelengths output from the polarization couplers 261a and 261b, and outputs the combined laser beam to an amplification fiber 264 as the pumping light for Raman amplification via a WDM coupler 265. This pumping light is input to the amplification fiber 264. The amplification fiber 264 receives an input signal light to be amplified, and Raman amplifies this signal.

The amplification fiber 264 outputs the Raman amplified signal light (i.e., an amplified signal light) to a monitor light distribution coupler 267 via the WDM coupler 265 and the isolator 266. The monitor light distribution coupler 267 outputs a part of the amplified signal light to a control circuit 268, and outputs the rest of the amplified signal light to a signal light output fiber 270 as an output laser beam.

The control circuit 268 controls the laser output states of the semiconductor laser modules 260a to 260d, such as the light intensities, based on a part of the input amplified signal light, and feedback controls these semiconductor laser modules so that the gain band after the Raman amplification becomes flat.

The Raman amplifier explained in the fourteenth embodiment uses the semiconductor laser module 260a that incorporates any one of the semiconductor laser devices explained in the tenth to twelfth embodiments. Therefore, it is possible to decrease the use of the polarization maintaining fiber 271. At the same time, it is possible to realize a reduction in sizes, a reduction in weight, and a reduction in cost of the Raman amplifier.

Figure 70:
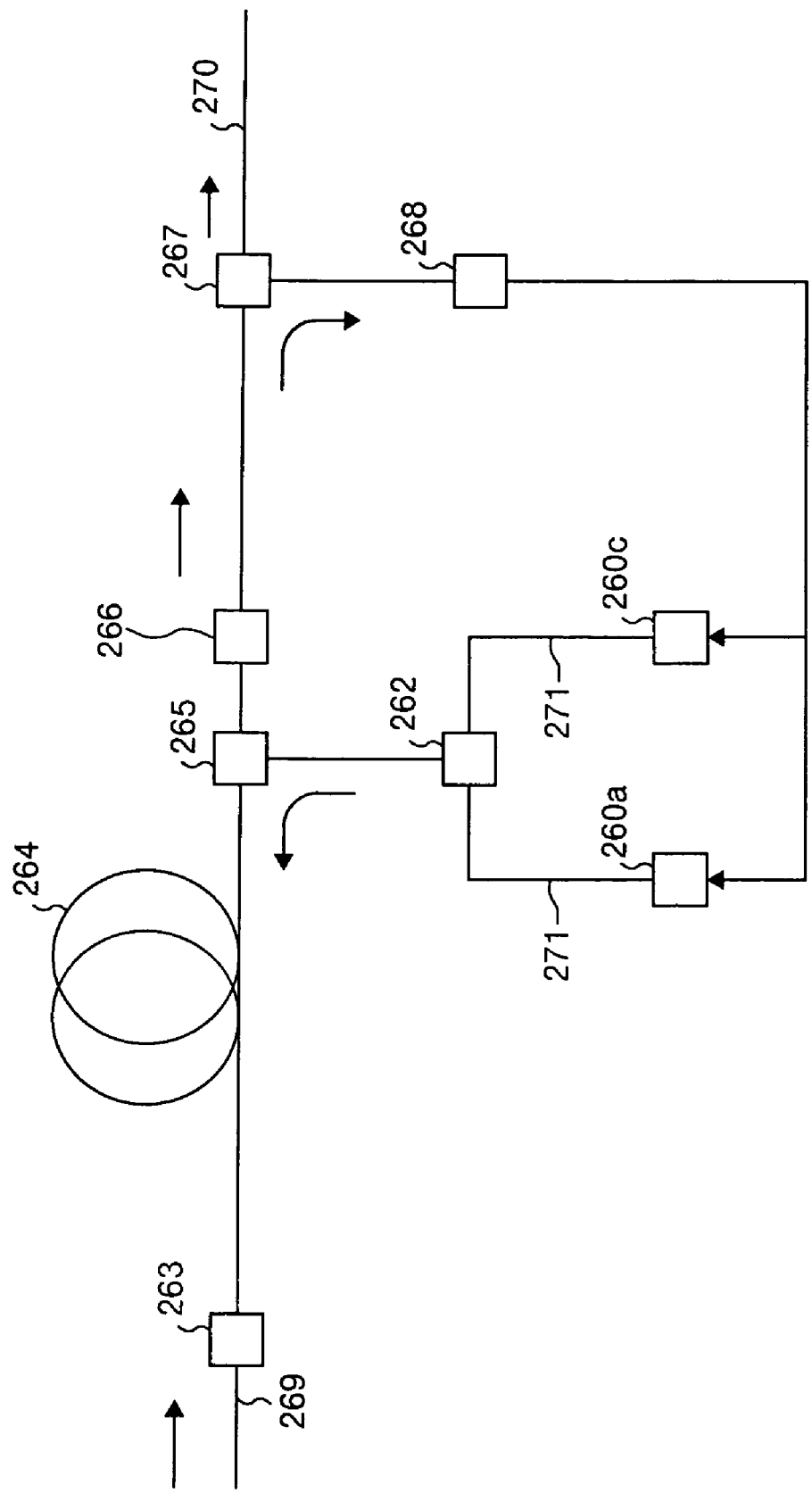
FIG. 70 is a block diagram that shows an example of application of the Raman amplifier shown in FIG. 68.

While the Raman amplifier shown in FIG. 69 uses the polarization couplers 261a and 261b, it is possible to arrange such that the semiconductor laser modules 260a and 260c directly output lights to the WDM coupler 262 via the polarization maintaining fibers 271 respectively, as shown in FIG. 70. In this case, the planes of polarization of the semiconductor laser modules 260a and 260c form an angle of 45 degrees relative to the polarization maintaining fibers 271 respectively. As explained above, as each of the semiconductor laser modules 260a and 260c has a plurality of oscillation longitudinal modes, it is possible to decrease the length of the polarization maintaining fiber 271. Based on this, it is possible to avoid the polarization dependency of the light output from the polarization maintaining fibers 271. Therefore, it is possible to realize a Raman amplifier having smaller sizes and having a smaller number of parts.

When a semiconductor laser device having a large number of oscillation longitudinal modes is used as the semiconductor laser device included in each of the semiconductor laser modules 260a to 260d, it is possible to decrease the necessary length of the polarization maintaining fibers 271. Particularly, when the number of the oscillation longitudinal modes becomes four or five, the necessary length of the plane-of-polarization holding fiber 271 rapidly becomes short. Therefore, it is possible to further decrease the number of parts used for the Raman amplifier and reduce sizes of the Raman amplifier. Further, when the number of oscillation longitudinal modes increases, a coherent length decreases, and the degree of polarization (DOP) becomes smaller based on the depolarization. Consequently, it is possible to avoid the polarization dependency. As a result, it is possible to further simplify and reduce sizes of the Raman amplifier.

According to the Raman amplifier, it is easy to match optical axis as compared with the semiconductor laser module that uses a fiber grating, and there is no mechanical coupling within the resonator. Therefore, from this viewpoint, it is possible to increase the stability and reliability of the Raman amplification.

The semiconductor laser devices according to the tenth to twelfth embodiments have a plurality of oscillation modes. Further, based on the application of the modulation frequency signal, the spectrum amplitude of the oscillation longitudinal mode becomes large. Therefore, it is possible to generate a high-output pumping light without generating the occurrence of the induced Brillouin scattering. As a result, it is possible to obtain a stable and high Raman gain.

While the Raman amplifiers shown in FIG. 69 and FIG. 70 are based on the backward pumping system, it is also possible to carry out a stable Raman amplification based on the copropagating pumping system or the bidirectional system, as the semiconductor laser modules 260a to 260d output stable pumping lights.

Figure 71:
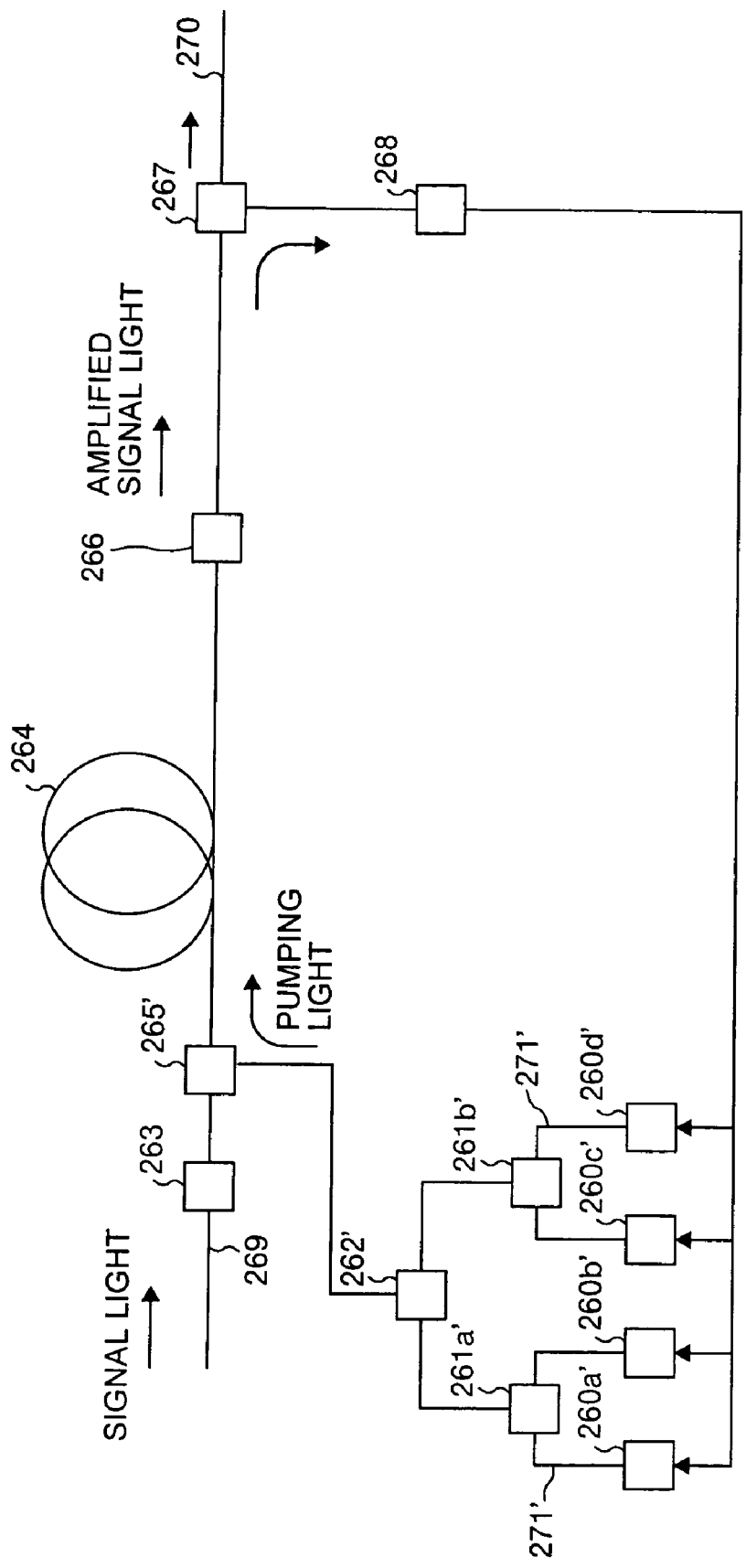
FIG. 71 is a block diagram that shows a modified structure of the Raman amplifier shown in FIG. 68, where the Raman amplifier employs a copropagating pumping system.

For example, FIG. 71 is a block diagram that shows a Raman amplifier employing the copropagating pumping system. While the WDM coupler 265 is disposed near the isolator 266 in the Raman amplifier shown in FIG. 69, the Raman amplifier shown in FIG. 71 has a WDM coupler 265' disposed near an isolator 263. A circuit that has semiconductor laser modules 260a' to 260d', polarization couplers 261a' and 261b', and a WDM coupler 262' corresponding to the semiconductor laser modules 260a to 260d, the polarization couplers 261a and 261b, and the WDM coupler 262 respectively, is connected to the WDM coupler 265'. This Raman amplifier carries out the copropagating pumping of outputting the pumping light from the WDM coupler 262' to the same direction as the direction to which the signal light is output. In this case, as the semiconductor laser modules 260a' to 260d' use the semiconductor laser devices used in the tenth to twelfth embodiments, the RIN is small, and it is possible to effectively carry out the copropagating pumping.

Figure 72:
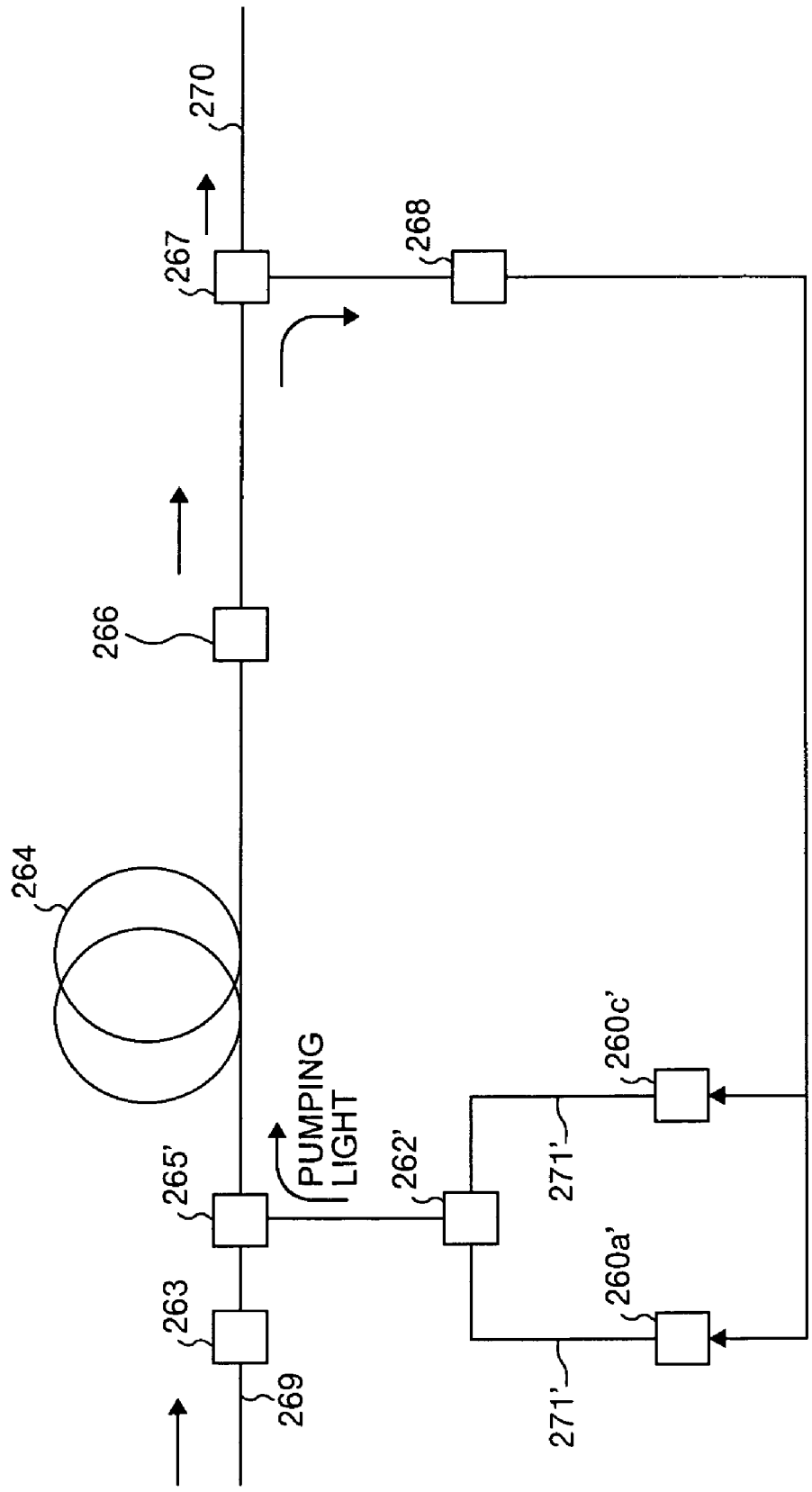
FIG. 72 is a block diagram that shows an example of application of the Raman amplifier shown in FIG. 71.

Similarly, FIG. 72 is a block diagram that shows a Raman amplifier employing the copropagating pumping system. While the Raman amplifier shown in FIG. 70 has the WDM coupler 265 disposed near the isolator 266, the Raman amplifier shown in FIG. 72 has the WDM coupler 265' disposed near the isolator 263. A circuit that has the semiconductor laser modules 260a' and 260c', and the WDM coupler 262' corresponding to the semiconductor laser modules 260a and 260c, and the WDM coupler 262 respectively, is connected to the WDM coupler 265'. This Raman amplifier carries out the copropagating pumping of outputting the pumping light from the WDM coupler 262' to the same direction as the direction to which the signal light is output. In this case, as the semiconductor laser modules 260a' and 260c' use the semiconductor laser devices used in the tenth to twelfth embodiments, the RIN is small, and it is possible to effectively carry out the copropagating pumping.

Figure 73:
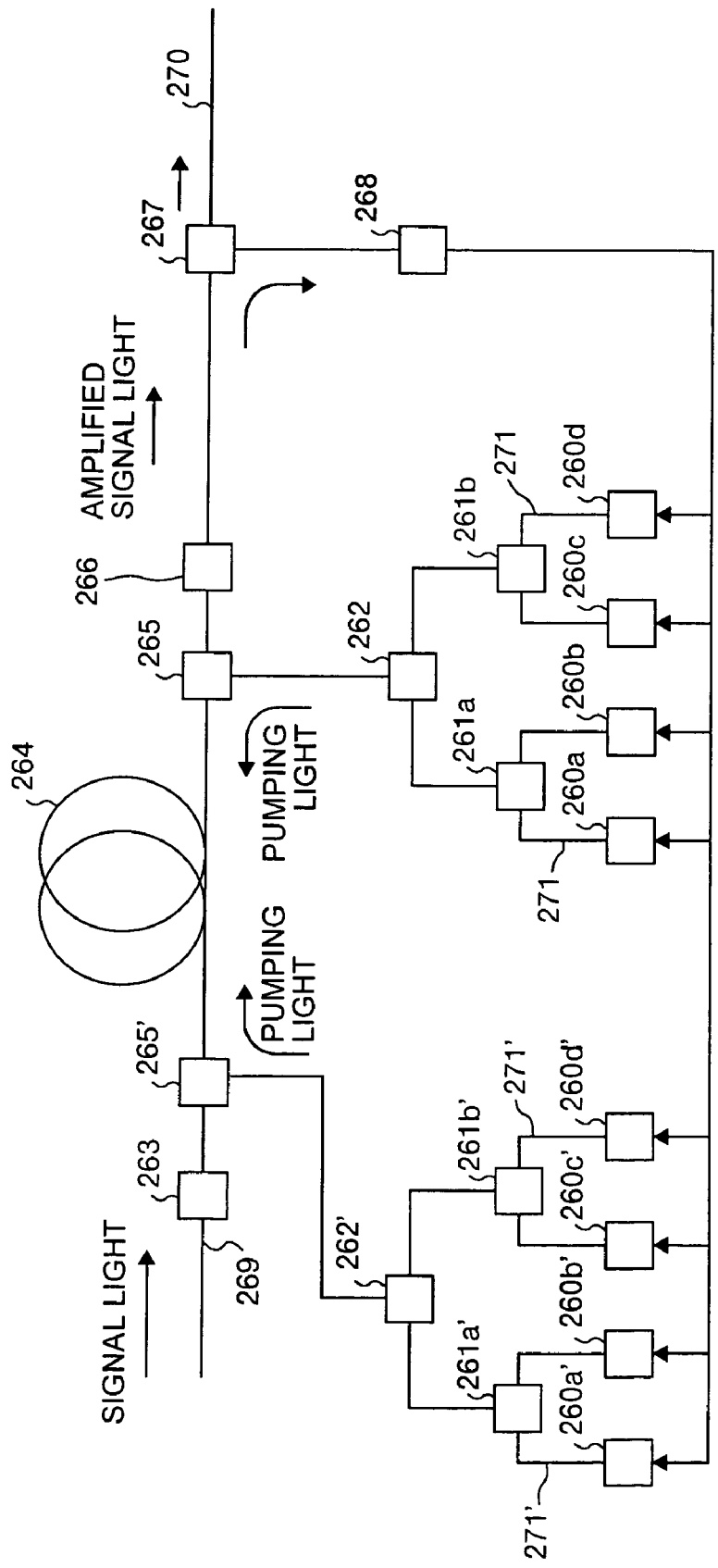
FIG. 73 is a block diagram that shows a modified structure of the Raman amplifier shown in FIG. 68, where the Raman amplifier employs a bidirectional pumping system.

FIG. 73 is a block diagram that shows a Raman amplifier employing the bidirectional pumping system. The Raman amplifier shown in FIG. 73 has the WDM coupler 265', the semiconductor laser modules 260a' to 260d', the polarization couplers 261a' and 261b', and the WDM coupler 262', in addition to the structure of the Raman amplifier shown in FIG. 69. The Raman amplifier carries out the backward pumping and the copropagating pumping based on this structure. In this case, as the semiconductor laser modules 260a' to 260d' use the semiconductor laser devices used in the tenth to twelfth embodiments, the RIN is small, and it is possible to effectively carry out the copropagating pumping.

Figure 74:
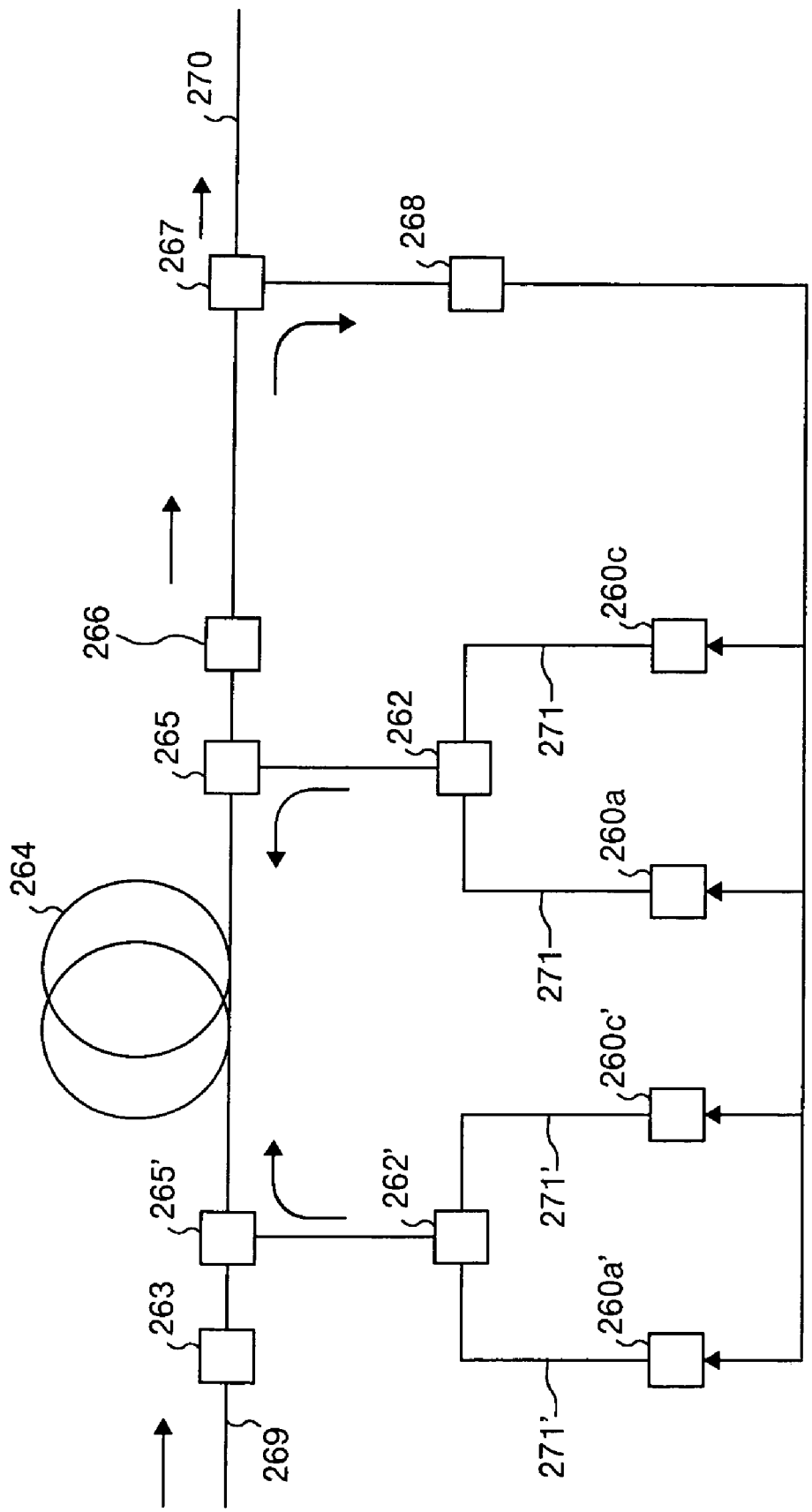
FIG. 74 is a block diagram that shows an example of application of the Raman amplifier shown in FIG. 73.

Similarly, FIG. 74 is a block diagram that shows a Raman amplifier employing the bidirectional pumping system. The Raman amplifier shown in FIG. 74 has the WDM coupler 265', the semiconductor laser modules 260a' and 260c', and the WDM coupler 262', in addition to the structure of the Raman amplifier shown in FIG. 70. The Raman amplifier carries out the backward pumping and the copropagating pumping based on this structure. In this case, as the semiconductor laser modules 260a' and 260c' use the semiconductor laser devices used in the tenth to twelfth embodiments, the RIN is small, and it is possible to effectively carry out the copropagating pumping.

Figure 75:
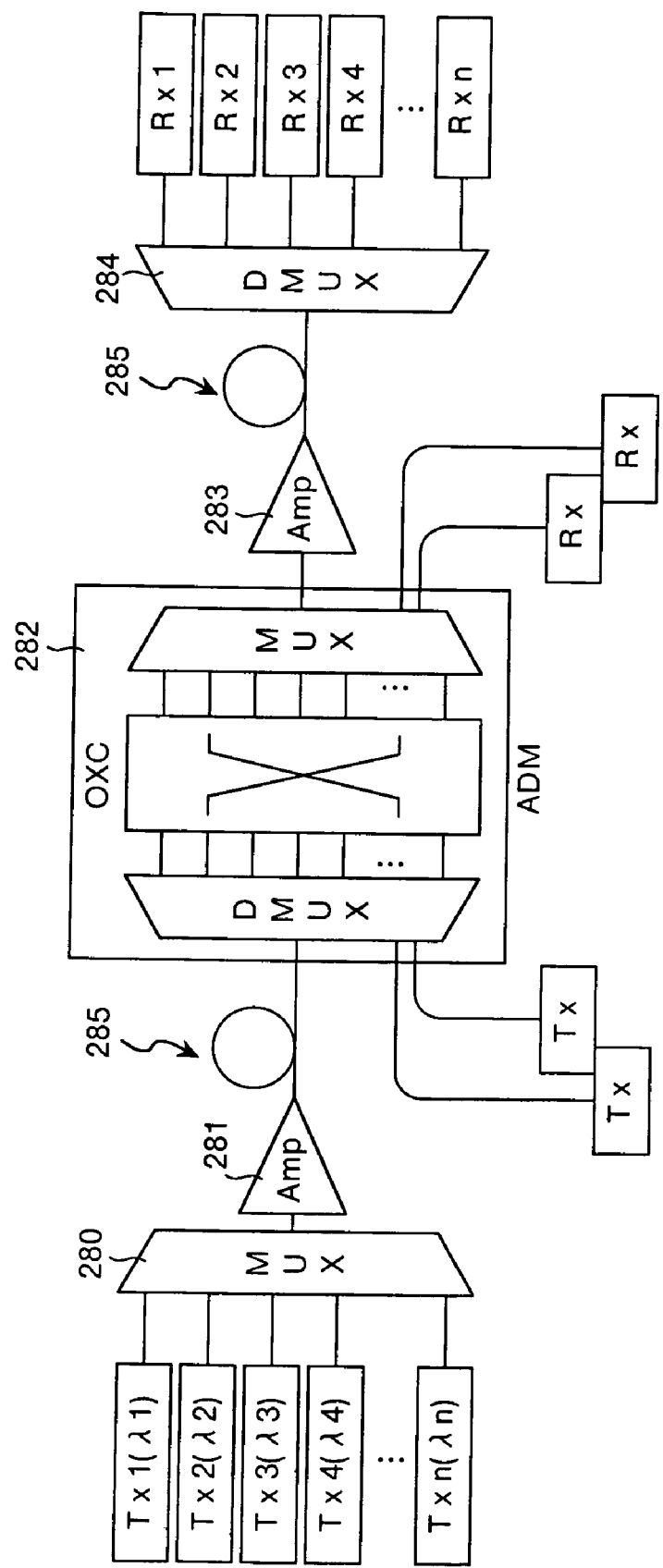
FIG. 75 is a block diagram that shows a schematic structure of a wavelength division multiplexing (WDM) communication system that uses the Raman amplifier shown in FIG. 69 to FIG. 74.
Figure 76:
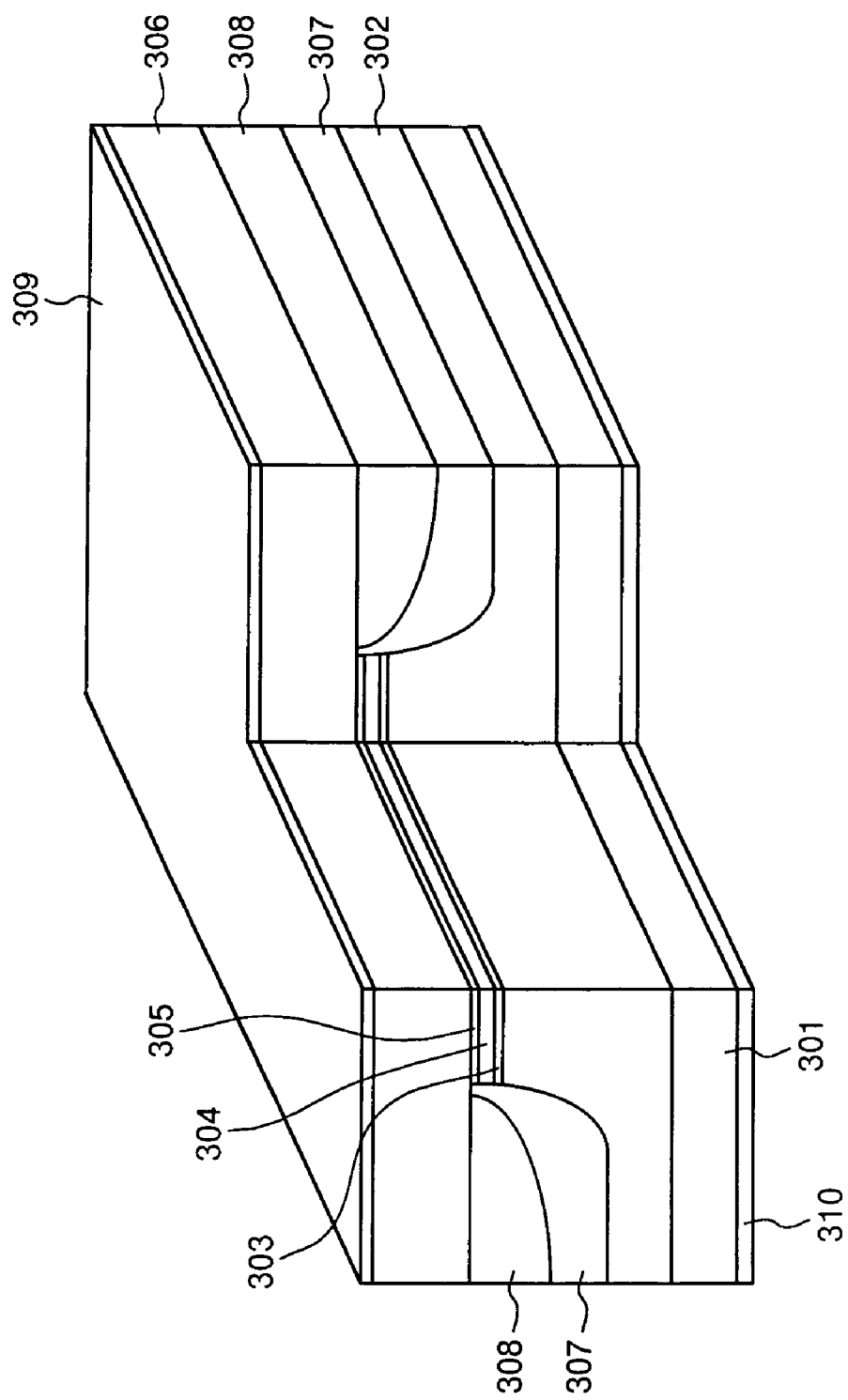
FIG. 76 is a perspective cross-sectional broken view of a buried-heterostructure (BH) laser according to a conventional technique.

As explained above, it is possible to apply the Raman amplifiers shown in FIG. 71 to FIG. 74 to the WDM communication system. FIG. 75 is a block diagram that shows a schematic structure of a WDM communication system that uses the Raman amplifiers shown in FIG. 69 to FIG. 74.

Referring to FIG. 75, a plurality of transmitters Tx1 to Txn transmit light signals having wavelengths $\lambda 1$ to $\lambda n$ to an optical multiplexer 280. This optical multiplexer 280 multiplexes these light signals, and puts them together into one optical fiber 285. A plurality of Raman amplifiers 281 and 283 corresponding to the Raman amplifiers shown in FIG. 71 to FIG. 74 are disposed according to a distance on the transmission line of this optical fiber 285, and these Raman amplifiers amplify an attenuated light signal. An optical demultiplexer 284 branches the signal transmitted through this optical fiber 285 into the light signals having the wavelengths $\lambda 1$ to $\lambda n$. A plurality of receivers Rx1 to Rxn receive these signals. Depending on the situation, ADM that add and take out a light signal of an optional wavelength is inserted into the optical fiber 285.

In the fourteenth embodiment, the semiconductor laser device explained in the tenth to twelfth embodiments or the semiconductor laser module explained in the thirteenth embodiment is used for the pumping source for Raman amplification. However, the use is not limited to this. For example, it is needless to mention that is also possible to use the semiconductor laser device or the semiconductor laser module for the pumping source of the erbium-doped fiber amplifier (EDFA) of 980 nm or 1480 nm or the like.

As explained above, according to the embodiment of the present invention, the current blocking layer has a current shielding function and also has a function of controlling the light distribution in a horizontal direction. Therefore, it is possible to realize a semiconductor laser device that achieves weak confinement of light in a horizontal direction based on the current blocking layer. As it is possible to expand the light intensity distribution area in a horizontal direction, there is an effect that it is easy to obtain a high output. Further, it is possible to restrict the refractive index in a horizontal direction regardless of the light confinement in a layer direction. Therefore, there is an effect that it is possible to freely expand the light intensity distribution in a horizontal direction. Further, as it is possible to lower the element resistance and the thermal resistance, it is possible to restrict a rise in the temperature of the light emission area. Therefore, there is an effect that it is possible to realize a semiconductor laser device of low power consumption having high reliability.

In the high-output semiconductor laser device, it is important to restrict the occurrence of catastrophic optical damage (COD). For this purpose, it is desirable to reduce light density inside the semiconductor laser device. This is because when light is confined too strong, the light is concentrated to one part, and the light density in the light-concentrated area exceeds a predetermined value, which has a risk of the occurrence of the COD. According to the embodiment of the present invention, it is possible to realize a semiconductor laser device that achieves weak confinement of light in a horizontal direction. Therefore, it is possible to lower the light density in the light emission area, and it is possible to restrict the occurrence of the COD. Based on the restriction of the occurrence of the COD, there is an effect that it is possible to realize a high-output semiconductor laser device having high reliability.

According to the embodiment of the present invention, the refractive index of the current blocking layer is controlled based on the impurity density. Therefore, the degree of freedom of a change in the refractive index improves. Consequently, there is an effect that it is possible to realize a semiconductor laser device that obtains a high output by freely controlling the light intensity distribution in a horizontal direction.

According to the embodiment of the present invention, there is an effect that it is possible to obtain a semiconductor laser module that can emit a high-output laser beam to the optical fiber.

Further, as the diffraction grating selects a wavelength, there is an effect that it is possible to reduce relative intensity noise (RIN) as compared with when a fiber grating selects a wavelength.

According to the embodiment of the present invention, as the diffraction grating selects a plurality of oscillation longitudinal modes, it is possible to emit a laser beam having a plurality of oscillation longitudinal modes. Therefore, when the emitted beam is guided to the optical fiber, it is possible to restrict the occurrence of the induced Brillouin scattering. Consequently, there is an effect that it is possible to realize a semiconductor laser device that can obtain a high output. Further, when the semiconductor laser device emits a laser beam having a plurality of oscillation longitudinal modes, a coherent length decreases, and the degree of polarization (DOP) becomes smaller based on the depolarization. Consequently, there is an effect that it is possible to avoid the polarization dependency.

According to the embodiment of the present invention, a semiconductor laser module uses the semiconductor laser device according to the present embodiment. Therefore, there is an effect that it is possible to realize the semiconductor laser module that can obtain a high output, has high reliability, can restrict the occurrence of the induced Brillouin scattering and the RIN, and can lower the DOP.

According to the embodiment of the present invention, an optical fiber amplifier uses the semiconductor laser device or the semiconductor laser module. Therefore, there is an effect that it is possible to realize the optical fiber amplifier that has a high-output pumping source, can obtain a high stable amplification gain, can restrict the occurrence of the induced Brillouin scattering and the RIN, and can lower the DOP.

In the semiconductor laser device according to the embodiment of the present invention, it is possible to restrict a light output peak value based on the existence of a plurality of oscillation longitudinal modes, and it is possible to increase the light output power. Therefore, when the semiconductor laser device is used for an optical fiber amplifier, there is an effect that it is possible to carry out high optical amplification while restricting the occurrence of the induced Brillouin scattering. Further, the semiconductor laser device uses a laser beam emitted from the first reflection film straight for the pumping source, without using a fiber grating. Therefore, the semiconductor laser device reduces relative intensity noise more than the conventional semiconductor laser device that uses the fiber grating. Consequently, when the semiconductor laser device is used for an optical fiber amplifier, there is an effect that it is possible to carry out stable optical amplification. As the active layer and the like include the material of the Al mixed system, it is possible to take advantage of aluminum. In other words, it is possible to restrict the carrier overflow. Therefore, there is an effect that it is possible to obtain a high output of a laser beam, and it is possible to improve the temperature characteristics.

In the semiconductor laser device according to the embodiment of the present invention, based on the ridge type structure, it is possible to restrict a light output peak value based on the existence of a plurality of oscillation longitudinal modes, and it is possible to increase the light output power. Therefore, when the semiconductor laser device is used for an optical fiber amplifier, there is an effect that it is possible to carry out high optical amplification while restricting the occurrence of the induced Brillouin scattering. Further, the semiconductor laser device uses a laser beam emitted from the first reflection film straight for the pumping source, without using a fiber grating. Therefore, the semiconductor laser device reduces relative intensity noise more than the conventional semiconductor laser device that uses the fiber grating. Consequently, when the semiconductor laser device is used for an optical fiber amplifier, there is an effect that it is possible to carry out stable optical amplification.

According to the embodiment of the present invention, a semiconductor laser module uses the semiconductor laser device. Therefore, for the same reasons, there is an effect that it is possible to realize the semiconductor laser module that can restrict the occurrence of the induced Brillouin scattering. Further, according to the embodiment of the present invention, an optical fiber amplifier uses the semiconductor laser device or the semiconductor laser module. Therefore, there is an effect that it is possible to realize the optical fiber amplifier that can obtain a high stable amplification gain.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor laser device, comprising:
a lower cladding layer and an upper cladding layer laminated on an InP substrate;
an active layer laminated between the lower and upper cladding layers;
a current passing region formed in at least one of the lower cladding layer and the upper cladding layer, said current passing region having a striped pattern extending in an emission direction of a laser beam; and
a current blocking region formed of $Ga_xIn_{1-x}As_yP_{1-y}$ ($0<x\leqq1$, $0<y\leqq1$), said current blocking region being formed in at least one of the lower cladding layer and the upper cladding layer on both lateral sides of said current passing region, and having an opposite conductivity type to the at least one of the lower cladding layer and the upper cladding layer surrounding said current blocking region,
wherein the laser beam has a wavelength of not smaller than 1200 nm and not larger than 1600 nm, and an output of not smaller than 80 mW.

2. A semiconductor laser device comprising:
a lower cladding layer and an upper cladding layer laminated on an InP substrate,
an active layer laminated between the lower and upper cladding layers;
a current passing region formed of InP, said current passing region being formed in at least one of the lower cladding layer and the upper cladding layer, and having a striped pattern extending in an emission direction of a laser beam; and
a current blocking region formed of InP, said current blocking region being formed in at least one of the lower cladding layer and the upper cladding layer on both lateral sides of said current passing region and having an opposite conductivity type to the at least one of the lower cladding layer and the upper cladding layer surrounding said current blocking region,
wherein density of impurities in the current blocking region is higher than the same of the current passing region.

3. The semiconductor laser device according to claim 2, wherein a width of the stripe of the current passing region is not smaller than 2.5 µm and not larger than 7.0 µm.

4. The semiconductor laser device according to claim 2, wherein the laser beam has a wavelength of not smaller than 1200 nm and not larger than 1600 nm and an output of not smaller than 80 mW.

5. The semiconductor laser device according to claim 2, wherein a difference between an effective index of an area including the current passing region and an effective index of an area including the current blocking region is not larger than 0.01.

6. The semiconductor laser device according to claim 2, wherein a length of a resonator in an emission direction is not smaller than 800 µm and not larger than 3200 µm.

7. The semiconductor laser device according to claim 2, wherein the density of impurities of the current blocking region is not smaller than $1.5\times10^{18}$ cm$^{-3}$ and not larger than $9\times10^{18}$ cm$^{-3}$.

8. The semiconductor laser device according to claim 2, wherein the band gap energy of a semiconductor material of the current blocking region is larger than the energy of the emitted laser beam.

9. The semiconductor laser device according to claim 2, wherein the refractive index of the current blocking region is smaller than the refractive index of the current passing layer.

10. A semiconductor laser device comprising:
a lower cladding layer and an upper cladding layer laminated on an InP substrate,
an active layer laminated between the lower and upper cladding layers;
a current passing region formed of InP, said current passing region being formed in at least one of the lower cladding layer and the upper cladding layer, and having a striped pattern extending in an emission direction of a laser beam, and
a current blocking region formed of an insulating semiconductor material, said current blocking region being formed in at least one of the lower cladding layer and the upper cladding layer of both lateral sides of said current passing region,
wherein the insulating semiconductor material is formed of InP doped with iron.

11. The semiconductor laser device according to claim 2, wherein the active layer includes a lower separate confinement layer, a quantum well layer laminated on the lower separate confinement layer, and an upper separate confinement layer laminated on the quantum well layer.

* * * * *